(12) United States Patent
Takano et al.

(10) Patent No.: US 7,573,090 B2
(45) Date of Patent: Aug. 11, 2009

(54) NONVOLATILE SEMICONDUCTOR MEMORY DEVICE AND MANUFACTURING METHOD THEREOF

(75) Inventors: Tamae Takano, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 238 days.

(21) Appl. No.: 11/727,042

(22) Filed: Mar. 23, 2007

(65) Prior Publication Data

US 2007/0228420 A1    Oct. 4, 2007

(30) Foreign Application Priority Data

Mar. 31, 2006    (JP)    ............................. 2006-101076

(51) Int. Cl.
*H01L 29/788* (2006.01)
(52) U.S. Cl. ..................................................... 257/315
(58) Field of Classification Search ................. 438/201, 438/211, 257, 266; 257/314–326
See application file for complete search history.

(56) References Cited

U.S. PATENT DOCUMENTS

| | | | |
|---|---|---|---|
| 5,726,459 A | 3/1998 | Hsu et al. | |
| 5,953,598 A | 9/1999 | Hata et al. | |
| 6,005,270 A | 12/1999 | Noguchi | |
| 6,388,291 B1 | 5/2002 | Zhang et al. | |
| 6,433,361 B1 | 8/2002 | Zhang et al. | |
| 6,686,623 B2 * | 2/2004 | Yamazaki .................... 257/315 |
| 6,724,037 B2 * | 4/2004 | Yamazaki et al. ........... 257/316 |
| 7,023,052 B2 | 4/2006 | Yamazaki et al. | |
| 7,339,190 B2 | 3/2008 | Chen et al. | |
| 2007/0020888 A1 | 1/2007 | Yamazaki et al. | |
| 2007/0210379 A1 | 9/2007 | Godo | |

FOREIGN PATENT DOCUMENTS

| | | |
|---|---|---|
| JP | 06-314785 | 11/1994 |
| JP | 07-176753 | 7/1995 |
| JP | 08-018055 | 1/1996 |
| JP | 2006-013534 | 1/2006 |

OTHER PUBLICATIONS

J. Colinge, "Chapter 4: SOI CMOS Technology," Silicon-On-Insulator Technology: Materials to VLSI $2^{nd}$ Edition, 1991, pp. 108-109.

* cited by examiner

*Primary Examiner*—Calvin Lee
(74) *Attorney, Agent, or Firm*—Eric J. Robinson; Robinson Intellectual Property Law Office, P.C.

(57) ABSTRACT

A nonvolatile semiconductor memory device is provided in such a manner that a semiconductor layer is formed over a substrate, a charge accumulating layer is formed over the semiconductor layer with a first insulating layer interposed therebetween, and a gate electrode is provided over the charge accumulating layer with a second insulating layer interposed therebetween. The semiconductor layer includes a channel formation region provided in a region overlapping with the gate electrode, a first impurity region for forming a source region or drain region, which is provided to be adjacent to the channel formation region, and a second impurity region provided to be adjacent to the channel formation region and the first impurity region. A conductivity type of the first impurity region is different from that of the second impurity region.

16 Claims, 40 Drawing Sheets

FIG. 12A
FIG. 12B
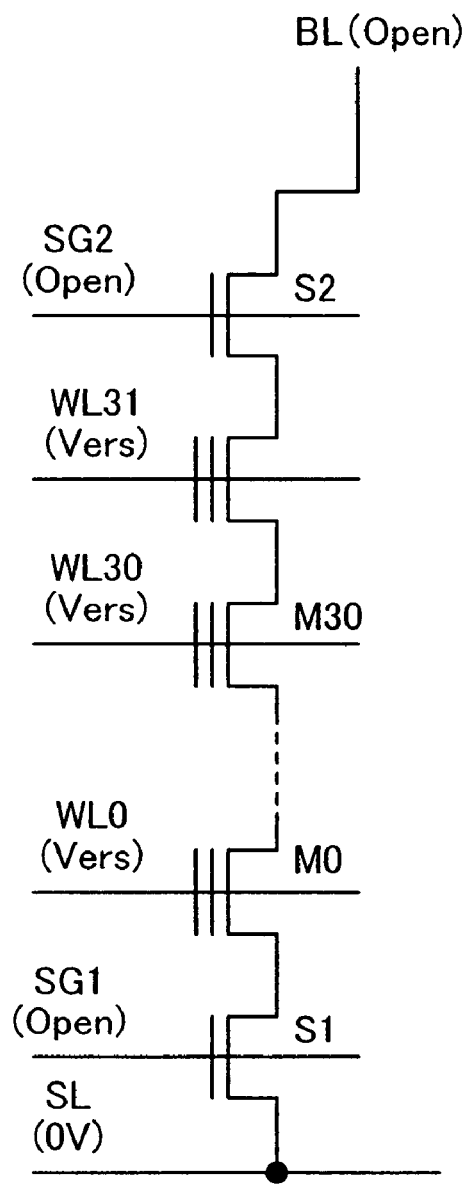
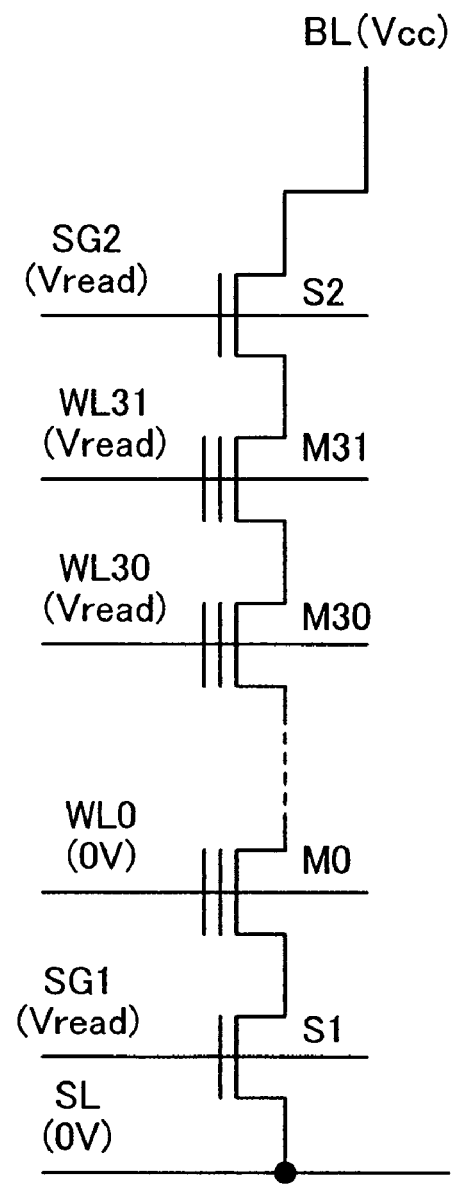

FIG. 18
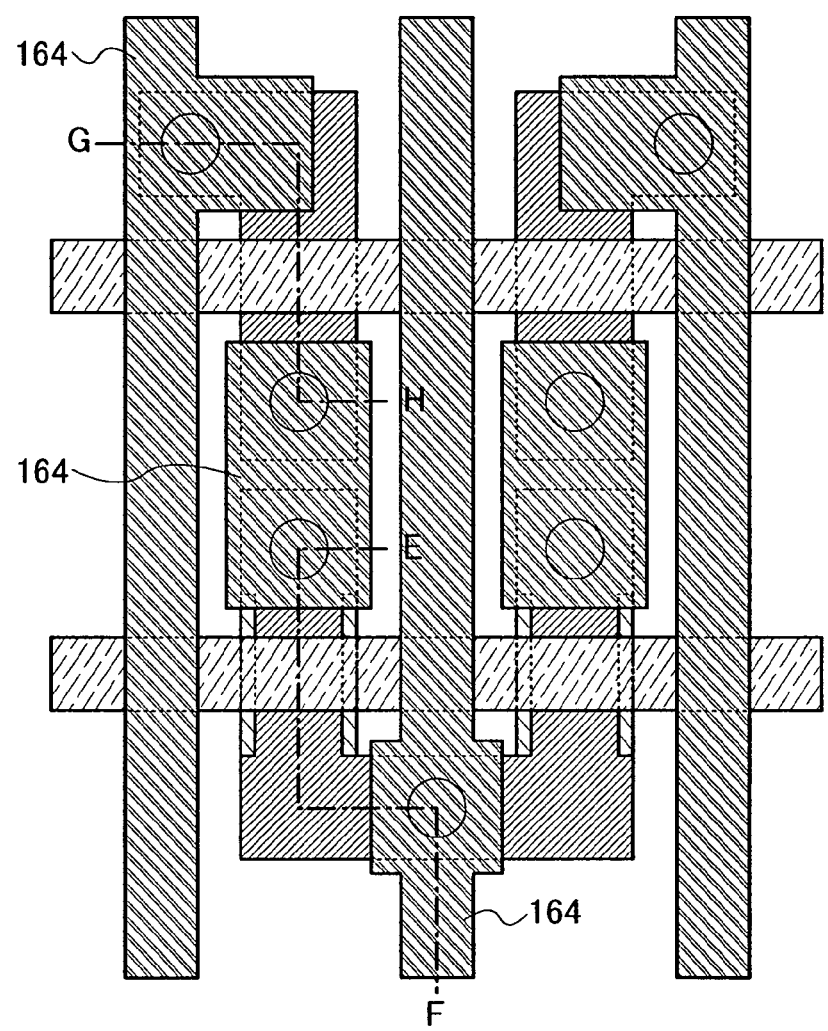
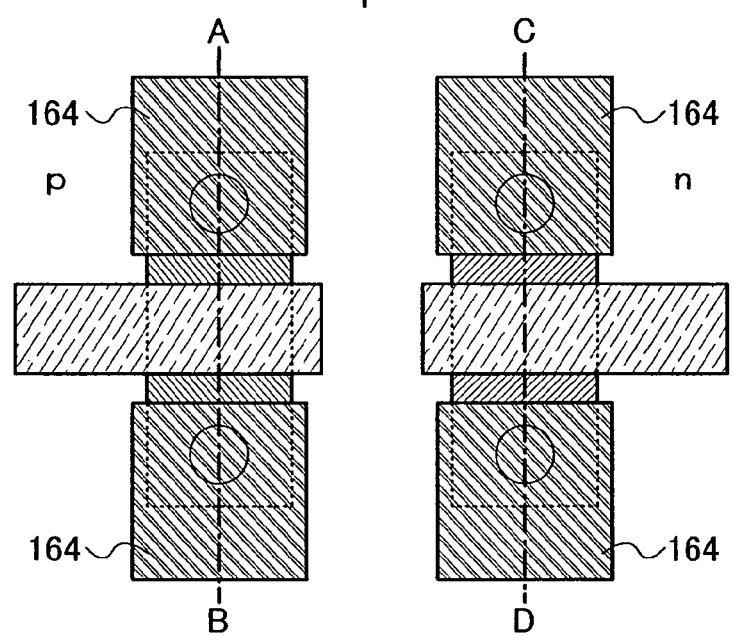

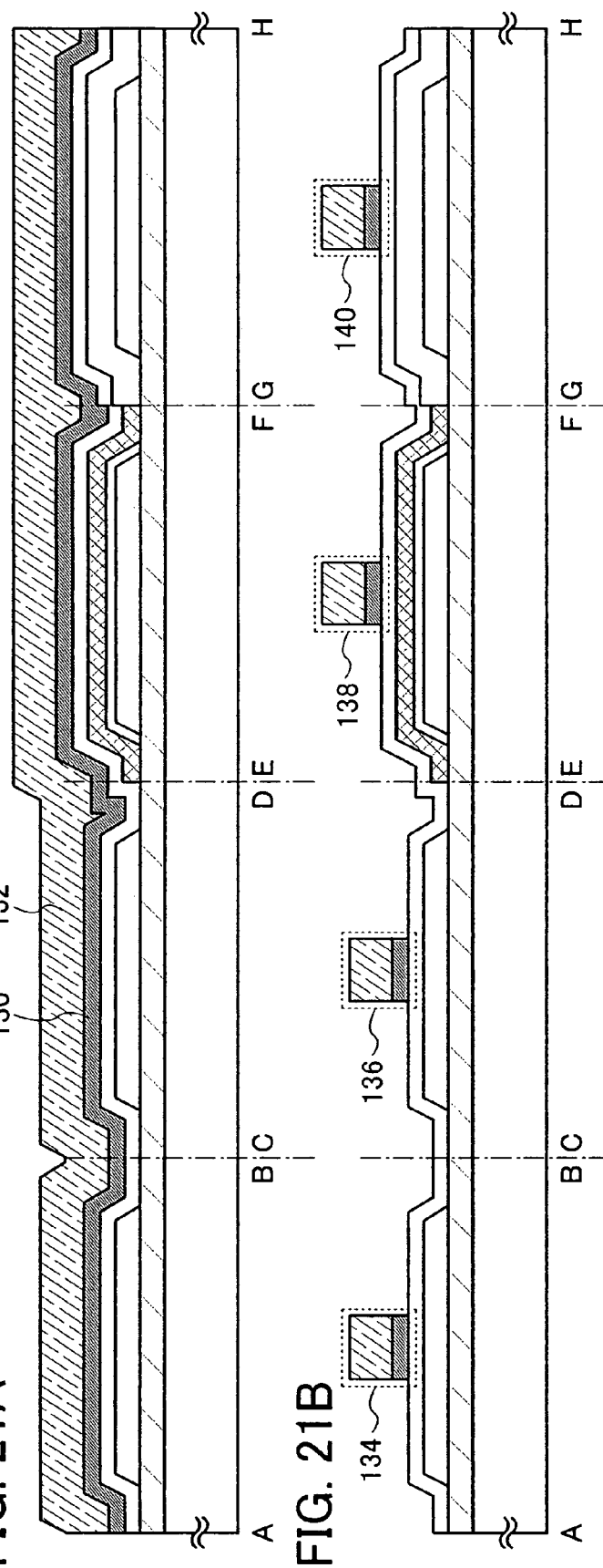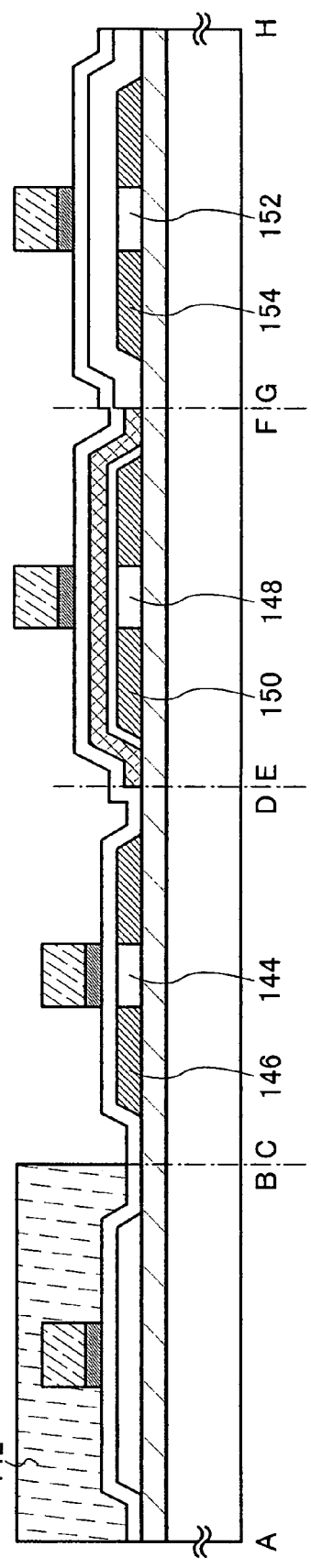
FIG. 21A
FIG. 21B
FIG. 21C

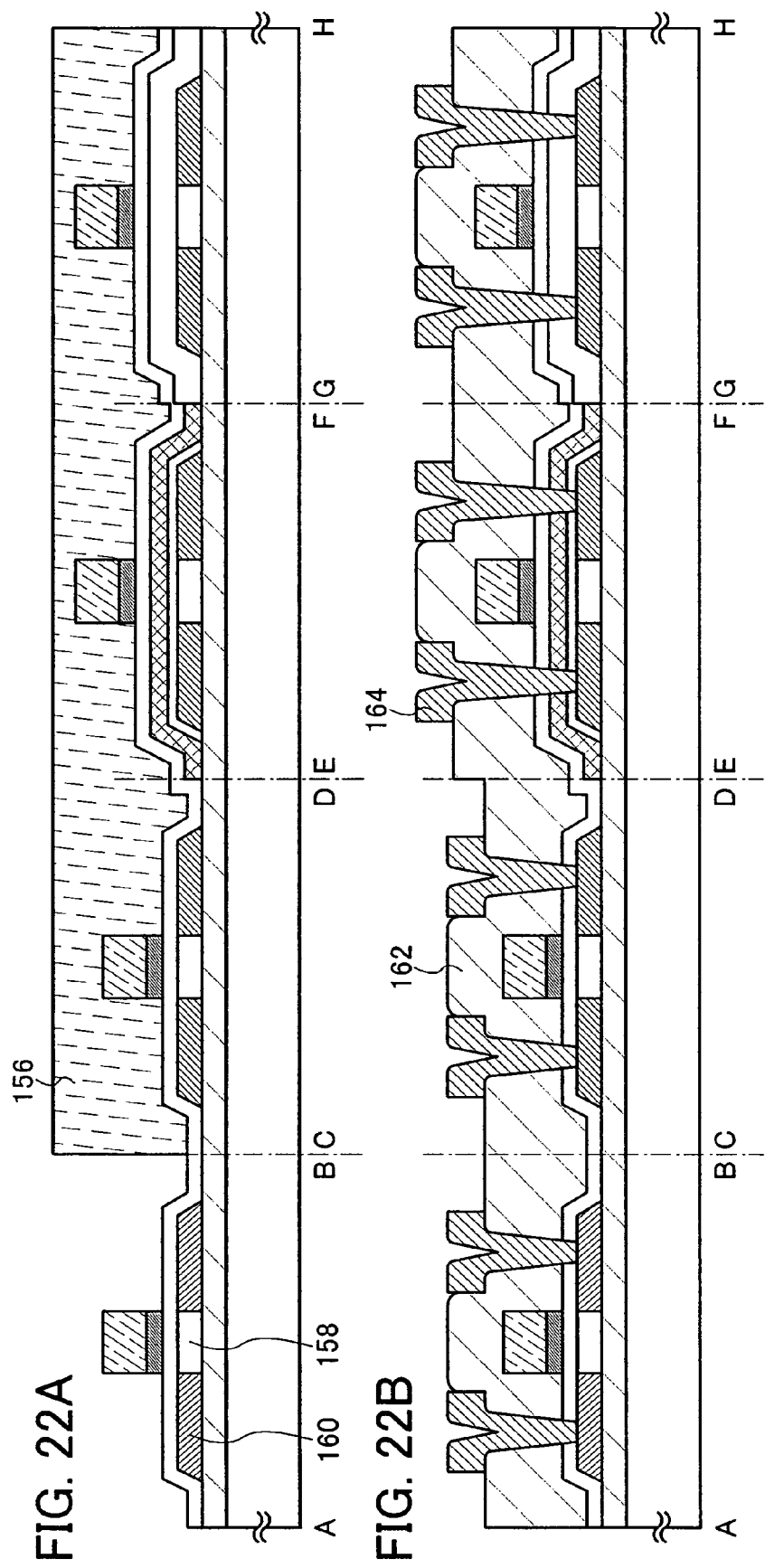

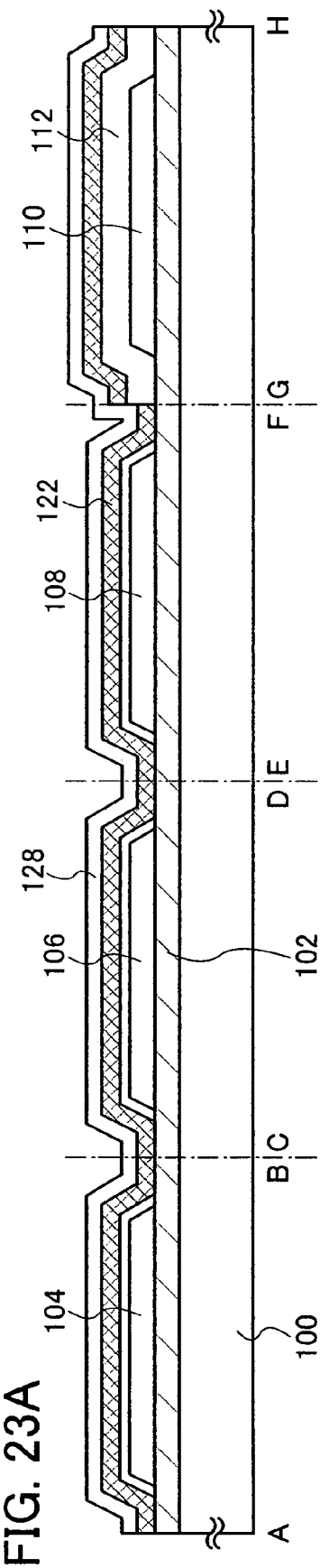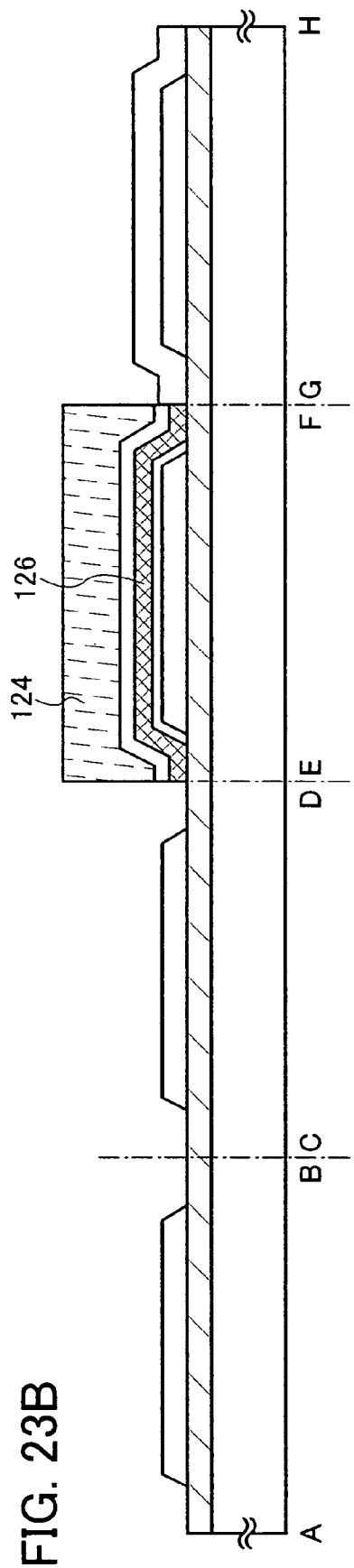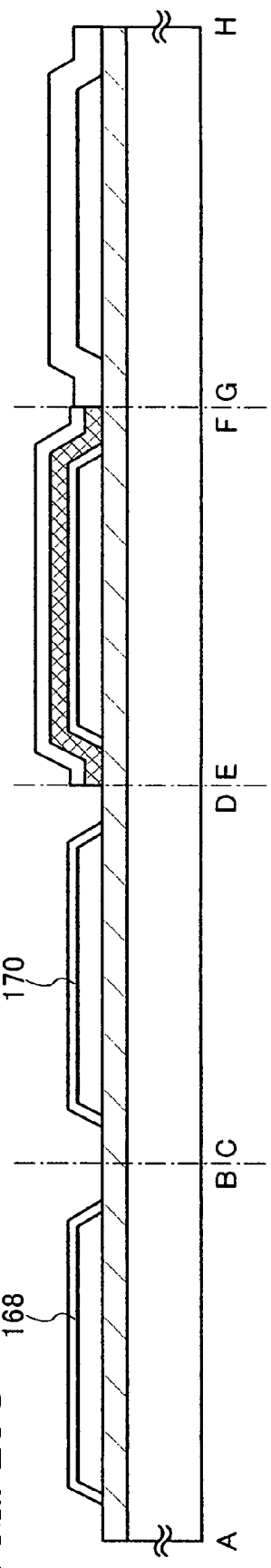

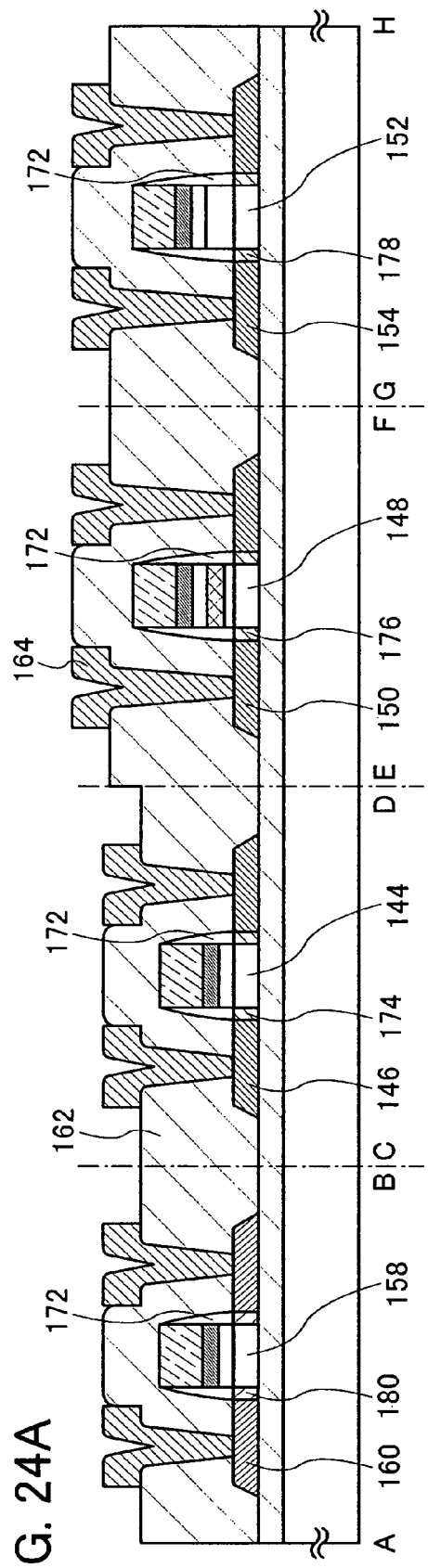

FIG. 26
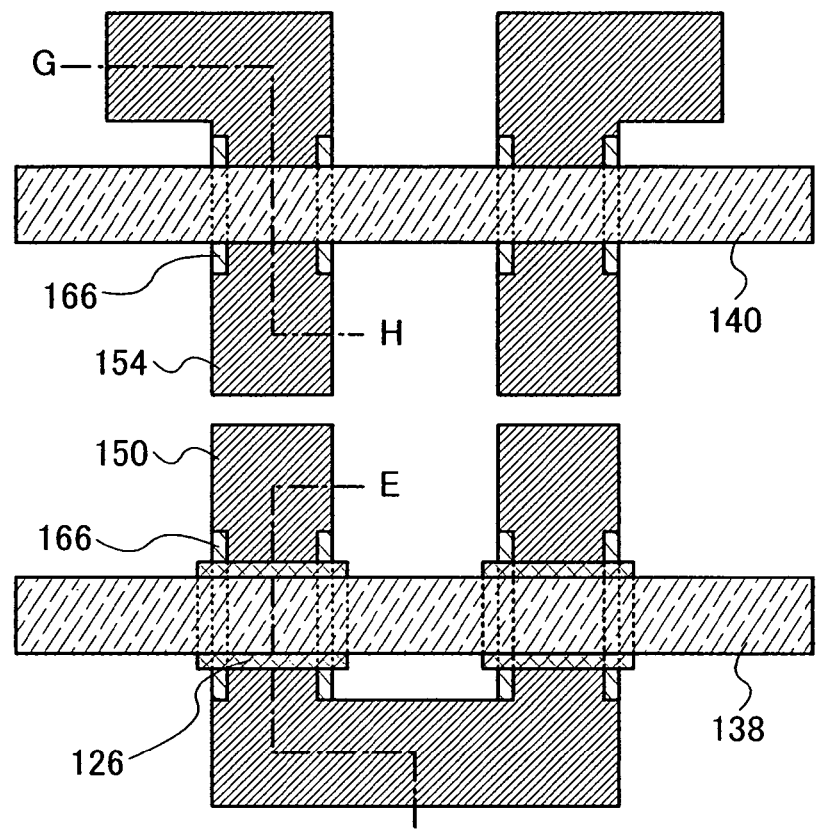
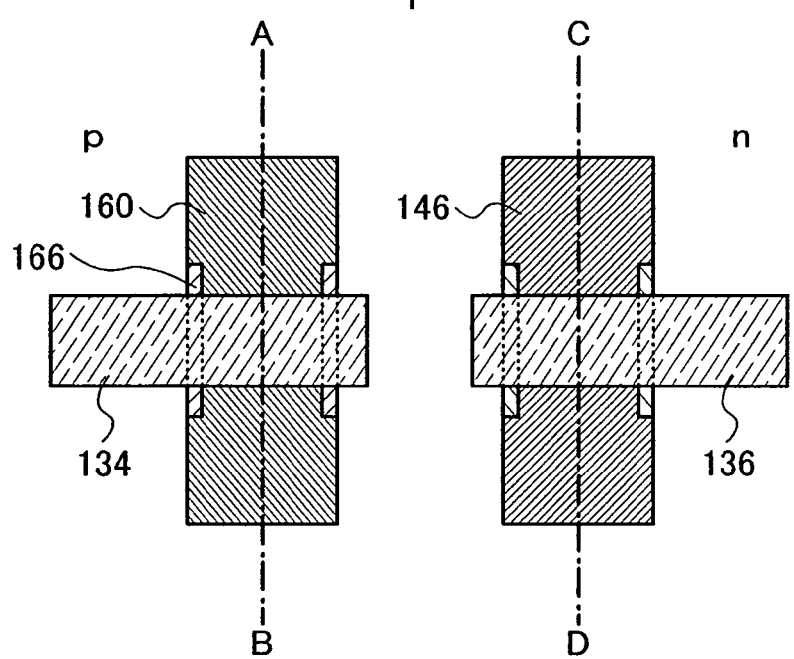

FIG. 28
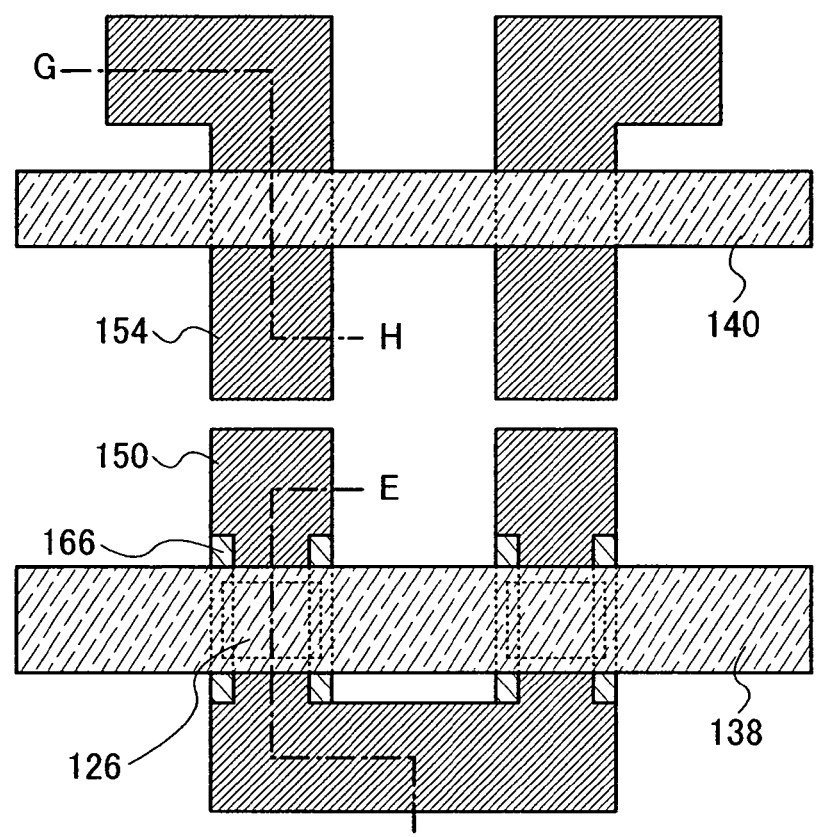
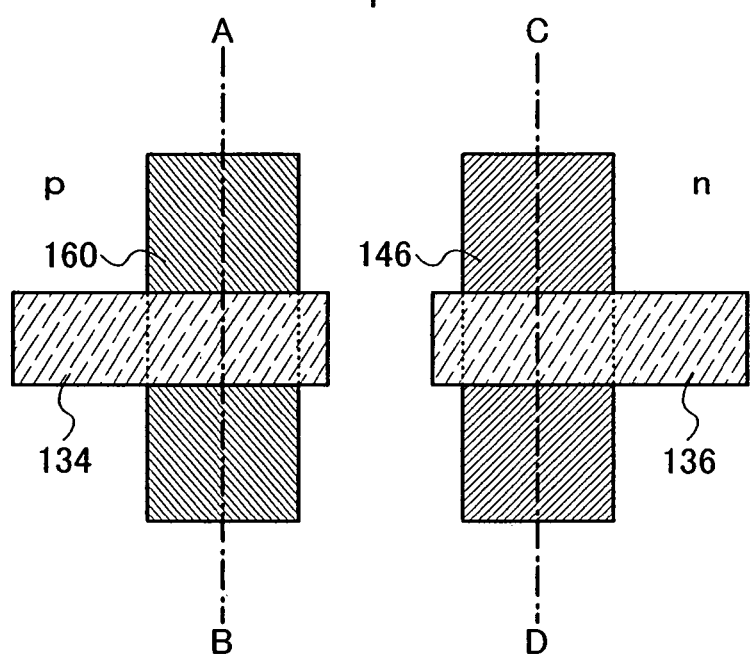

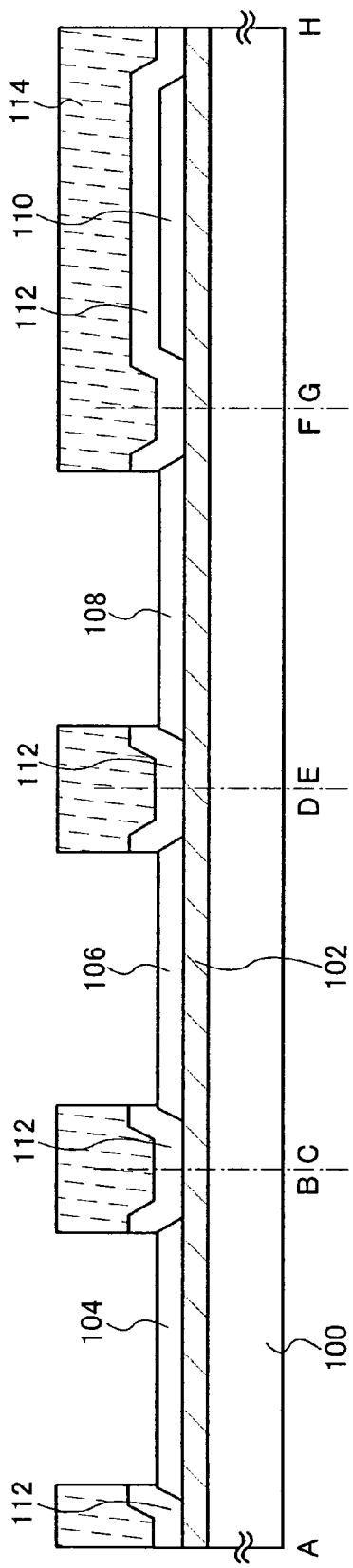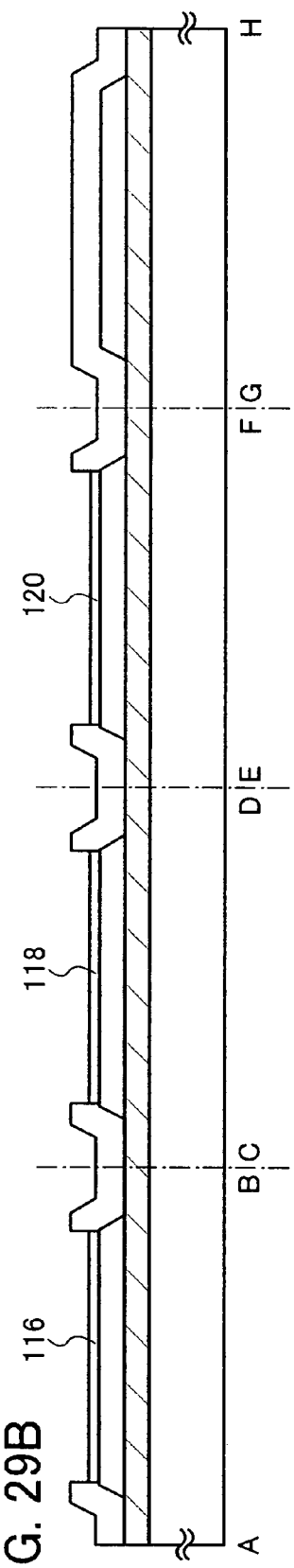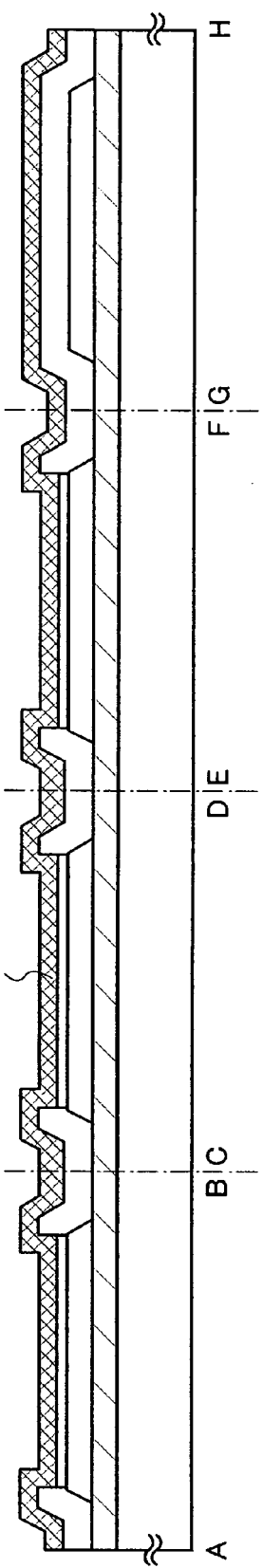

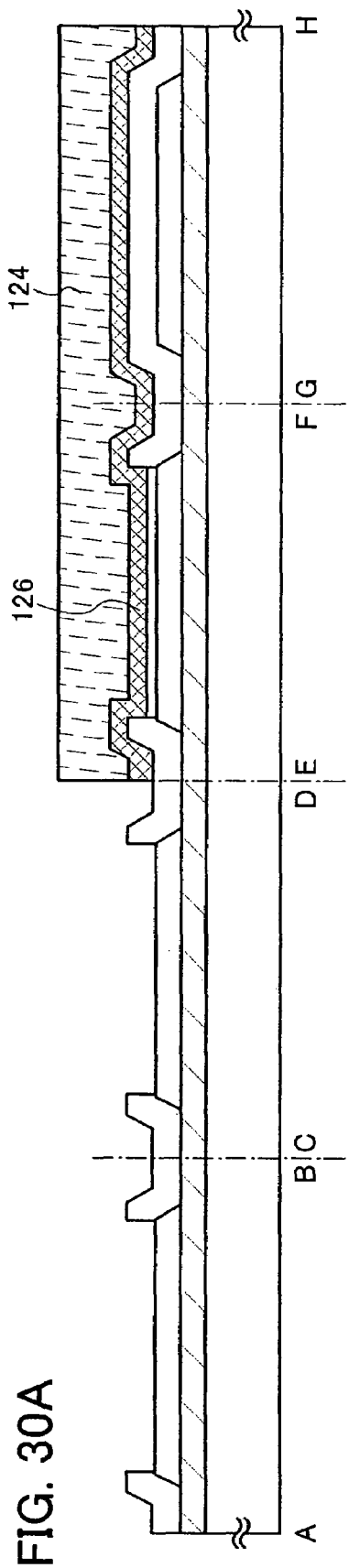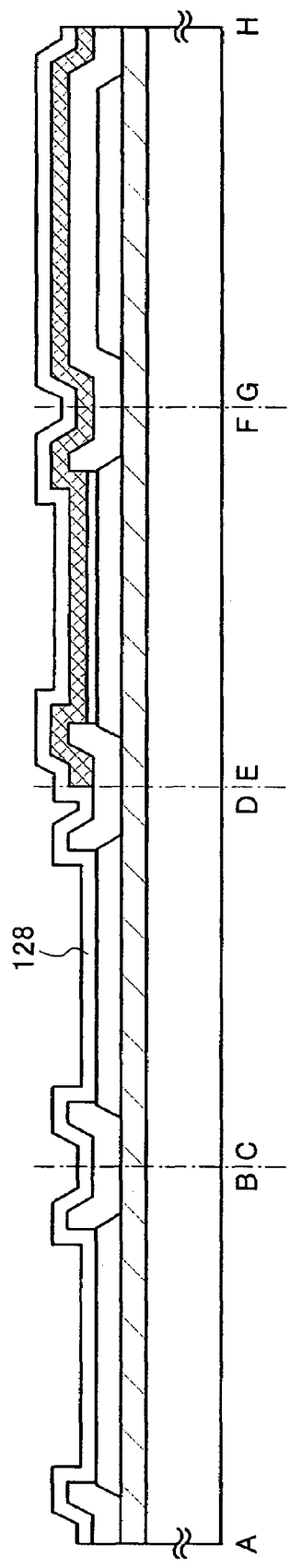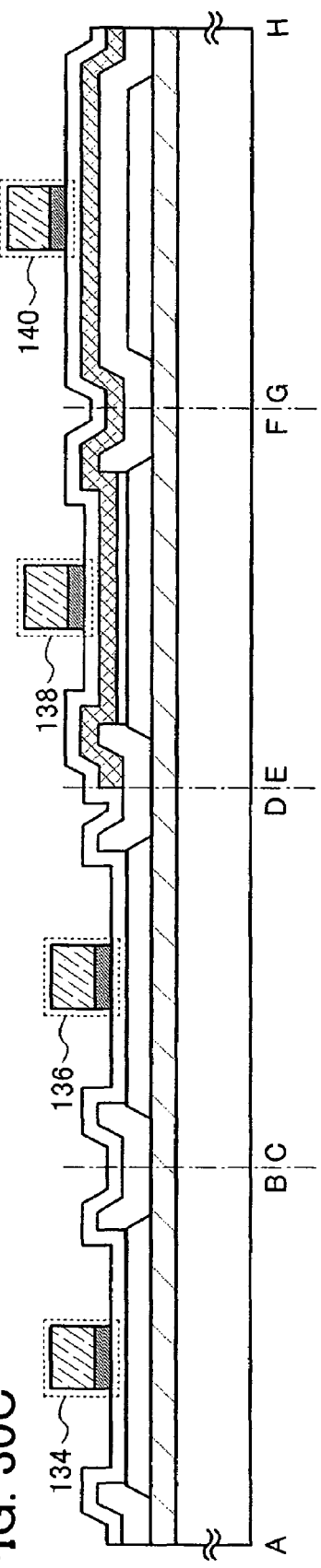

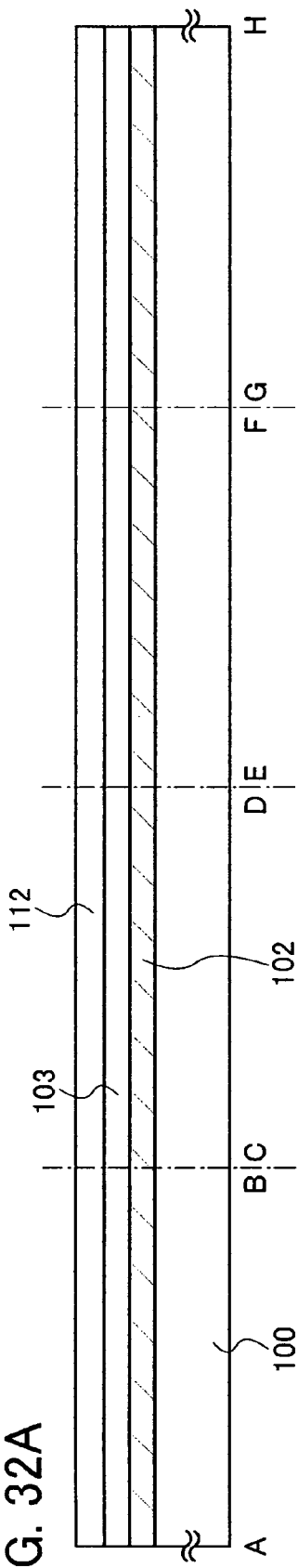
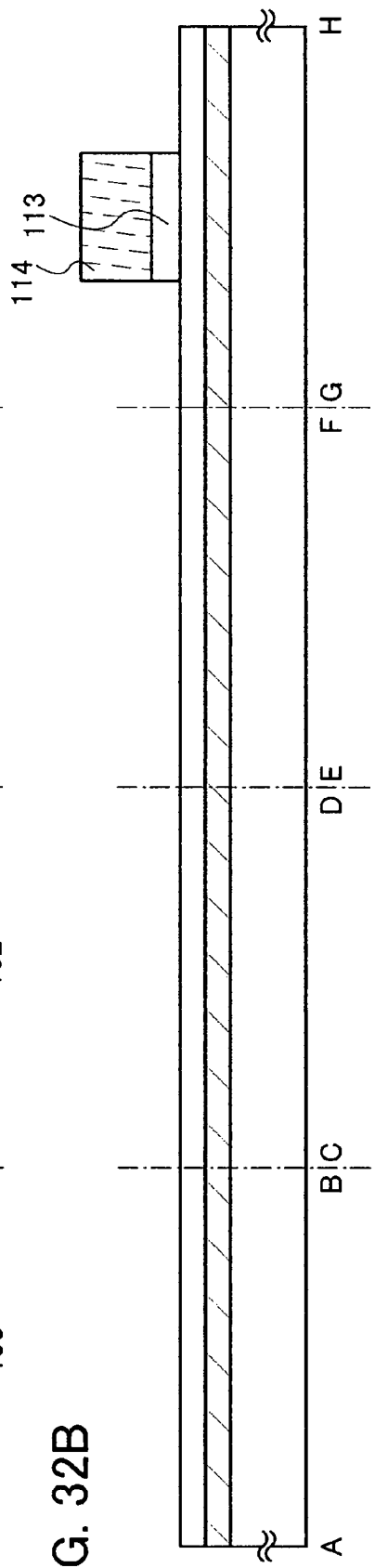
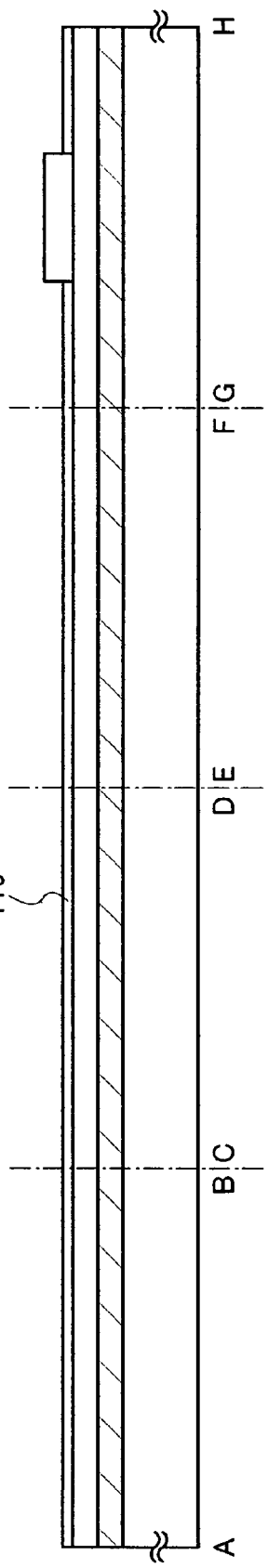
FIG. 32A
FIG. 32B
FIG. 32C

······ INITIAL STATE
—— WRITING ONCE
- - - ERASING ONCE
—— WRITING 150000 TIMES
— — ERASING 150000 TIMES

○ INITIAL STATE ▲ WRITING ✕ ERASING

NONVOLATILE SEMICONDUCTOR MEMORY DEVICE AND MANUFACTURING METHOD THEREOF

BACKGROUND OF THE INVENTION

1. Field of the Invention

The present invention relates to a nonvolatile semiconductor memory device capable of electrical writing, reading, and erasing, and a manufacturing method thereof.

2. Description of the Related Art

In recent years, a market of a nonvolatile memory capable of electrically rewriting data and storing data even when power is turned off has been expanded. The nonvolatile memory has a similar structure to that of MOSFET (Metal Oxide Semiconductor Field Effect Transistor) and has a feature in that a region capable of accumulating charge for a long time is provided over a channel formation region. This charge accumulating region is formed over an insulating layer and is insulated and isolated from a peripheral region; accordingly, the charge accumulating region is also referred to as a floating gate. A control gate is provided over the floating gate with another insulating layer interposed therebetween.

In a so-called floating gate type nonvolatile memory having such a structure, an operation in which charge is accumulated in a floating gate and the charge is discharged is performed by voltage applied to a control gate. That is, when the charge held in the floating gate is taken in and out, data is stored. Specifically, the charge is injected into or extracted from the floating gate by application of high voltage between a semiconductor layer in which a channel formation region is formed and the control gate. It is said that, at this time, fowler-nordheim (F-N) type tunnel current (NAND type) or a thermoelectron (NOR type) flows through an insulating layer formed over the channel formation region. Accordingly, the insulating layer is also referred to as a tunnel insulating layer.

The floating gate type nonvolatile memory is required to have a characteristic of being able to hold charge stored in the floating gate for more than ten years in order to assure reliability. Therefore, the tunnel insulating layer is required to be formed to be thick enough to make tunnel current flow and to have a high insulating property so that the charge is not leaked.

In addition, various structures of the nonvolatile memory are considered in order to achieve low writing voltage, improvement in a charge holding characteristic, or low cost of the nonvolatile memory. For example, a structure in which a memory transistor is provided over a glass substrate or a plastic substrate is given (for example, Patent Document 1: Japanese Published Patent Application No. 2006-13534).

SUMMARY OF THE INVENTION

In general, in the case of forming a nonvolatile semiconductor memory device over a substrate with low heat resistance, such as glass, with the use of an element such as a thin film transistor, it is difficult to use a thermal oxidation method for formation of an insulating layer. Therefore, in the case of forming an insulating layer to be thin, the insulating layer has been required to be formed with a thickness of several nm by a CVD method or a sputtering method. However, the insulating layer formed with a thickness of several nm by a CVD method or a sputtering method has a defect inside its film and has an insufficient film thickness; thus, there is a problem in that reliability of the nonvolatile semiconductor memory device is lowered (a writing defect or a reading defect), due to generation of leak current, a short circuit between a semiconductor layer and a charge accumulating layer, or the like.

Moreover, in the case where a semiconductor layer is provided to be an island-shape, steps are generated at edges of the semiconductor layer; therefore, a problem in that the edges of the semiconductor layer cannot be sufficiently covered with an insulating layer occurs. In particular, in recent years, an insulating layer serving as a tunnel insulating layer has been required to be thin in order to further reduce power consumption of a memory, and a coverage defect of the edges of the semiconductor layer becomes pronounced. For example, a problem such as deterioration in a charge holding characteristic due to leak of current at edges of a gate electrode and a channel formation region of the semiconductor layer occurs when the insulating layer at the edges of the channel formation region of the semiconductor layer is formed to be thin. In addition, in the case where charge is trapped at the edges of the semiconductor layer due to destruction of the insulating layer covering the semiconductor layer or treatment of a manufacturing process, electric characteristics of the channel formation region at the edges are changed in comparison with a central portion of the semiconductor layer, and thus, reliability of the nonvolatile semiconductor memory device might be lowered.

In view of the above-described problems, it is an object of the present invention to provide a nonvolatile semiconductor memory device which is capable of high-efficient writing at low voltage and is excellent in a charge holding characteristic, and a manufacturing method thereof.

A nonvolatile semiconductor memory device of the present invention includes a semiconductor layer formed over a substrate; a charge accumulating layer provided over the semiconductor layer with a first insulating layer interposed therebetween; and a gate electrode provided over the charge accumulating layer with a second insulating layer interposed therebetween, where the semiconductor layer includes a channel formation region provided in a region overlapping with the gate electrode; a first impurity region for forming a source region or drain region, which is provided to be adjacent to the channel formation region; and a second impurity region provided to be adjacent to the channel formation region and the first impurity region, and where a conductivity type of the first impurity region is different from that of the second impurity region.

In addition, a nonvolatile semiconductor memory device of the present invention includes a semiconductor layer formed over a substrate; a charge accumulating layer provided over the semiconductor layer with a first insulating layer interposed therebetween; and a gate electrode provided over the charge accumulating layer with a second insulating layer interposed therebetween, where the semiconductor layer includes a channel formation region provided in a region overlapping with the gate electrode; a first impurity region for forming a source region or drain region, which is provided to be adjacent to the channel formation region; and a second impurity region provided to be adjacent to the channel formation region and the first impurity region, where the second impurity region is provided in a region which is at least an edge of the semiconductor layer and overlaps with the gate electrode, and where a conductivity type of the first impurity region is different from that of the second impurity region.

A manufacturing method of a nonvolatile semiconductor memory device of the present invention includes the steps of: forming a semiconductor layer over a substrate; forming a first insulating layer containing one or both of oxygen and nitrogen over the semiconductor layer by high density plasma treatment; selectively forming a first impurity region by introduction of a first impurity element into the semiconductor layer; forming a charge accumulating layer over the first insulating layer; forming a second insulating layer over the charge accumulating layer; selectively forming a conductive layer over the second insulating layer; selectively forming a resist so as to cover the first impurity region provided in the semiconductor layer; and forming a second impurity region in the semiconductor layer by introduction of a second impurity element having a different conductivity type from that of the first impurity element into the semiconductor layer with the use of the conductive layer and the resist as masks. Alternatively, the first insulating layer can be formed by high density plasma treatment under an atmosphere containing nitrogen after performing high density plasma treatment to the semiconductor layer under an atmosphere containing oxygen.

Another manufacturing method of a nonvolatile semiconductor memory device of the present invention includes the steps of: forming a semiconductor layer over a substrate; forming a first insulating layer so as to cover edges of the semiconductor layer; forming a second insulating layer containing one or both of oxygen and nitrogen over the semiconductor layer by high density plasma treatment; forming a charge accumulating layer over the second insulating layer; forming a third insulating layer over the charge accumulating layer; selectively forming a conductive layer over the third insulating layer; selectively forming a resist so as to cover a first impurity region provided in the semiconductor layer; and forming a second impurity region in the semiconductor layer by introduction of a second impurity element having a different conductivity type from that of the first impurity element into the semiconductor layer with the use of the conductive layer and the resist as masks. Alternatively, the second insulating layer can be formed by high density plasma treatment under an atmosphere containing nitrogen after performing high density plasma treatment to the semiconductor layer under an atmosphere containing oxygen.

In a nonvolatile semiconductor memory device, when a first insulating layer which can serve as a tunnel insulating film is formed by high density plasma treatment, defects inside the film can be reduced and reliability can be improved (writing defects or reading defects can be reduced). In addition, in the nonvolatile semiconductor memory device, when an impurity region having a different conductivity type from that of a source region or drain region is provided in a region which is an edge of the semiconductor layer and overlaps with a control gate electrode, influence due to an edge of a channel formation region of the semiconductor layer can be reduced.

BRIEF DESCRIPTION OF DRAWINGS

In the accompanying drawings:

FIGS. 12A and 12B are views explaining an erasing operation and a reading operation of a NAND type nonvolatile memory;

FIG. 18 is a view showing an example of a manufacturing method of a nonvolatile semiconductor memory device of the present invention;

FIGS. 21A to 21C are views each showing an example of a manufacturing method of a nonvolatile semiconductor memory device of the present invention;

FIGS. 22A and 22B are views each showing an example of a manufacturing method of a nonvolatile semiconductor memory device of the present invention;

FIGS. 23A to 23C are views each showing an example of a manufacturing method of a nonvolatile semiconductor memory device of the present invention;

FIGS. 24A and 24B are views each showing an example of a manufacturing method of a nonvolatile semiconductor memory device of the present invention;

FIG. 26 is a view showing an example of a manufacturing method of a nonvolatile semiconductor memory device of the present invention;

FIG. 28 is a view showing an example of a manufacturing method of a nonvolatile semiconductor memory device of the present invention;

FIGS. 29A to 29C are views each showing an example of a manufacturing method of a nonvolatile semiconductor memory device of the present invention;

FIGS. 30A to 30C are views each showing an example of a manufacturing method of a nonvolatile semiconductor memory device of the present invention;

FIGS. 32A to 32C are views each showing an example of a manufacturing method of a nonvolatile semiconductor memory device of the present invention;

DETAILED DESCRIPTION OF THE INVENTION

Figure 1A:
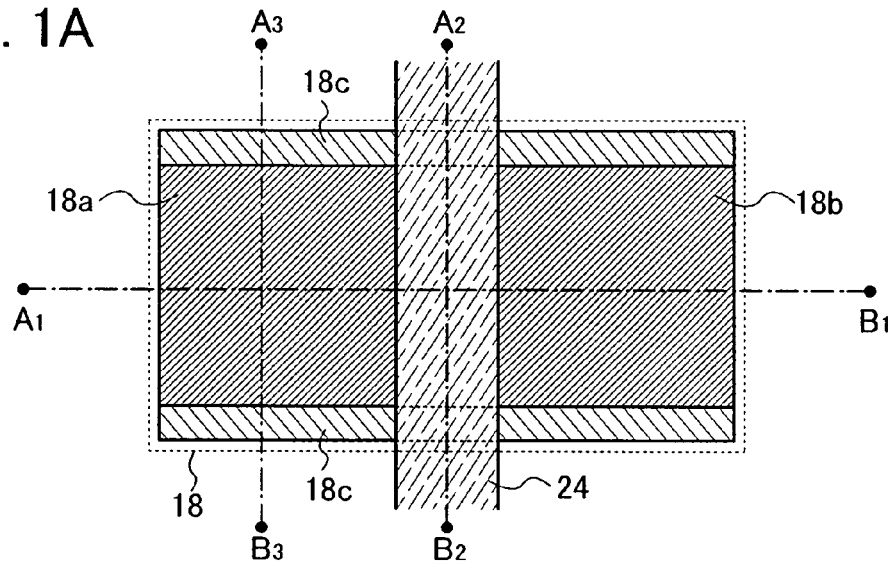
FIGS. 1A to 1D are views each showing a main structure of a nonvolatile semiconductor memory device of the present invention.

Hereinafter, an embodiment mode of the present invention will be explained with reference to the drawings. However, the present invention is not limited to the following explanation, and it is easily understood by those skilled in the art that the mode and the detail of the present invention can be modified in various ways without departing from the purpose and the scope of the present invention. Therefore, the present invention is not interpreted as being limited to the description of the embodiment mode. It is to be noted that, in structures of the present invention explained hereinafter, the same portion is denoted by the same reference numeral in different drawings.

Embodiment Mode 1

In this embodiment mode, an example of a nonvolatile semiconductor memory device of the present invention will be explained with reference to the drawings.

Figure 1B:
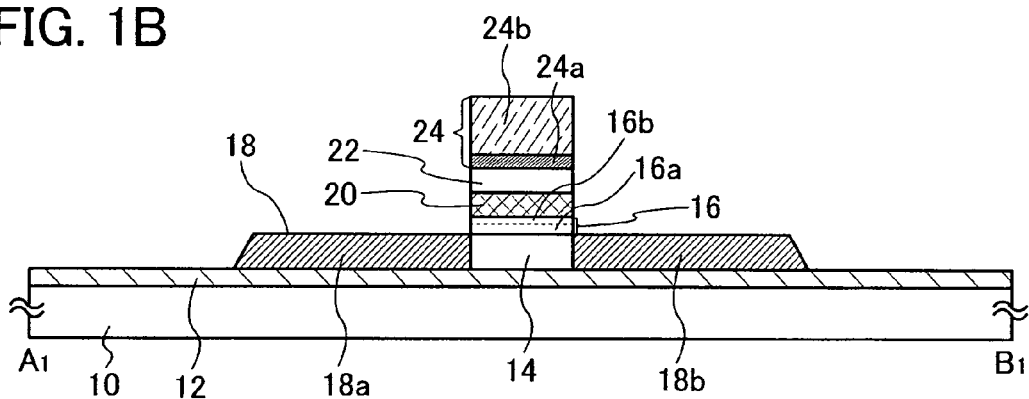
Figure 1C:
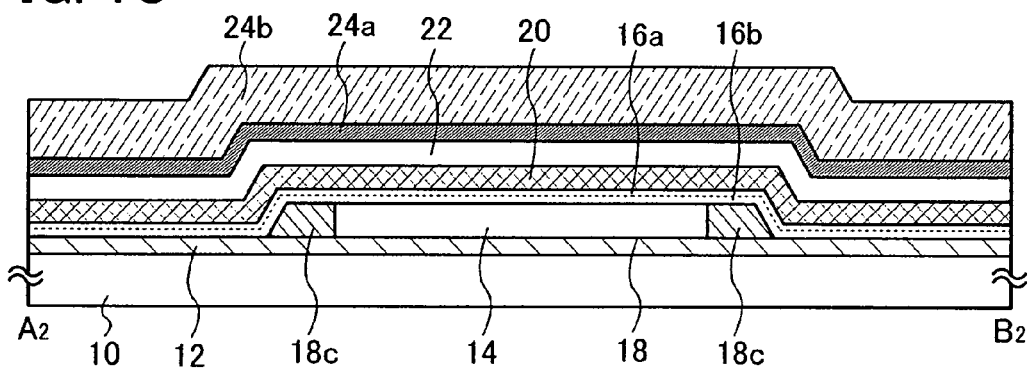
Figure 1D:
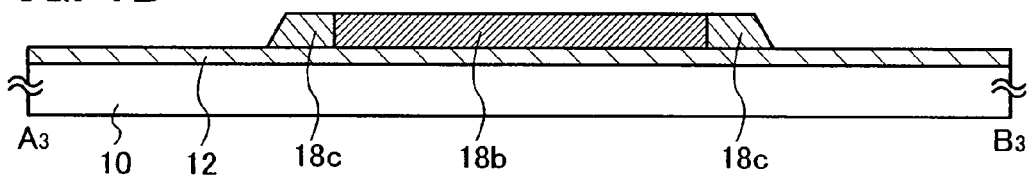

FIGS. 1A to 1D are views for explaining an example of a main structure of a nonvolatile semiconductor memory device of the present invention. FIGS. 1A to 1D each show a main part of a nonvolatile memory element provided in a memory portion, in the nonvolatile semiconductor memory device. It is to be noted that FIG. 1A shows a top view and FIGS. 1B, 1C, and 1D show schematic cross-sectional views taken along lines $A_1$-$B_1$, $A_2$-$B_2$, and $A_3$-$B_3$ of FIG. 1A, respectively.

The nonvolatile memory element shown in FIGS. 1A to 1D includes a substrate 10 having an insulating surface. As the substrate 10 having the insulating surface, the following can be used: a glass substrate, a quartz substrate, a sapphire substrate, a ceramic substrate, a metal substrate of which surface is provided with an insulating layer, or the like.

A semiconductor layer 18 is formed over this substrate 10 having the insulating surface. A base insulating layer 12 may be provided between the substrate 10 and the semiconductor layer 18. This base insulating layer 12 prevents an impurity such as an alkali metal from diffusing from the substrate 10 to the semiconductor layer 18 and contaminating the semiconductor layer 18. The base insulating layer 12 may be appropriately provided as a blocking layer.

The base insulating layer 12 is formed of an insulating material such as silicon oxide (SiOx), silicon nitride (SiNx), silicon oxynitride (SiOxNy) (x>y), or silicon nitride oxide (SiNxOy) (x>y) by a CVD method, a sputtering method, or the like. For example, in the case where the base insulating layer 12 has a two-layered structure, a silicon nitride oxide film may be formed as a first insulating layer and a silicon oxynitride film may be formed as a second insulating layer. Alternatively, a silicon nitride film may be formed as the first insulating layer and a silicon oxide film may be formed as the second insulating layer.

It is preferable that the semiconductor layer 18 be formed of a single crystal semiconductor or a polycrystalline semiconductor. For example, a semiconductor layer which is formed over an entire surface of the substrate 10 by a sputtering method, a plasma CVD method, or a low-pressure CVD method is crystallized, and then, the crystallized semiconductor layer is selectively etched, whereby a plurality of semiconductor layers 18 can be formed over the substrate 10. In other words, for the purpose of element isolation, it is preferable that a plurality of island-shaped semiconductor layers be formed over an insulating surface and a nonvolatile memory element be formed with the use of the semiconductor layer. Silicon is preferably used as a semiconductor material. Besides, a silicon germanium semiconductor can be used. As a crystallization method of the semiconductor layer, the following can be employed: a laser crystallization method, a crystallization method by heat treatment using rapid thermal annealing (RTA) or an annealing furnace, a crystallization method using a metal element promoting crystallization, or a method in which these methods are combined. Alternatively, instead of these thin film processes, a so-called SOI (Silicon on Insulator) substrate in which a single crystal semiconductor layer is formed over an insulating surface may be used.

A p-type impurity may be injected into a channel formation region 14 of the semiconductor layer 18 (channel-dope). For example, boron is used as the p-type impurity, and boron may be added at a concentration of approximately $5 \times 10^{15}$ to $1 \times 10^{16}$ atoms/cm$^3$. The p-type impurity is added in order to control threshold voltage of a transistor and the p-type impurity effectively functions when being added to the channel formation region 14. The channel formation region 14 is formed in a region roughly overlapping with a control gate electrode 24 to be described later, and is positioned between first impurity regions 18a and 18b of the semiconductor layer 18.

Each of the first impurity regions 18a and 18b serves as a source region or a drain region in the nonvolatile memory element. The first impurity regions 18a and 18b are formed by addition of phosphorus or arsenic at a peak concentration of approximately greater than or equal to $10^{21}$ atoms/cm$^3$.

A first insulating layer 16, a charge accumulating layer 20, a second insulating layer 22, and the control gate electrode 24 are stacked over the semiconductor layer 18. The first insulating layer 16 can serve as a tunnel insulating layer in the nonvolatile memory element. The second insulating layer 22 can serve as a control insulating layer in the nonvolatile memory element.

The first insulating layer 16 is formed of a single-layered silicon oxide film, or a film containing silicon oxide and silicon nitride, or containing silicon oxide and silicon oxynitirde. The first insulating layer 16 may be formed by a method in which an insulating layer is deposited by a plasma CVD method or a low-pressure CVD method; however, the first insulating layer 16 is preferably formed by solid-phase oxidation or solid-phase nitridation by plasma treatment. This is because an insulating layer formed by a method in which a semiconductor layer (typically, a silicon layer) is oxidized or nitrided by plasma treatment is dense, has high withstand voltage, and is highly reliable. Since the first insulating layer 16 is used as an insulating layer for injecting charge into the charge accumulating layer 20, the first insulating layer 16 is preferably strong as described above. It is preferable that the first insulating layer 16 be formed with a thickness of 1 to 10 nm, much preferably, 1 to 5 nm. For example, in the case where the gate length is set to be 600 nm, the first insulating layer 16 can be formed with a thickness of 1 to 3 nm.

It is preferable to use plasma with an electron density of greater than or equal to $1\times10^{11}$ cm$^{-3}$ and less than or equal to $1\times10^{13}$ cm$^{-3}$ and an electron temperature of greater than or equal to 0.5 eV and less than or equal to 1.5 eV, which is excited by a microwave (typically, 2.45 GHz), in solid-phase oxidation treatment or solid-phase nitridation treatment by plasma treatment. This is because practical reaction speed can be obtained while forming a dense insulating layer in the solid-phase oxidation treatment or the solid-phase nitridation treatment at a temperature of greater than or equal to 500° C.

In the case where a surface of the semiconductor layer 18 is oxidized by this plasma treatment, the plasma treatment is performed under an oxygen atmosphere (for example, an atmosphere containing oxygen ($O_2$) or dinitrogen monoxide ($N_2O$) and a rare gas (containing at least one of He, Ne, Ar, Kr, and Xe) or an atmosphere containing oxygen or dinitrogen monoxide, hydrogen ($H_2$), and a rare gas). In addition, in the case where nitridation is performed by the plasma treatment, the plasma treatment is performed under a nitrogen atmosphere (for example, an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). For example, Ar can be used as the rare gas. Alternatively, a gas in which Ar and Kr are mixed may be used.

Figure 15:
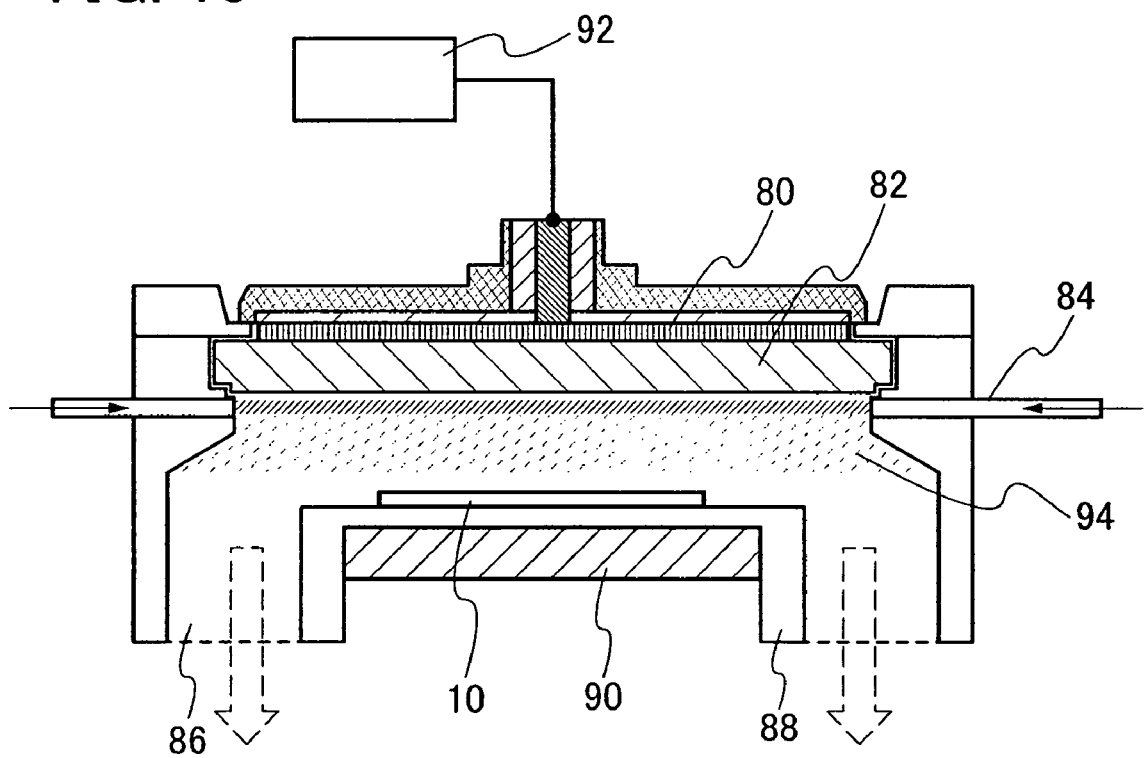
FIG. 15 is a view explaining a structure of a plasma treatment apparatus.

A structural example of an apparatus for performing plasma treatment is shown in FIG. 15. This plasma treatment apparatus includes a supporting base 88 for disposing a substrate 10, a gas supply portion 84 for introducing a gas, an exhaust port 86 to be connected to a vacuum pump for exhausting a gas, an antenna 80, a dielectric plate 82, and a microwave supply portion 92 for supplying a microwave for plasma generation. When the supporting base 88 is provided with a temperature control portion 90, a temperature of the substrate 10 can be controlled.

The plasma treatment will be explained below. It is to be noted that the plasma treatment includes oxidation treatment, nitridation treatment, oxynitridation treatment, hydrogenation treatment, and a surface modification treatment to a semiconductor layer, an insulating layer, and a conductive layer. In such treatment, a gas supplied from the gas supply portion 84 may be selected depending on its purpose.

The oxidation treatment or the nitridation treatment is performed as follows. First, a treatment chamber is evacuated, and a gas for plasma treatment containing oxygen or nitrogen is introduced from the gas supply portion 84. The substrate 10 is set to be a room temperature, or heated at 100 to 550° C. by the temperature control portion 90. It is to be noted that a space between the substrate 10 and the dielectric plate 82 is approximately 20 nm to 80 mm (preferably, 20 nm to 60 mm). Next, a microwave is supplied from the microwave supply portion 92 to the antenna 80. Then, the microwave is introduced from the antenna 80 to the treatment chamber through the dielectric plate 82, whereby plasma 94 is generated. When the plasma is excited by introduction of the microwave, plasma with a low electron temperature (less than or equal to 3 eV, preferably, less than or equal to 1.5 eV) and a high electron density (greater than or equal to $1\times10^{11}$ cm$^{-3}$) can be generated. By an oxygen radical (there is a case where an OH radical is included) and/or a nitrogen radical (there is a case where an NH radical is included) generated by this high density plasma, the surface of the semiconductor layer can be oxidized or nitrided. When a rare gas such as argon is mixed with a gas for plasma treatment, an oxygen radical or a nitrogen radical can be efficiently generated by excited species of the rare gas. By this method, an active radical which is excited by plasma can be effectively used, and oxidation, nitridation, or oxynitridation by solid-phase reaction can be performed at a low temperature of less than or equal to 500° C.

An example of a preferable first insulating layer 16 formed by plasma treatment in FIGS. 1A to 1D is as follows. A silicon oxide layer 16a is formed with a thickness of 3 to 6 nm over the surface of the semiconductor layer 18 by plasma treatment under an oxygen atmosphere, and thereafter, the surface of the silicon oxide layer is processed by nitrided plasma under a nitrogen atmosphere, whereby a nitrogen plasma-treated layer 16b is formed. Specifically, first, the silicon oxide layer 16a is formed with a thickness of 3 to 6 nm over the semiconductor layer 18 by plasma treatment under an oxygen atmosphere. After that, plasma treatment is continuously performed under a nitrogen atmosphere, whereby the nitrogen plasma-treated layer 16b with a high nitrogen concentration is provided over the surface of the silicon oxide layer or near the surface thereof. It is to be noted that "near the surface" means a depth of approximately 0.25 to 1.5 nm from the surface of the silicon oxide layer. For example, after the silicon oxide layer 16a is formed, plasma treatment is performed under a nitrogen atmosphere, whereby a structure in which nitrogen is contained at a ratio of 20 to 50 atomic % in a portion of approximately 1 nm deep from the surface of the silicon oxide layer 16a is obtained. The nitrogen plasma-treated layer 16b is formed of silicon nitride or silicon containing oxygen and nitrogen (silicon oxynitride) depending on plasma treatment conditions.

A surface of a silicon layer which is a typical example of the semiconductor layer 18 is oxidized by plasma treatment, whereby a dense oxide film with no distortion at an interface can be formed. In addition, when the oxide film is nitrided by plasma treatment and nitrogen is substituted for oxygen at the surface part to form a nitride layer, the layer can be denser. Accordingly, an insulating layer with high withstand voltage can be formed and the insulating layer can be formed to be thinner. In addition, by nitridation by plasma treatment, an advantage that hole conduction is increased and erasing is easily performed in a nonvolatile memory element is obtained.

In any event, the solid-phase oxidation treatment or solid-phase nitridation treatment by the plasma treatment as described above makes it possible to obtain an insulating layer which is equivalent to a thermal oxide film formed at 950 to 1050° C. even when a glass substrate having a heat resistance temperature of less than or equal to 700° C. is used.

In other words, a tunnel insulating layer with high reliability can be formed as the tunnel insulating layer of the nonvolatile memory element.

The charge accumulating layer 20 can be formed of an insulating layer having a defect for trapping charge in the film or an insulating layer containing conductive particles or semiconductor particles such as silicon. For example, as the charge accumulating layer 20, an insulating layer containing a nitrogen element can be used, such as a silicon nitride (SiNx) film, a silicon nitride oxide (SiNxOy) (x>y) film, a silicon oxynitride (SiOxNy) (x>y) film, or a film in which conductive particles or semiconductor particles are contained in these insulating films.

The second insulating layer 22 is formed of one layer or plural layers of silicon oxide, silicon oxynitride (SiOxNy) (x>y), silicon nitride (SiNx), silicon nitride oxide (SiNxOy) (x>y), aluminum oxide (AlxOy), and the like by a low-pressure CVD method, a plasma CVD method, or the like. The second insulating layer 22 is formed with a thickness of 1 to 20 nm, preferably, 5 to 10 nm. For example, as the second insulating layer 22, a stacked-layer structure including a silicon nitride layer with a thickness of 3 nm and a silicon oxide layer with a thickness of 5 nm can be used.

The control gate electrode 24 is preferably formed of a metal selected from tantalum (Ta), tungsten (W), titanium (Ti), molybdenum (Mo), chromium (Cr), niobium (Nb), or the like, or an alloy material or compound material containing the metals as its main component. In addition, polycrystalline silicon to which an impurity element such as phosphorus is added can be used. Alternatively, the control gate electrode 24 may be formed of a stacked layer structure including one layer or plural layers of a metal nitride layer 24a and a metal layer 24b. As the metal nitride, tungsten nitride, molybdenum nitride, or titanium nitride can be used. When the metal nitride layer 24a is provided, adhesiveness of the metal layer 24b can be improved and separation can be prevented. In addition, since the metal nitride such as tantalum nitride has a high work function, the first insulating layer 16 can be formed to be thick.

In the structure shown in FIGS. 1A to 1D, the semiconductor layer 18 provided to be an island-shape has the channel formation region 14 provided in a region overlapping with the control gate electrode 24; the first impurity regions 18a and 18b, which are regions not overlapping with the control gate electrode, provided to be adjacent to the channel formation region 14; and a second impurity region 18c provided in an edge portion of the semiconductor layer 18 which includes a region overlaps with the control gate electrode 24 and an adjacent region of the overlapping region. Each of the first impurity regions 18a and 18b can serve as a source region or a drain region in the nonvolatile memory element. The second impurity region 18c is provided to be adjacent to the channel formation region 14 and the first impurity regions 18a and 18b.

The first impurity regions 18a and 18b and the second impurity region 18c are provided so as to have different conductivity types. For example, in the case where the first impurity regions 18a and 18b are provided to have n-type conductivity, the second impurity region 18c is provided to have p-type conductivity. In the case where the first impurity regions 18a and 18b are provided to have p-type conductivity, the second impurity region 18c is provided to have n-type conductivity. Here, the first impurity regions 18a and 18b each of which can serve as a source region or a drain region are provided to have n-type conductivity and the second impurity region 18c is provided to have p-type conductivity. In addition, as described above, in the case where channel-dope is performed to the channel formation region 14 of the semiconductor layer 18 in advance, the second impurity region 18c may be a p-type impurity region with roughly the same concentration as that of the channel formation region 14.

It is needless to say that the first impurity regions 18a and 18b may be provided to have p-type conductivity and the second impurity region 18c may be provided to have n-type conductivity.

As described above, the second impurity region 18c having the different conductivity type from that of the first impurity regions 18a and 18b is provided in the edge portion of the semiconductor layer 18 which includes a region which overlaps with the control gate electrode 24 and an adjacent region of the overlapping, whereby a portion where the first impurity regions 18a and 18b and the impurity region 18c are adjacent to each other has high resistance by a pn junction. As a result, an influence on electric characteristics of the nonvolatile memory element due to a coverage defect of the first insulating layer 16 at the edge of the semiconductor layer 18, accumulation of charges from a manufacturing process at the edge of the semiconductor layer 18, or the like can be suppressed.

Figure 2A:
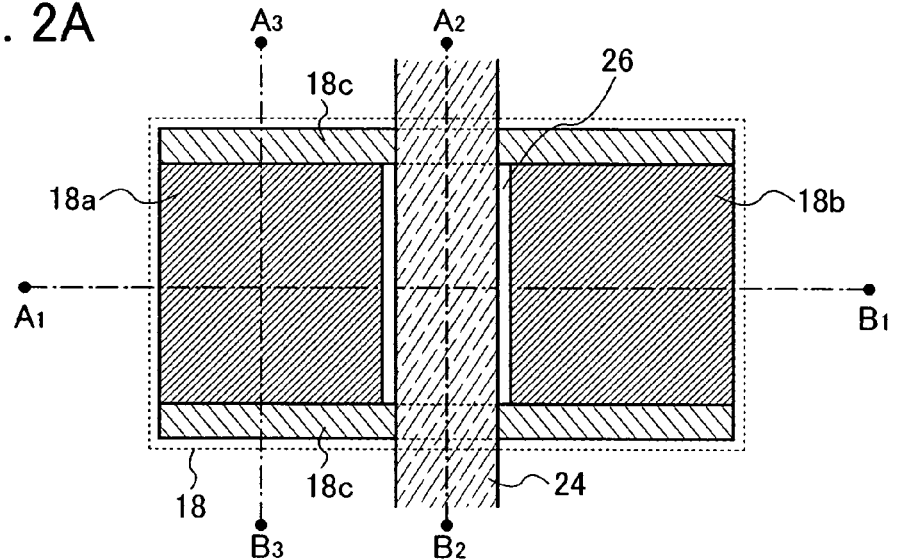
FIGS. 2A to 2D are views each showing a main structure of a nonvolatile semiconductor memory device of the present invention.
Figure 2B:
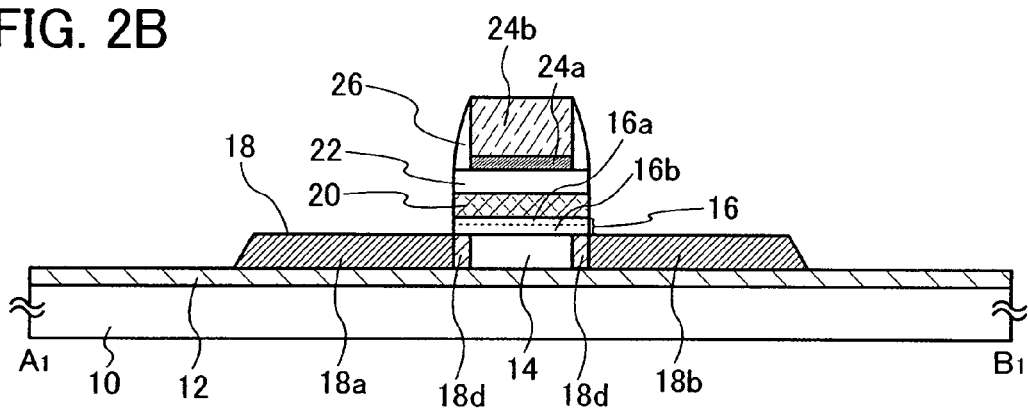
Figure 2C:
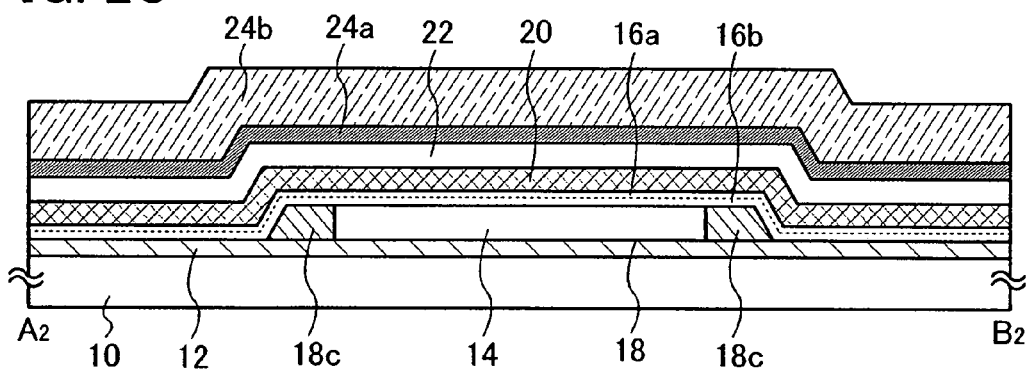
Figure 2D:
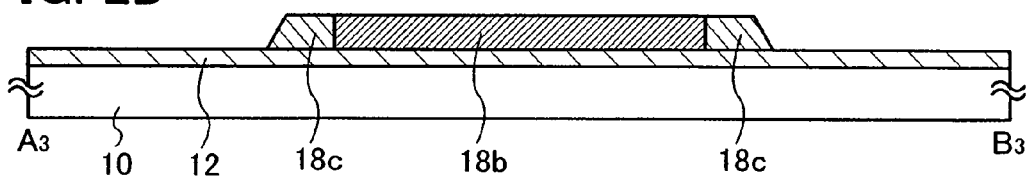

In the structure shown in FIGS. 1A to 1D, an insulating layer 26 (also referred to as a sidewall) is formed so as to be in contact with a side surface of the control gate electrode 24, and a third impurity region 18d may be formed below the insulating layer (see FIGS. 2A to 2D). The third impurity region 18d is provided between the channel formation region 14 and each of the first impurity regions 18a and 18b. In addition, a concentration of an impurity element contained in the third impurity region 18d is lower than that of an impurity element contained in the first impurity region 18a, and the third impurity region can serve as an LDD (Light Doped Drain) region in the nonvolatile memory element. It is to be noted that FIG. 2A shows a top view and FIGS. 2B, 2C, and 2D show schematic cross-sectional views taken along lines $A_1$-$B_1$, $A_2$-$B_2$, and $A_3$-$B_3$ of FIG. 2A, respectively.

It is to be noted that, in the cross-sectional view shown in FIG. 1B, the example is shown, in which the edge of the control gate electrode 24 is substantially in alignment with the edges of the first insulating layer 16, the charge accumulating layer 20, and the second insulating layer 22; however, the present invention is not limited thereto. As shown in FIGS. 3A to 3D, a structure may be employed, in which the first insulating layer 16, the charge accumulating layer 20, and the second insulating layer 22 are provided so as to cover the first impurity regions 18a and 18b of the semiconductor layer 18. In this case, the semiconductor layer 18 is not required to be exposed by etching in the manufacturing process, and thus, damage to the semiconductor layer 18 can be reduced.

Figure 3A:
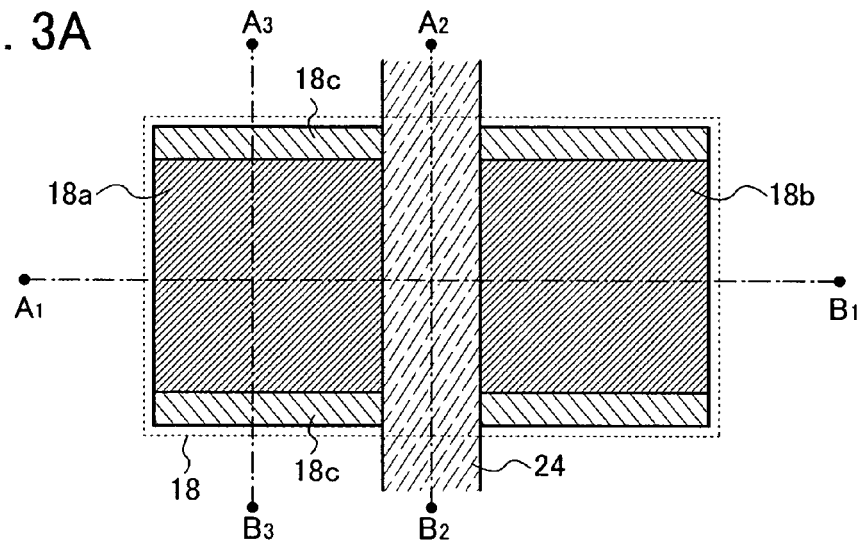
FIGS. 3A to 3D are views each showing a main structure of a nonvolatile semiconductor memory device of the present invention.
Figure 3B:
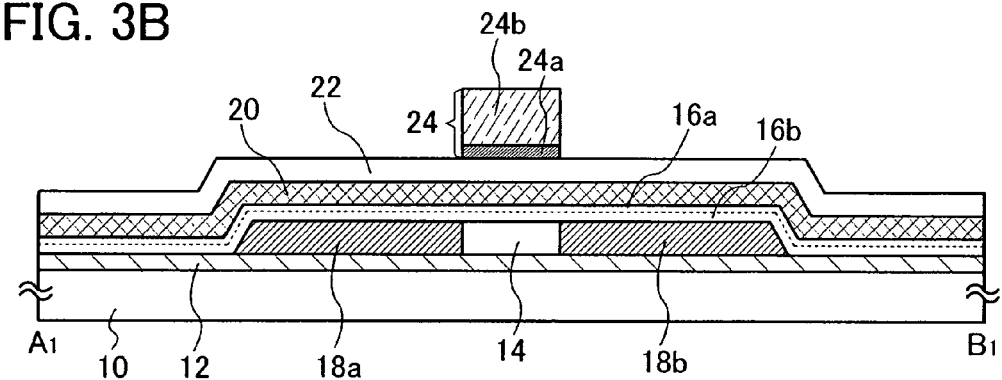
Figure 3C:
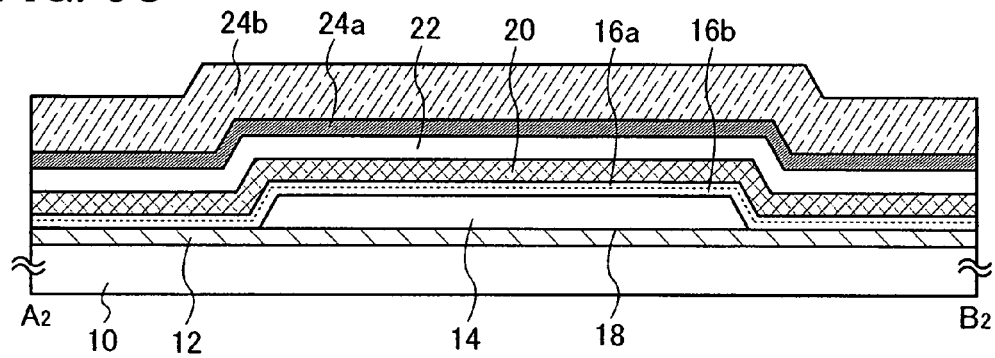
Figure 3D:
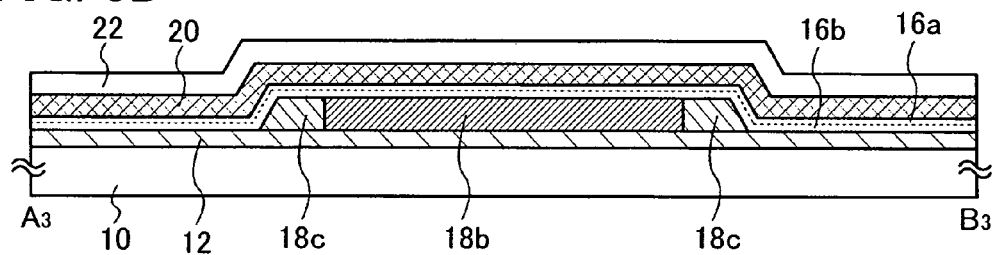

As shown in FIGS. 3A to 3D, a structure may be employed, in which the second impurity region 18c is not provided below the control gate electrode 24 but is provided in an edge portion of the semiconductor layer 18 near a region which overlaps with the control gate electrode 24. Even when the second impurity region 18c is provided in this manner, resistance in a portion where the first impurity region 18a and the second impurity region 18c are adjacent to each other is high by a pn junction; therefore, influence on the edge of the semiconductor layer 18 overlapping with the control gate electrode 24 due to movement of carriers can be reduced. It is to be noted that FIG. 3A shows a top view and FIGS. 3B, 3C and 3D show schematic cross-sectional views taken along lines $A_1$-$B_1$, $A_2$-$B_2$, and $A_3$-$B_3$ of FIG. 3A, respectively.

Figure 4A:
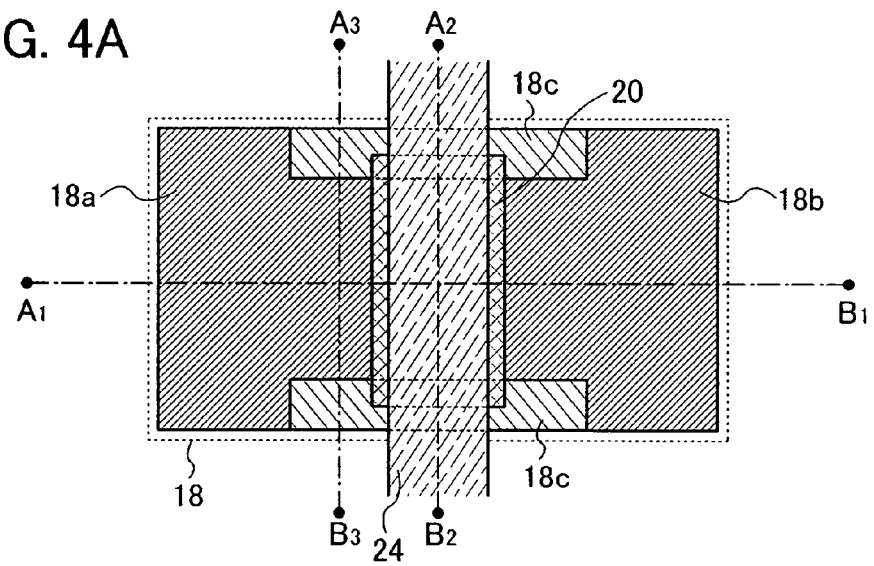
FIGS. 4A to 4D are views each showing a main structure of a nonvolatile semiconductor memory device of the present invention.

In order to prevent the charge accumulating layer 20 from being in contact with the semiconductor layer 18 at the edge of the semiconductor layer 18, a structure is considered, in which the charge accumulating layer 20 does not extend beyond the edge of the semiconductor layer 18. However, in this case, an edge of the charge accumulating layer 20 is formed to be uneven due to etching or the like in the manufacturing process; accordingly, characteristics of the nonvolatile memory element might be affected. Therefore, a structure may also be employed, in which the impurity regions 18c are selectively provided in the semiconductor layer 18 to overlap with each of pair of edges of the charge accumulating layer 20 (here, the edge of the charge accumulating layer 20 is substantially perpendicular to a flowing direction of carriers in a channel formation region (a direction connecting a source region and a drain region)) and an adjacent region thereof (see FIGS. 4A to 4D). It is to be noted that FIG. 4A shows a top view and FIGS. 4B, 4C, and 4D show schematic cross-sectional views taken along lines $A_1$-$B_1$, $A_2$-$B_2$, and $A_3$-$B_3$ of FIG. 4A, respectively.

Figure 4B:
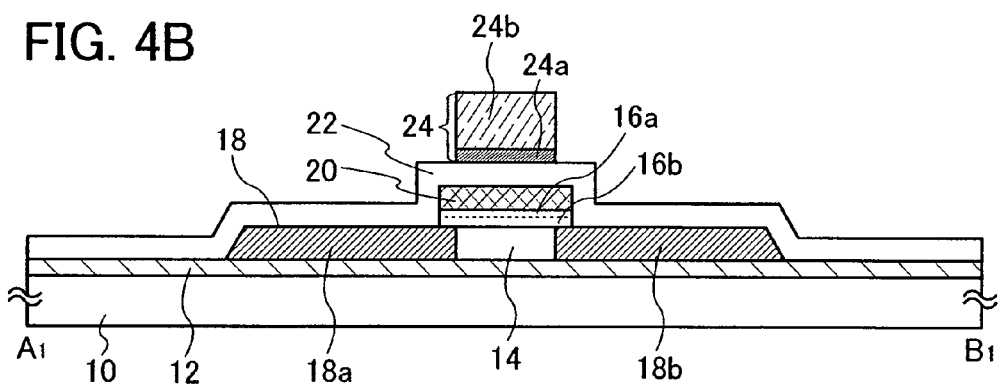
Figure 4C:
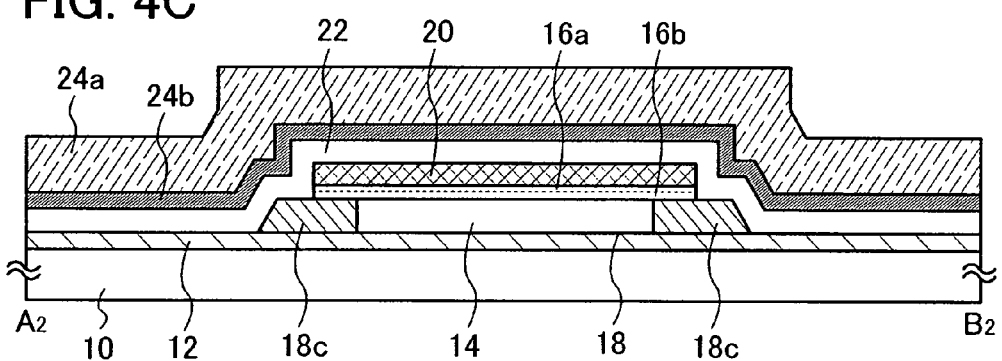
Figure 4D:
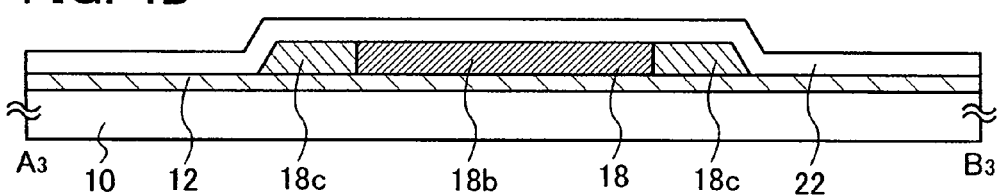
Figure 5A:
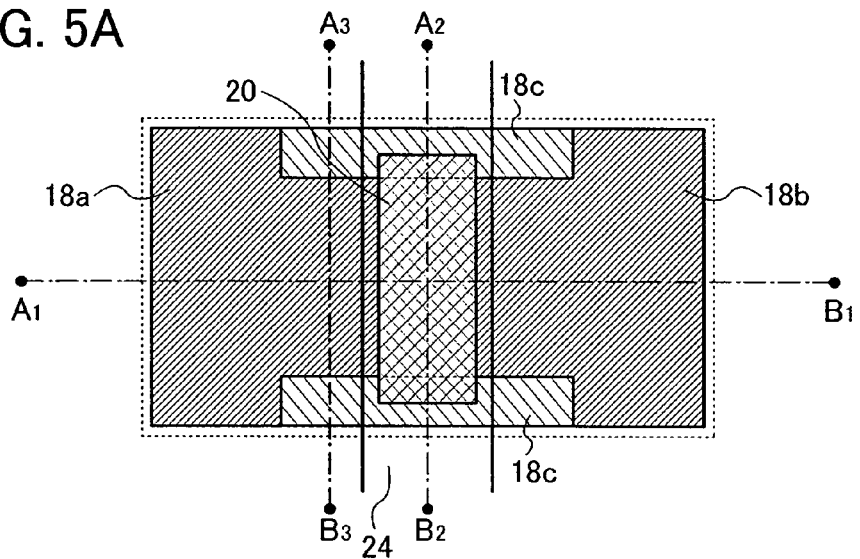
FIGS. 5A to 5D are views each showing a main structure of a nonvolatile semiconductor memory device of the present invention.
Figure 5B:
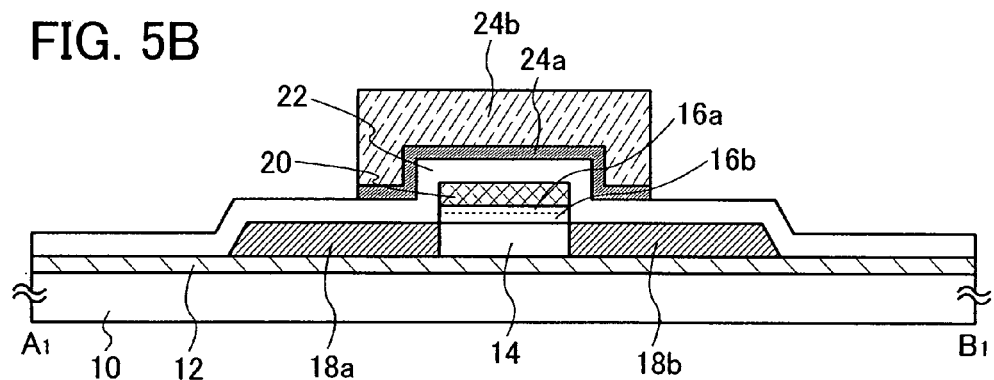
Figure 5C:
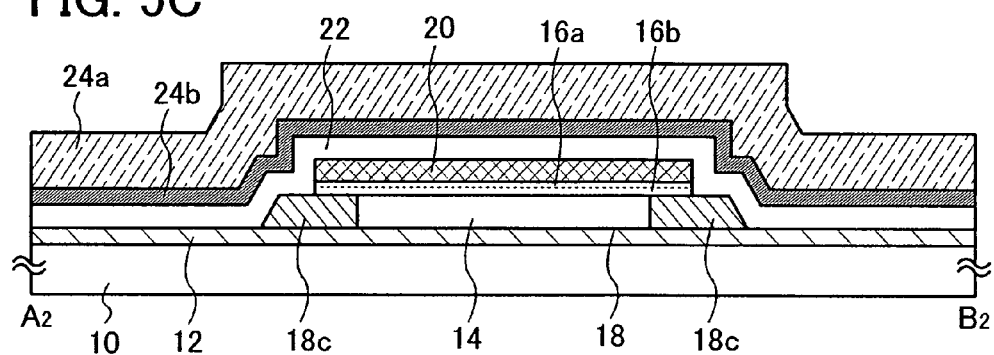
Figure 5D:
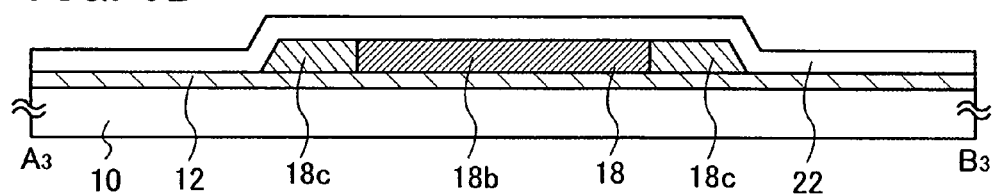

In the structure shown in FIGS. 4A to 4D, although the example in which the width of the charge accumulating layer 20 is larger than that of the control gate electrode 24 in the cross-sectional view taken along the line $A_1$-$B_1$ in FIG. 4B is shown, the charge accumulation layer 20 may be provided so that the width thereof is smaller than that of the control gate electrode 24 as shown in FIGS. 5A to 5D. It is to be noted that FIG. 5A shows a top view and FIGS. 5B, 5C, and 5D show schematic cross-sectional views taken along lines $A_1$-$B_1$, $A_2$-$B_2$, and $A_3$-$B_3$ of FIG. 5A, respectively.

Next, an operation of the nonvolatile memory element will be explained with reference to the drawings.

Electrons are injected into the charge accumulating layer 20 by a method utilizing hot carriers or a method utilizing F-N type tunnel current. In the case of utilizing hot carriers, voltage of positive polarity is applied to the control gate electrode 24 and high voltage is applied to a drain, whereby hot carriers are generated. Accordingly, hot carriers can be injected into the charge accumulating layer 20. In the case of utilizing F-N type tunnel current, voltage of positive polarity is applied to the control gate electrode 24, and electrons are injected into the charge accumulating layer 20 from the channel formation region 14 of the semiconductor layer 18 by F-N type tunnel current.

Figure 6A:
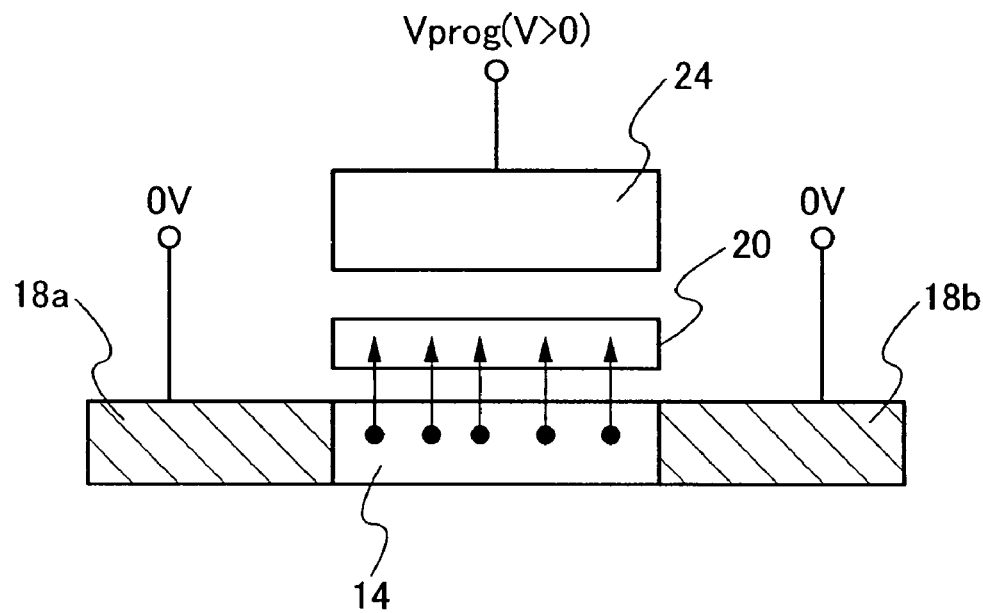
FIGS. 6A and 6B are views explaining a writing operation and a reading operation of a nonvolatile memory.

FIG. 6A shows applied voltage when electrons are injected into the charge accumulating layer 20 by F-N type tunnel current. High voltage of positive polarity (10 to 20 V) is applied to the control gate electrode 24 while 0 V is applied to the impurity regions 18a and 18b each serving as a source region or a drain region. Electrons in the channel formation region 14 of the semiconductor layer 18 are injected into the first insulating layer 16 by a high electric field, and F-N type tunnel current flows, whereby electrons are injected into and trapped in a defect formed in the charge accumulating layer 20.

While electrons are held in the charge accumulating layer 20, threshold voltage of a nonvolatile memory element shifts to a direction of positive polarity. This state can be regarded as a state in which data "0" has been written.

Figure 6B:
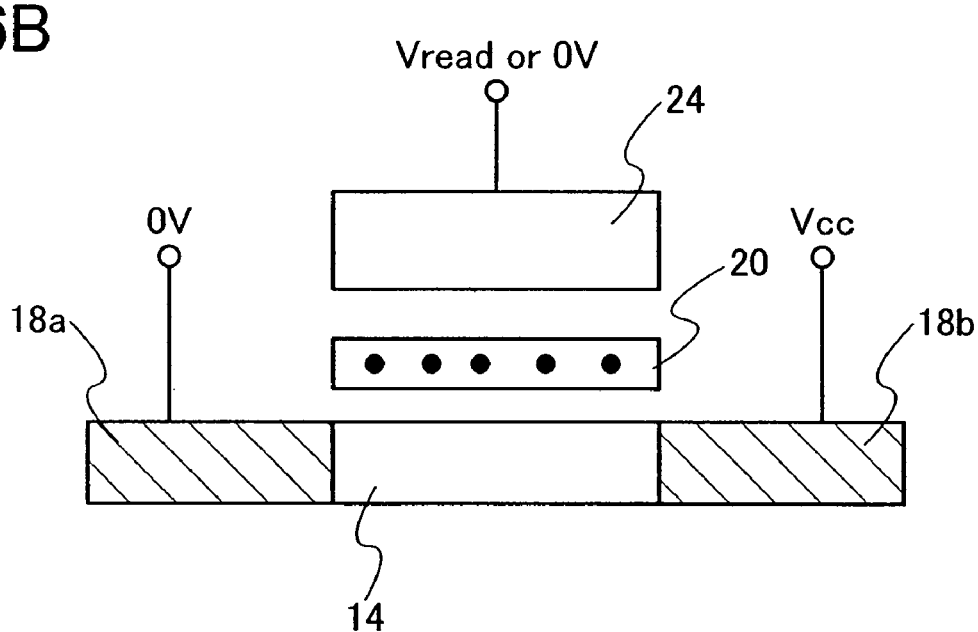

This data "0" can be detected by a sense circuit which detects that the transistor type nonvolatile memory element is not turned on when gate voltage to turn on the nonvolatile memory element in which the charge accumulating layer 20 does not hold charge is applied. Alternatively, as shown in FIG. 6B, the data "0" can be judged by whether the nonvolatile memory element is conductive when bias is applied between the impurity region 18a (a source region) and the impurity region 18b (a drain region), and 0 V is applied to the control gate electrode 24.

Figure 7A:
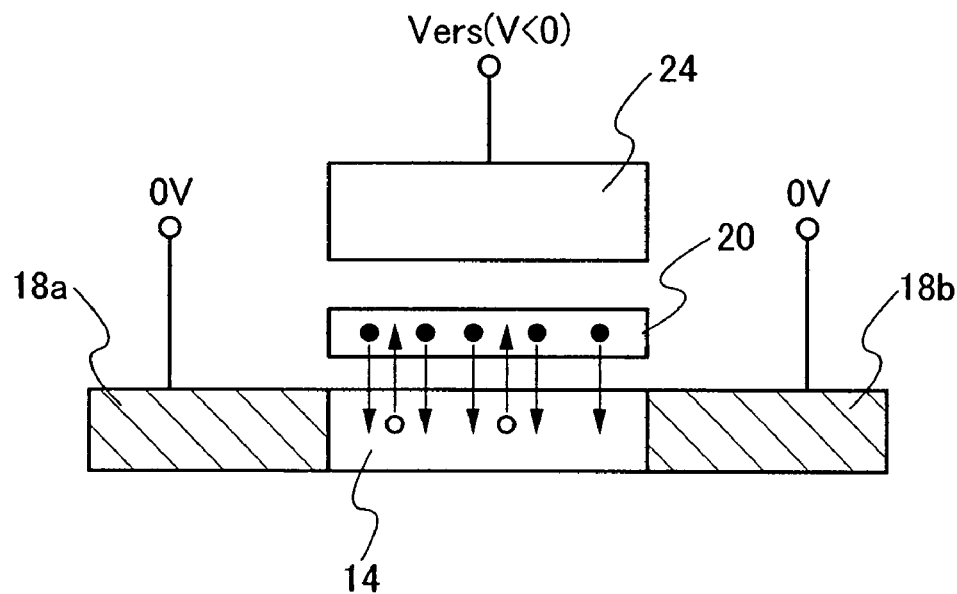
FIGS. 7A and 7B are views each explaining an erasing operation of a nonvolatile memory.
Figure 7B:
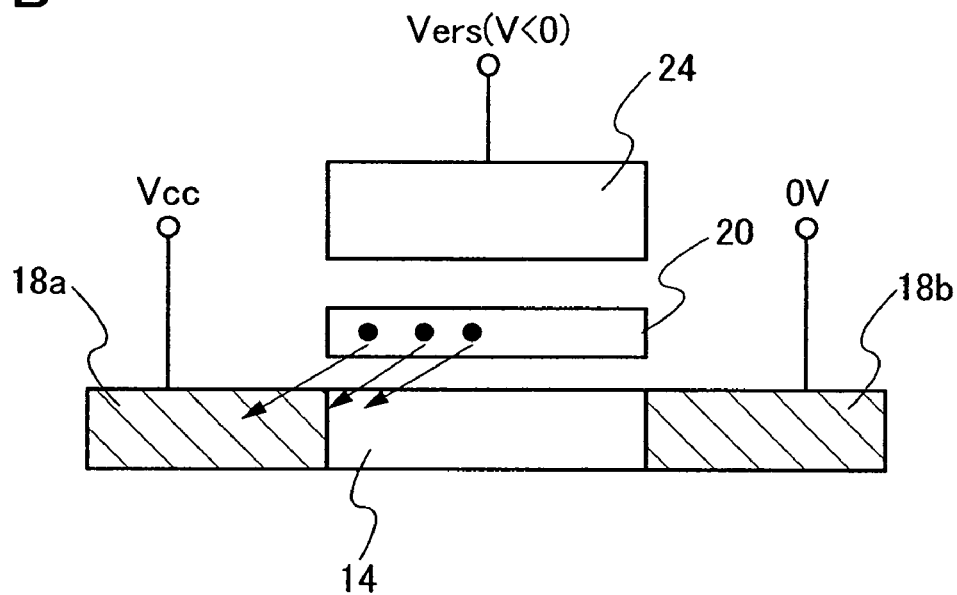

FIG. 7A shows a state in which charge is discharged from the charge accumulating layer 20 and data is erased from the nonvolatile memory element. In this case, erasing is performed by a method in which negative bias is applied to a control gate electrode 24 and F-N type tunnel current is generated between the channel formation region 14 of the semiconductor layer 18 and the charge accumulating layer 20. Alternatively, as shown in FIG. 7B, bias voltage of negative polarity is applied to the control gate electrode 24 and high voltage of positive polarity is applied to the impurity region 18a, whereby F-N tunnel current is generated and electrons may be extracted to the impurity region 18a side.

Figure 8:
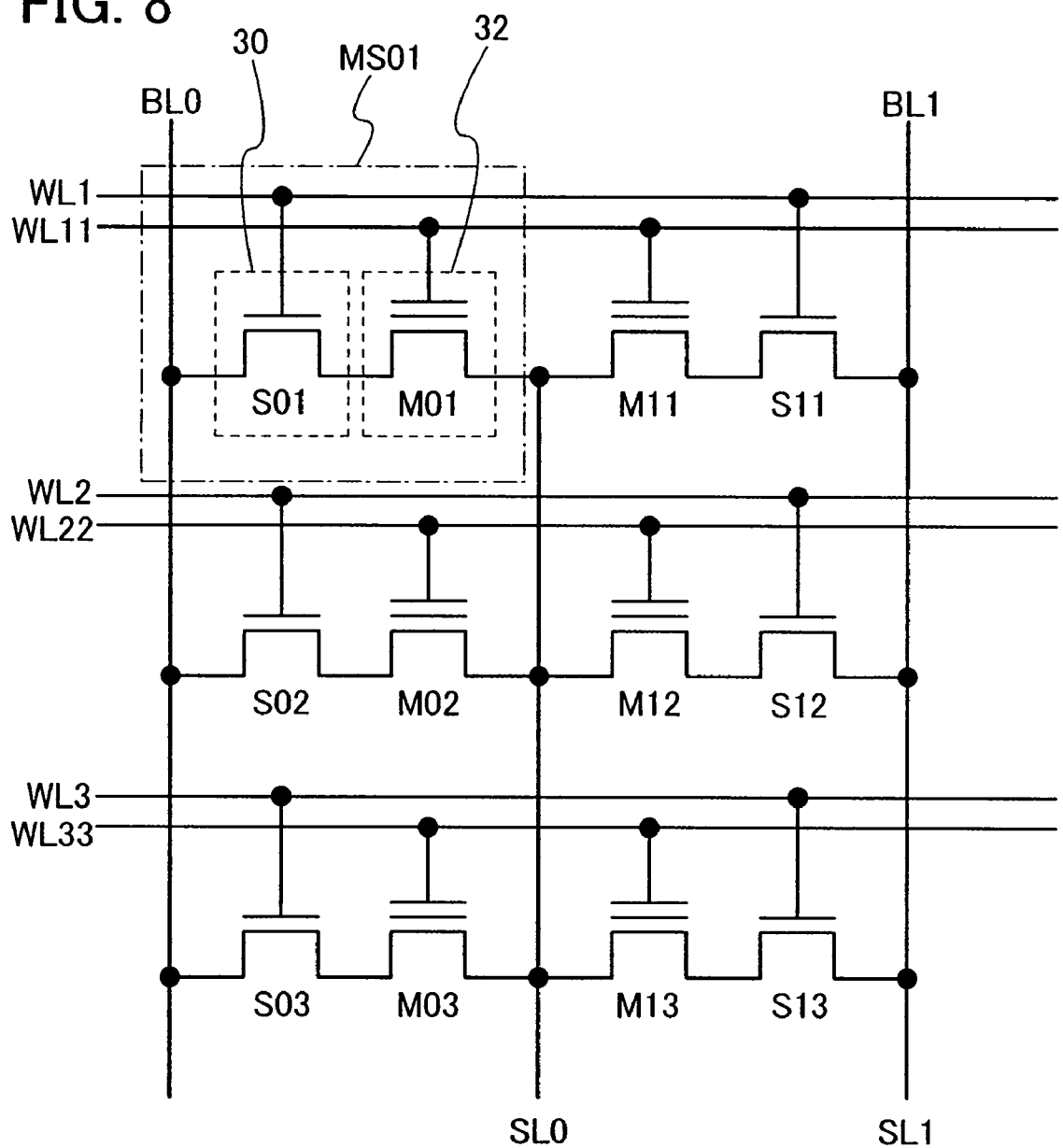
FIG. 8 is a view showing an example of an equivalent circuit of a nonvolatile memory cell array.

Nonvolatile semiconductor memory devices of various modes can be obtained with the use of such a nonvolatile memory element. FIG. 8 shows an example of an equivalent circuit of a nonvolatile memory cell array. A memory cell MS01 for storing 1 bit of information includes a selection transistor S01 and a nonvolatile memory element M01. The selection transistor S01 is inserted between a bit line BL0 and the nonvolatile memory element M01 in series, and a gate is connected to a word line WL1. A gate of the nonvolatile memory element M01 is connected to a word line WL11. Data is written in the nonvolatile memory element M01 by a method in which H level voltage is applied to the word line WL1 and the bit line BL0 and L level voltage is applied to BL1, and high voltage is applied to the word line WL11, whereby charge is accumulated in the charge accumulating layer as described above. In order to erase data, H level voltage is applied to the word line WL1 and the bit line BL0 and high voltage of negative polarity may be applied to the word line WL11.

In this memory cell MS01, the selection transistor S01 and the nonvolatile memory element M01 are formed of a semiconductor layer 30 and a semiconductor layer 32, respectively, which are each separated into an island-shape and formed over an insulating surface, whereby interference with other selection transistors or nonvolatile memory elements can be prevented without particularly providing an element separation region. In addition, both the selection transistor S01 and the nonvolatile memory element M01 in the memory cell MS01 are n-type; therefore, a wiring for connecting the two elements to each other can be omitted when both the selection transistor S01 and the nonvolatile memory element M01 are formed of one island-shaped semiconductor layer.

Figure 9:
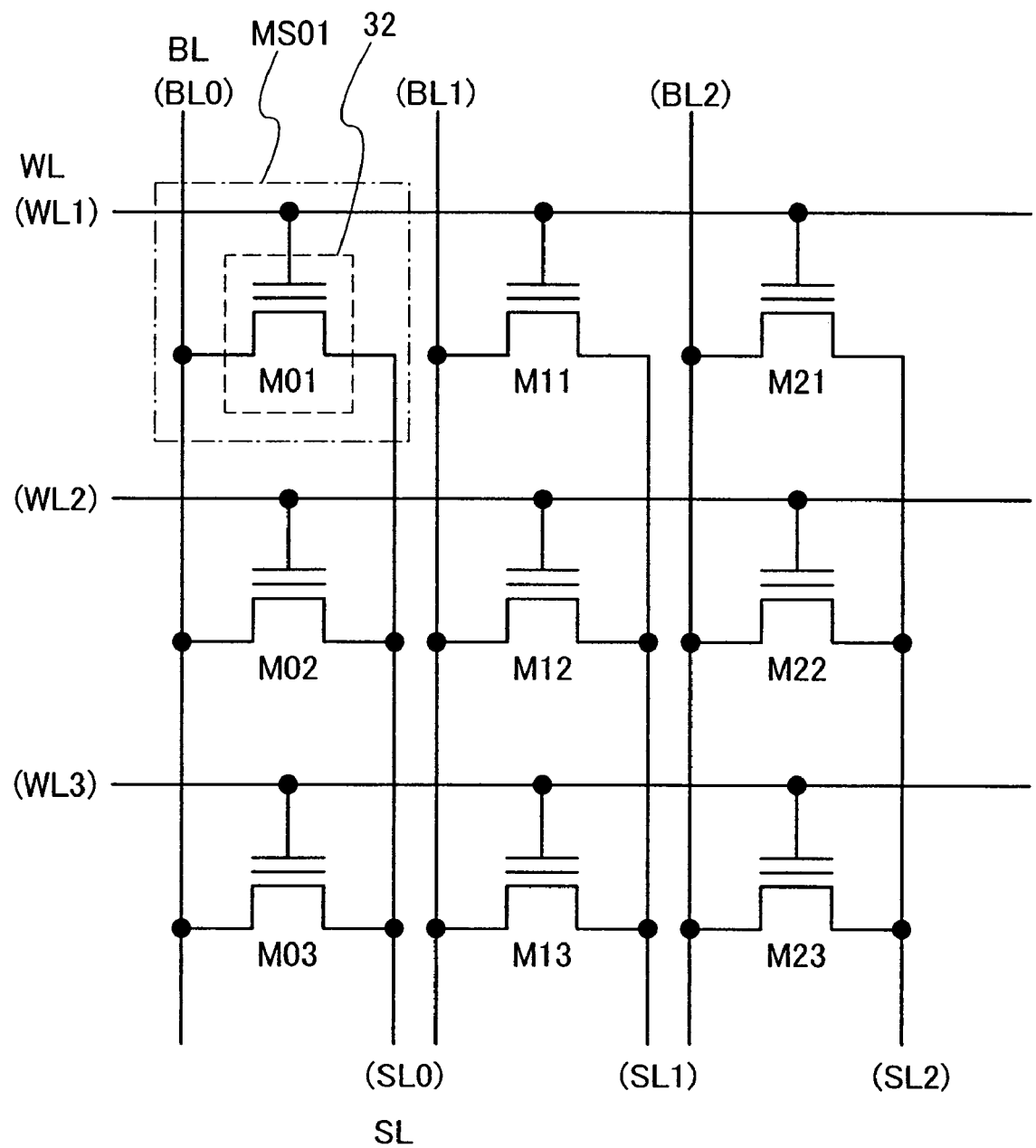
FIG. 9 is a view showing an example of an equivalent circuit of a NOR type nonvolatile memory cell array.

FIG. 9 shows a NOR type equivalent circuit in which a nonvolatile memory element is directly connected to a bit line. In this memory cell array, a word line WL and a bit line BL are provided to be intersected with each other, and a nonvolatile memory element is disposed at each intersection portion. In the NOR type, a drain of each nonvolatile memory element is connected to the bit line BL. Sources of the nonvolatile memory elements are connected to a source line SL.

Also in this case, in this memory cell MS01, a nonvolatile memory element M01 is formed of a semiconductor layer 32 which is separated into an island-shape and formed over an insulating surface, whereby interference with other nonvolatile memory elements can be prevented without particularly providing an element separation region. In addition, when a plurality of nonvolatile memory elements (for example, M01 to M23 shown in FIG. 9) is treated as one block and these nonvolatile memory elements are formed of one island-shaped semiconductor layer, whereby erasing operation of one block can be performed at the same time.

The operation of the NOR type will be described below, for example. In order to write data, 0 V is applied to a source line SL, high voltage is given to a word line WL selected for writing data, and potentials corresponding to data "0" and data "1" are given to a bit line BL. For example, potentials of H level and L level for the data "0" and the data "1", respectively, are given to the bi line BL. In a nonvolatile memory element to which H level potential has been given, in order to write data "0", hot electrons are generated near a drain and the hot electrons are injected into the charge accumulating layer. In the case of writing the data "1", such injection of electrons is not performed.

In a memory cell to which data "0" has been given, hot electrons are generated near the drain by a high lateral electric field between the drain and the source, and the hot electrons are injected into the charge accumulating layer. A state in which threshold voltage is high by the injection of electrons into the charge accumulating layer is "0". In the case where data "1" has been given, hot electrons are not generated and a state in which electrons are not injected into the charge accumulating layer and threshold voltage is low, that is, an erasing state, is held.

When the data is erased, voltage of positive polarity of approximately 10 V is applied to the source line SL and the bit line BL is made to be in a floating state. Then, high voltage of negative polarity is applied to the word line (high voltage of negative polarity is applied to a control gate), so that electrons are extracted from the charge accumulating layer. Accordingly, an erasing state of data "1" is obtained.

Data is read in the following manner: 0 V is applied to the source line SL and approximately 0.8 V is applied to the bit line BL; reading voltage set as an intermediate value of threshold voltage of the data "0" and the data "1" is given to a selected word line WL; and a sense amplifier connected to the bit line BL judges whether current flows in the nonvolatile memory element.

Figure 10:
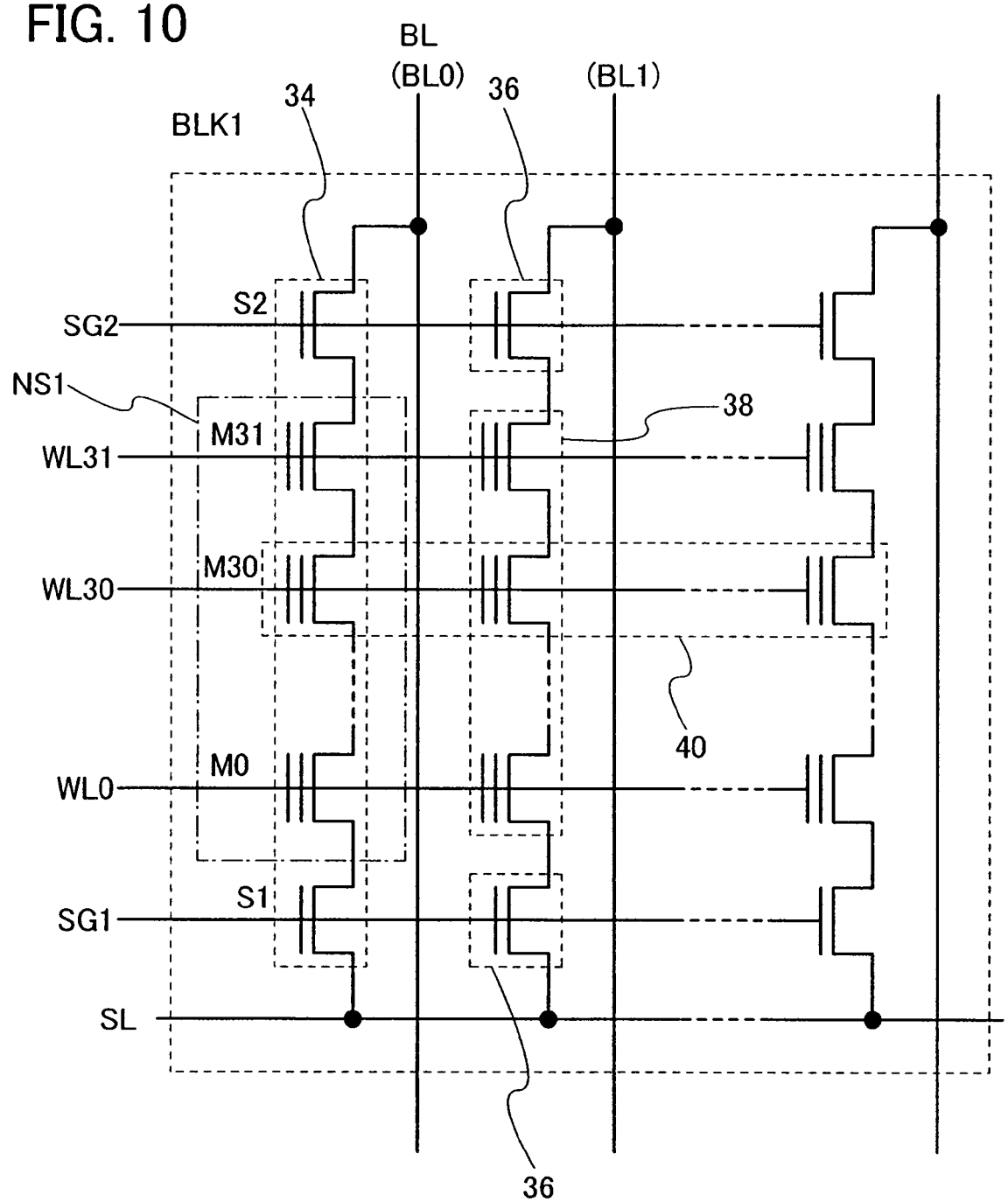
FIG. 10 is a view showing an example of an equivalent circuit of a NAND type nonvolatile memory cell array.

FIG. 10 shows an equivalent circuit of a NAND type memory cell array. A NAND cell NS1 in which a plurality of nonvolatile memory elements are connected in series is connected to a bit line BL. A block BLK includes a plurality of NAND cells. A block BLK1 shown in FIG. 10 has 32 word lines (word lines WL0 to WL31). To nonvolatile memory elements arranged in the same row in the block BLK1, a word line corresponding to this row is commonly connected.

In this case, since selection transistors S1 and S2 and nonvolatile memory elements M0 to M31 are connected in series, these may be formed of a semiconductor layer 34 as one group. Accordingly, a wiring for connecting the nonvolatile memory elements can be omitted, and thus, integration can be achieved. In addition, adjacent NAND cells can be separated easily. Alternatively, a semiconductor layer 36 of the selection transistors S1 and S2 and a semiconductor layer 38 of the NAND cell may be formed separately. When an erasing operation in which charge is extracted from charge accumulating layers of the nonvolatile memory elements M0 to M31 is performed, the erasing operation of one NAND cell can be performed at the same time. Alternatively, nonvolatile memory elements commonly connected to one word line (for example, the row of M30) may be formed of one semiconductor layer 40.

Writing operation is carried out after a NAND cell NS1 is made in an erasing state, that is, threshold voltage of each nonvolatile memory element of the NAND cell NS1 is made in a state of voltage of negative polarity. The writing is performed sequentially from a memory element M0 at a source line SL side. An example of writing to the memory element M0 is explained below.

Figure 11A:
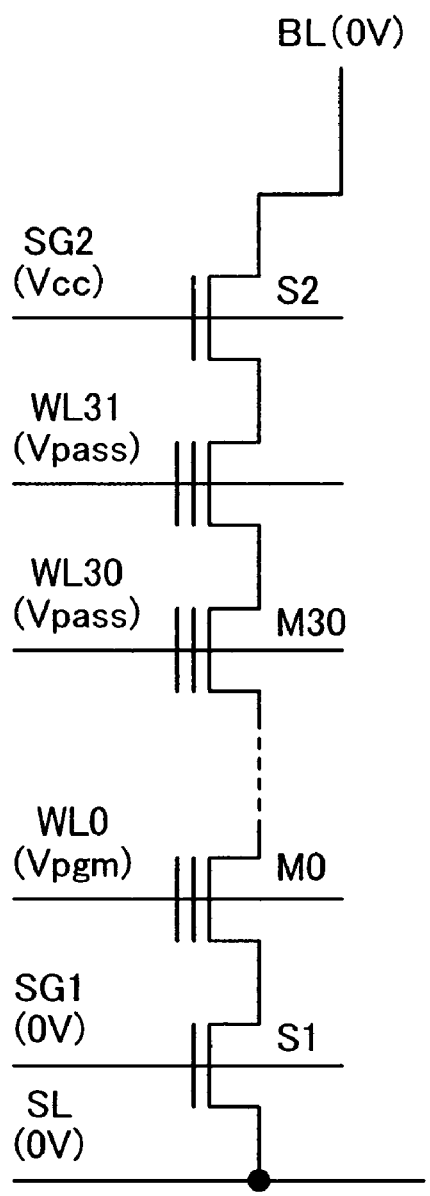
FIGS. 11A and 11B are views each explaining a writing operation of a NAND type nonvolatile memory.

As shown in FIG. 11A, in the case where "0" is written, for example, Vcc (power supply voltage) is applied to a selection gate line SG2 to turn a selection transistor S2 on and 0 V (ground voltage) is applied to a bit line BL0. 0 V is applied to a selection gate line SG1 to turn a selection transistor S1 off. Next, high voltage Vpgm (approximately 20 V) is applied to a word line WL0 of a memory cell M0 and intermediate voltage Vpass (approximately 10 V) is applied to the other word lines. Since the voltage of the bit line BL is 0 V, potential of a channel formation region of the selected memory cell M0 becomes 0 V. A potential difference between the word line WL0 and the channel formation region is large; therefore, electrons are injected into a charge accumulating layer of the memory cell M0 by F-N tunnel current as described above. Accordingly, the memory cell M0 is in a state where threshold voltage is positive polarity (a state in which "0" has been written).

Figure 11B:
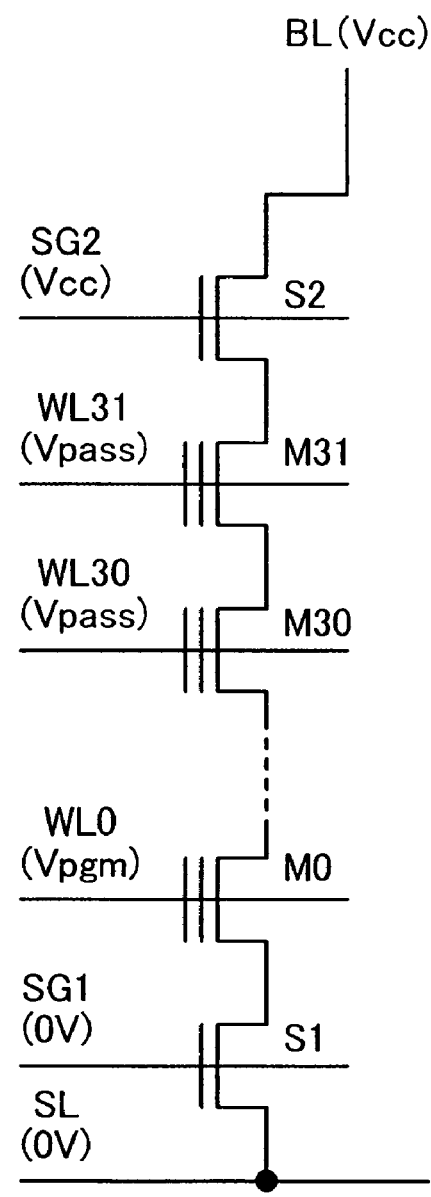

On the other hand, in the case where "1" is written, as shown in FIG. 11B, Vcc (power supply voltage) is applied to a bit line BL. Since voltage of a selection gate line SG2 is Vcc, in the case of Vcc–Vth (Vth is threshold voltage of a selection transistor S2), the selection transistor S2 is cut off. Therefore, a channel formation region of a memory cell M0 is in a floating state. Next, when high voltage Vpgm (20 V) is applied to a word line WL0 and intermediate voltage Vpass (10 V) is applied to the other word lines, voltage of a channel formation region rises from Vcc–Vth and becomes, for example, approximately 8 V, due to capacitance coupling of each word line and the channel formation region. Since the voltage of the channel formation region is boosted, a potential difference between the word line WL0 and the channel formation region is small, differently from the case where "0" is written. Therefore, electron injection into a charge accumulating layer of the memory cell M0 by F-N tunnel current does not occur. Accordingly, the memory cell M0 is kept in a state where threshold voltage is negative polarity (a state in which "1" has been written).

In the case where an erasing operation is performed, as shown in FIG. 12A, high voltage of negative polarity (Vers) is applied to all word lines in a selected block. A bit line BL and a source line SL are in a floating state. Accordingly, in all memory cells in the block, electrons in a charge accumulating layer are discharged to a semiconductor layer by tunnel current. As a result, threshold voltage of these memory cells shifts to a direction of negative polarity.

Figure 13:
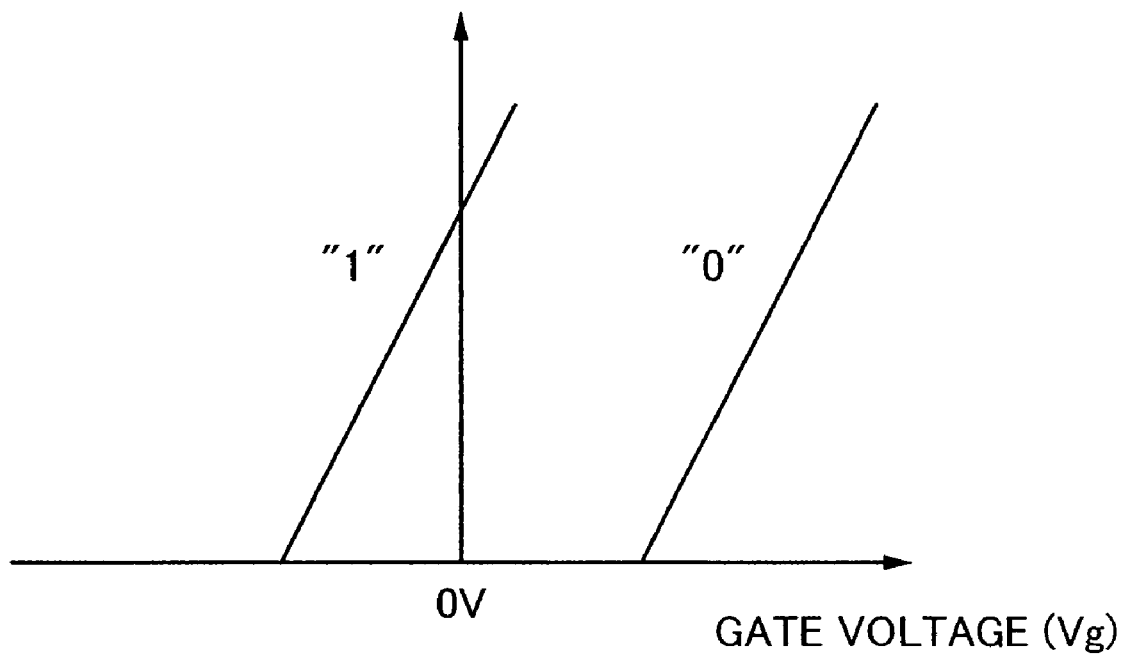
FIG. 13 is a view showing changes in threshold voltage of a nonvolatile memory in each of a case where charge is accumulated and a case where the charge is erased.

In reading operation shown in FIG. 12B, voltage Vr (such as 0 V) is applied to a word line WL0 of a memory cell M0 selected for reading and intermediate voltage Vread for reading which is slightly higher than power supply voltage is applied to word lines WL1 to WL31 and selection gate lines SG1 and SG2 which are not selected for reading. That is, as shown in FIG. 13, a memory element other than the selected memory element operates as a transfer transistor. The transfer transistor detects whether current flows through the memory cell M0 selected for reading. In other words, in the case where data stored in the memory cell M0 is "0", the memory cell M0 is turned off; accordingly, a bit line BL does not discharge electricity. On the other hand, in the case where data stored in the memory cell M0 is "1", the memory cell M0 is turned on; accordingly, the bit line BL discharges electricity.

Figure 14:
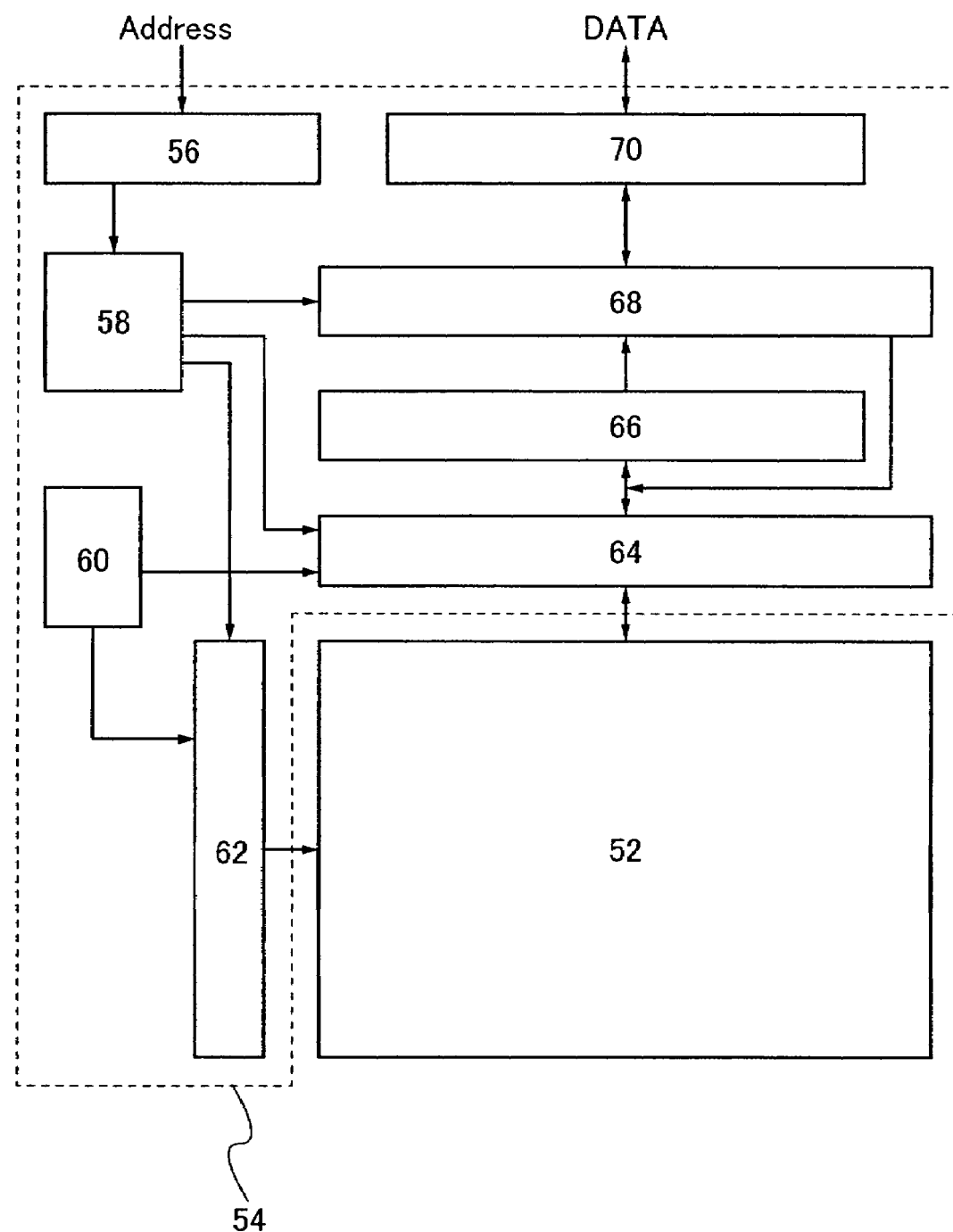
FIG. 14 is a view showing an example of a circuit block diagram of a nonvolatile semiconductor memory device.

FIG. 14 shows an example of a circuit block diagram of a nonvolatile semiconductor memory device. The nonvolatile semiconductor memory device includes a memory cell array 52 and a peripheral circuit 54 which are formed over the same substrate. The memory cell array 52 has a structure as shown in FIGS. 8, 9, and 10. A structure of the peripheral circuit 54 is explained below.

A row decoder 62 for selecting a word line and a column decoder 64 for selecting a bit line are provided around the memory cell array 52. An address is sent to a control circuit 58 through an address buffer 56, and an inner row address signal and an inner column address signal are transferred to the row decoder 62 and the column decoder 64, respectively.

Potential obtained by boosting power supply potential is used for writing and erasing of data. Therefore, a booster circuit 60 controlled by the control circuit 58 according to an operation mode is provided. Output of the booster circuit 60 is supplied to a word line WL or a bit line BL through the row decoder 62 and the column decoder 64. Data output from the column decoder 64 is input to a sense amplifier 66. Data read by the sense amplifier 66 is held in a data buffer 68. Data held in the data buffer is accessed randomly by control by the control circuit 58, and is output through a data input/output buffer 70. Writing data is held in the data buffer 68 once through the data input/output buffer 70 and is transferred to the column decoder 64 by control by the control circuit 58.

As described above, in the nonvolatile semiconductor memory device, potential that is different from the power supply potential is required to be used in the memory cell array 52. Therefore, it is desirable that at least the memory cell array 52 and the peripheral circuit 54 be electrically insulated and isolated. In this case, as in an embodiment hereinafter explained, when a nonvolatile memory element and a transistor of a peripheral circuit are formed using a semiconductor layer formed over an insulating surface, insulation and isolation can be easily performed. In addition, when an impurity region having different conductivity type from that of a source region or drain region is provided in an edge portion of a semiconductor layer so as to be adjacent to a channel formation region, problems due to a coverage defect of an insulating film at the edge of the semiconductor layer can be prevented. Accordingly, a nonvolatile semiconductor memory device with no malfunction and low power consumption can be obtained.

Hereinafter, the nonvolatile semiconductor memory device of the present invention will be explained in detail in embodiments. In structures of the present invention explained below, the same reference numeral is used in common to denote the same component among different drawings, and repeated explanation thereof may be omitted.

Embodiment 1

In this embodiment, an example of a nonvolatile semiconductor memory device will be explained with reference to the drawings. It is to be noted that, in this embodiment, a case will be shown, where a nonvolatile memory element included in a memory portion and a transistor included in a logic portion for performing control or the like of the memory portion, which is provided over the same substrate as the memory portion are formed at the same time in the nonvolatile semiconductor memory device.

First, a view of a memory portion in the nonvolatile semiconductor memory device is shown in FIG. 8.

In the memory portion described in this embodiment, a plurality of memory cells each having a control transistor S and a nonvolatile memory element M is provided. In FIG. 8, one memory cell is formed by a control transistor S01 and a nonvolatile memory element M01. In a similar manner, a memory cell is formed by a control transistor S01 and a nonvolatile memory element M02; a memory cell is formed by a control transistor S03 and a nonvolatile memory element M03; a memory cell is formed by a control transistor S11 and a nonvolatile memory element M11; a memory cell is formed by a control transistor S12 and a nonvolatile memory element M12; and a memory cell is formed by a control transistor S13 and a nonvolatile memory element M13.

A gate electrode of the control transistor S01 is connected to a word line WL1, one of a source and a drain is connected to a bit line BL0, and the other is connected to a source or drain of the nonvolatile memory element M01. A gate electrode of the nonvolatile memory element M01 is connected to a word line WL11, one of a source and a drain is connected to the source or drain of the control transistor S01, and the other is connected to a source line SL.

Since the control transistor provided in the memory portion has a high driving voltage in comparison with the transistor provided in the logic portion, it is preferable that gate insulating layers or the like of the transistor in the memory portion and the transistor in the logic portion be formed to have different thicknesses. For example, in the case where a driving voltage is required to be low and variations in threshold voltage are required to be reduced, it is preferable to provide a thin film transistor with a thin gate insulating layer, and in the case where a driving voltage is required to be high and withstand voltage of a gate insulating layer is required, it is preferable to provide a thin film transistor with a thick gate insulating layer.

Therefore, in this embodiment, a case where a thin insulating layer is formed in the transistor of the logic portion in which driving voltage is required to be low and variations in threshold voltage are required to be reduced, and a case where a thick insulating layer is formed in the transistor of the memory portion in which driving voltage is required to be high and withstand voltage of the gate insulating layer is required are explained below with reference to the drawings. It is to be noted that FIGS. 16, 17, and 18 each show a top view, and FIGS. 19A to 19C, FIGS. 20A to 20C, FIGS. 21A to 21C, and FIGS. 22A and 22B each show cross-sectional views taken along lines A-B, C-D, E-F, and G-H of FIGS. 16, 17, and 18. In addition, portions taken along lines A-B and C-D show a thin film transistor provided in a logic portion, a portion taken along a line E-F shows a nonvolatile memory element provided in a memory portion, and a portion taken along a line G-H shows a thin film transistor provided in a memory portion. In this embodiment, a case where the thin film transistor provided in the portion taken along the line A-B is an p-channel, a case where the thin film transistors provided in the portions taken along lines C-D and G-H are n-channels, and a case where accumulation of charge of the nonvolatile memory element provided in the portion taken along the line G-H is performed by electrons are explained; however, the nonvolatile semiconductor memory device of the present invention is not limited thereto.

Figure 19A:
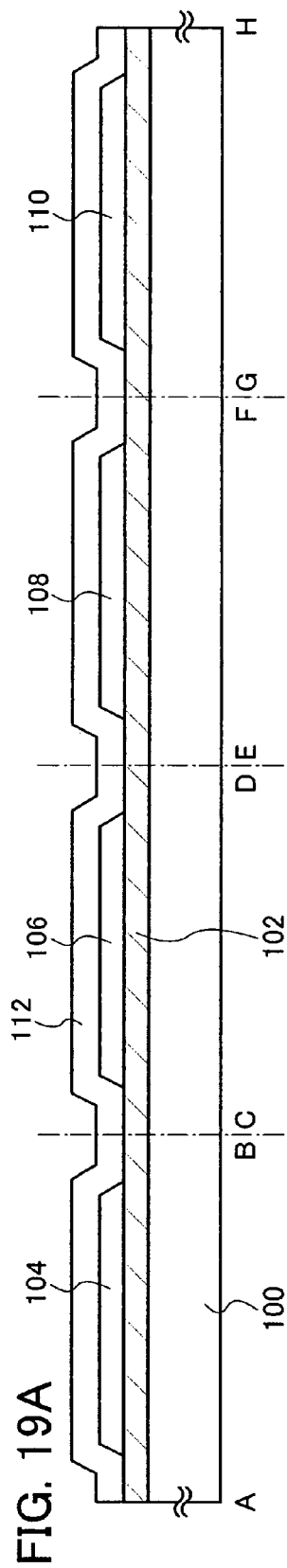
FIGS. 19A to 19C are views each showing an example of a manufacturing method of a nonvolatile semiconductor memory device of the present invention.
Figure 19B:
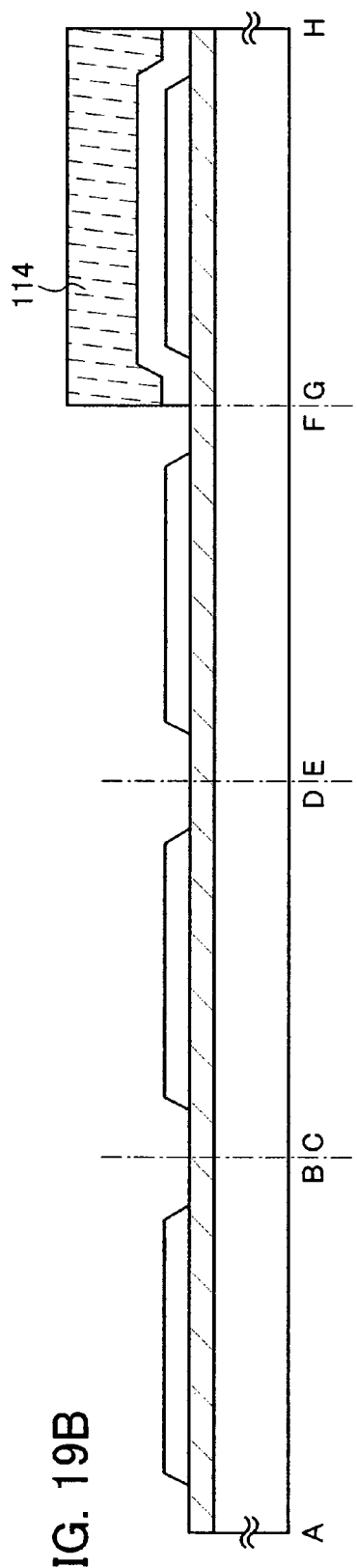

First, island-shaped semiconductor layers 104, 106, 108, and 110 are formed over a substrate 100 with an insulating layer 102 interposed therebetween, and a first insulating layer 112 is formed so as to cover the island-shaped semiconductor layers 104, 106, 108, and 110 (see FIG. 19A).

The island-shaped semiconductor layers 104, 106, 108, and 110 can be provided by a method in which an amorphous semiconductor layer is formed using a material containing silicon (Si) as its main component, or the like over the insulating layer 102 which is formed over the substrate 100 in advance, by a sputtering method, an LPCVD method, a plasma CVD method, or the like, and the amorphous semiconductor layer is crystallized, and then, is selectively etched. Further, crystallization of the amorphous semiconductor layer can be performed by a laser crystallization method, a thermal crystallization method using RTA or an annealing furnace, a thermal crystallization method using a metal element promoting crystallization, a method in which these methods are combined, or the like.

In the case of performing crystallization or recrystallization of the semiconductor layer by laser light irradiation, an LD-pumped continuous wave (CW) laser (for example, YVO$_4$ with a second harmonic (wavelength of 532 nm)) can be used as a laser light source. Although the wavelength is not specifically limited to the second harmonic, the second harmonic is superior to harmonics higher than that in terms of energy efficiency. When a semiconductor layer is irradiated with a CW laser, energy can be continuously given to the semiconductor layer. Therefore, once the semiconductor layer is made into a molten state, the molten state can be retained. Furthermore, by scanning the semiconductor layer with the CW laser, a solid-liquid interface of the semiconductor layer can be moved, and crystal grains which are long in one direction can be formed along the moving direction. The reason for using a solid-state laser is to obtain more stable output than the case of using a gas laser or the like, and thus more stable treatment can be expected. It is to be noted that the laser light source is not limited to the CW laser and a pulsed laser with a repetition rate of 10 MHz or higher can be used as well. When a pulsed laser with a high repetition rate is used, a semiconductor layer can be constantly retained in the molten state on the condition that a pulse interval of laser is shorter than a time interval from the point when a semiconductor layer is melted until the point when the semiconductor layer becomes solidified. Thus, the semiconductor layer with crystal grains which are long in one direction can be formed by move of the solid-liquid interface. It is also possible to employ other types of CW lasers or pulsed lasers with a repetition rate of 10 MHz or higher. For example, gas lasers such as an Ar laser, a Kr laser, and a CO$_2$ laser can be used, or solid-state lasers such as a YAG laser, a YLF laser; a YAlO$_3$ laser, a GdVO$_4$ laser, a KGW laser, a KYW laser, an alexandrite laser, a Ti:sapphire laser, a Y$_2$O$_3$ laser, and a YVO$_4$ laser can be used. In addition, ceramic lasers such as a YAG laser, a Y$_2$O$_3$ laser, a GdVO$_4$ laser, and a YVO$_4$ laser can also be used. As a metal vapor laser, a helium-cadmium laser and the like can be given as examples. Laser light is preferably emitted from a laser oscillator with TEM$_{00}$ (single transverse mode), which can increase the energy uniformity of a linear beam spot that is obtained on the surface to be irradiated. Besides, a pulsed excimer laser can be used.

The substrate 100 is selected from a glass substrate, a quartz substrate, a metal substrate (such as a stainless steel substrate), a ceramic substrate, and a semiconductor substrate such as a Si substrate. Besides, the substrate 100 may be a plastic substrate made of polyethylene terephthalate (PET), polyethylene naphthalate (PEN), polyethersulfone (PES), or a substrate made of acrylic or the like.

The insulating layer 102 is formed using an insulating material such as silicon oxide, silicon nitride, silicon oxynitride (SiOxNy) (x>y), or silicon nitride oxide (SiNxOy) (x>y) by a CVD method, a sputtering method, or the like. For example, in the case where the insulating layer 102 may be formed to have a two-layered structure, a silicon nitride oxide film may be formed as a first insulating layer and a silicon oxynitride film is formed as a second insulating layer. Alternatively, a silicon nitride film may be formed as the first insulating layer and a silicon oxide film may be formed as the second insulating layer. In this manner, when the insulating layer 102 serving as a blocking layer is formed, an element to be formed thereover can be prevented from being adversely affected by an alkali metal such as Na or an alkaline earth metal from the substrate 100. It is to be noted that, in the case where the substrate 100 is made of quartz, the insulating layer 102 may be omitted.

The first insulating layer 112 is formed of a single layer or a stacked layer of using insulating material such as silicon oxide, silicon nitride, silicon oxynitride (SiOxNy) (x>y), or silicon nitride oxide (SiNxOy) (x>y) by a CVD method, a sputtering method, or the like. For example, in the case where the first insulating layer 112 is formed to have a single-layer structure, a silicon oxynitride film or a silicon nitride oxide film is formed with a thickness of 5 to 50 nm by a CVD method. In addition, in the case where the first insulating layer 112 is formed to have a three-layered structure, a silicon oxynitride film is formed as a first insulating layer, a silicon nitride film is formed as a second insulating layer, and a silicon oxynitride film is formed as a third insulating layer.

It is to be noted that the first insulating layer 112 formed over the semiconductor layer 110 serves as a gate insulating layer in a thin film transistor to be completed later.

Next, the first insulating layer 112 formed over the semiconductor layer 104, 106, and 108 is selectively removed to expose a surface of each of the semiconductor layers 104, 106, and 108. Here, the semiconductor layer 110 provided in the memory portion is selectively covered with a resist 114, and the first insulating layer 112 formed over the semiconductor layers 104, 106, and 108 is selectively removed by etching (see FIG. 19B).

Figure 16:
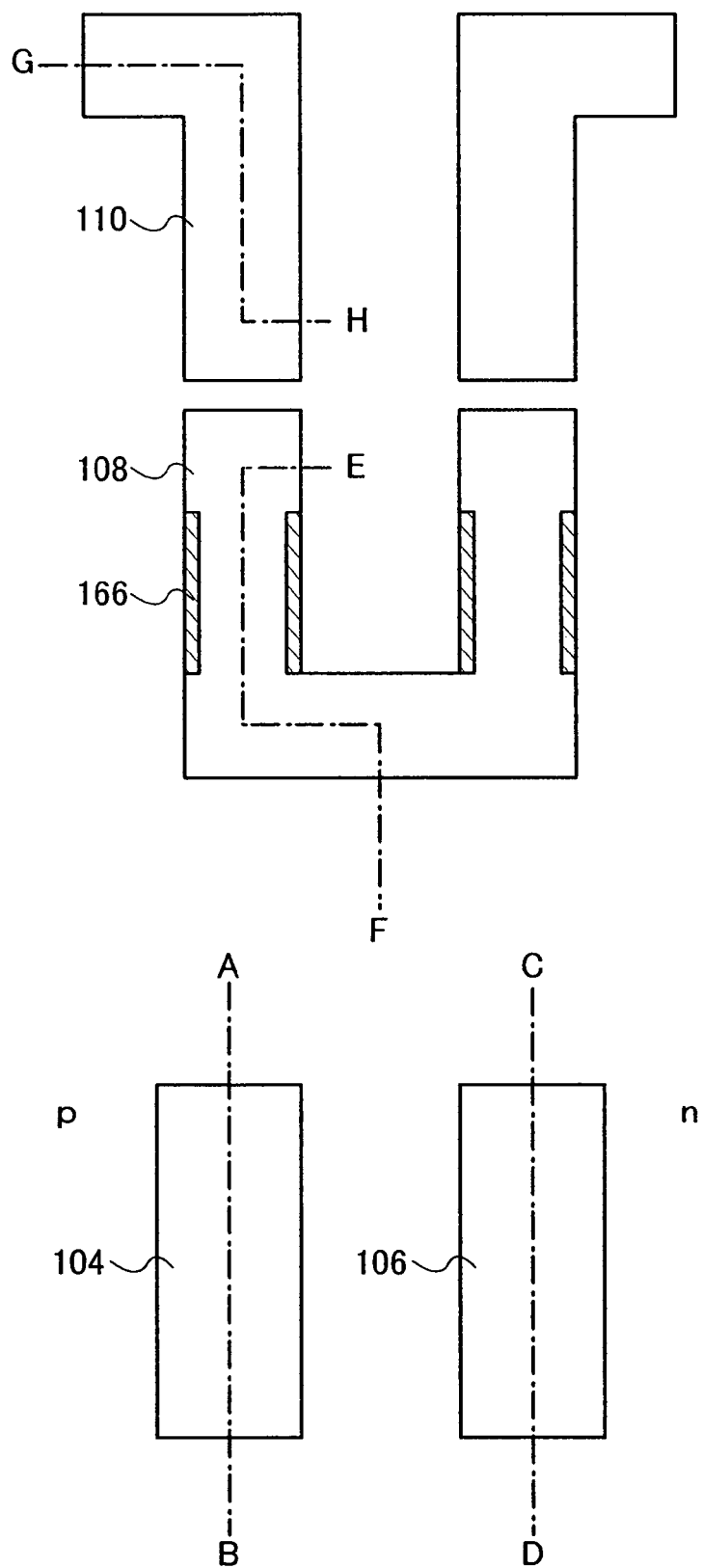
FIG. 16 is a view showing an example of a manufacturing method of a nonvolatile semiconductor memory device of the present invention.
Figure 17:
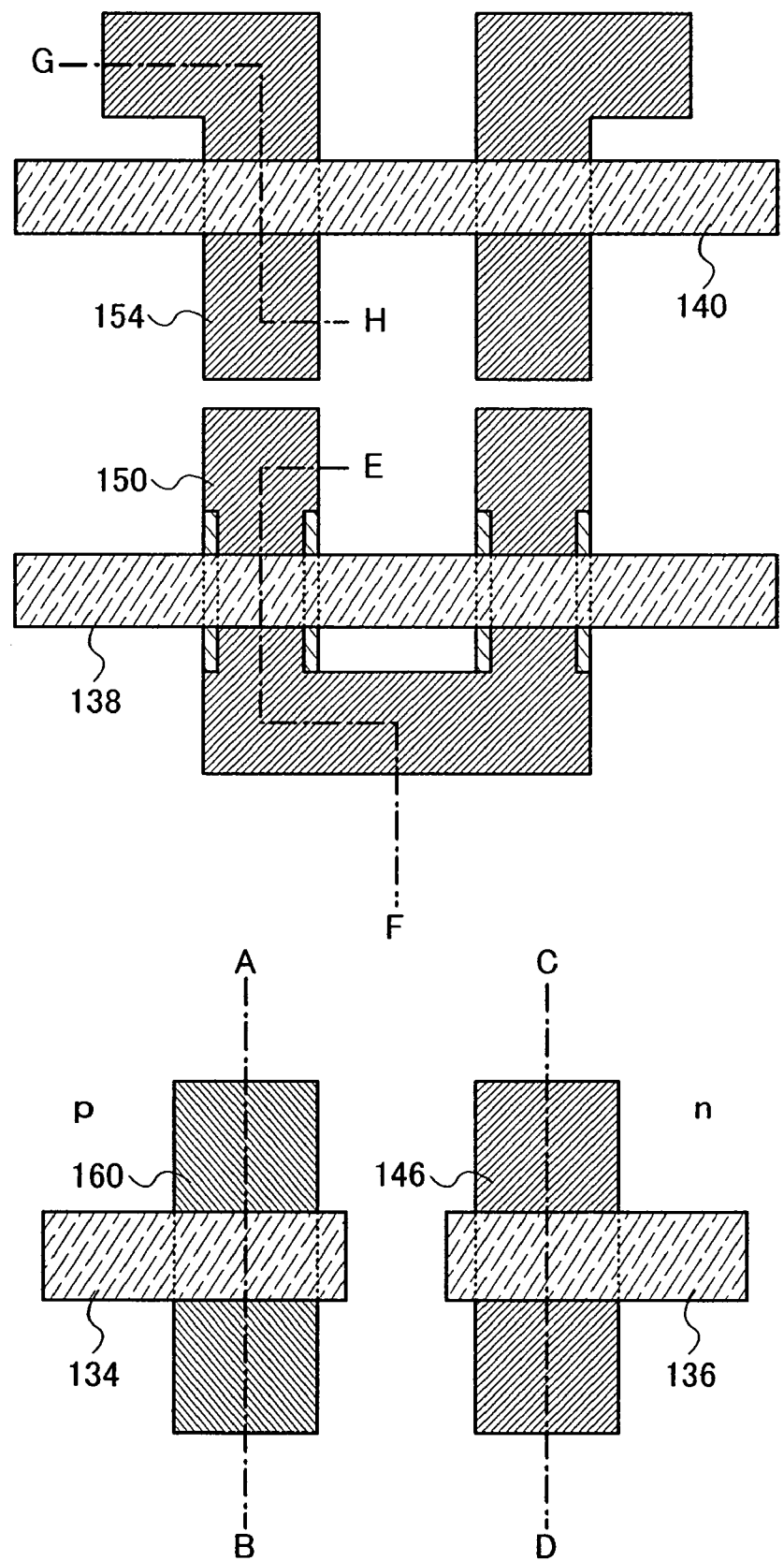
FIG. 17 is a view showing an example of a manufacturing method of a nonvolatile semiconductor memory device of the present invention.
Figure 19C:
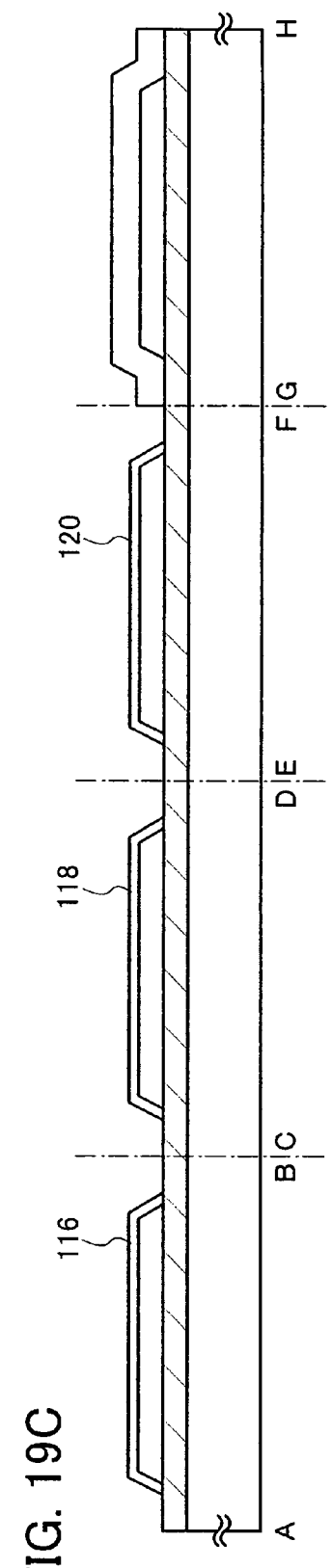

Then, second insulating layers 116, 118, and 120 are formed over the semiconductor layer 104, 106, and 108, respectively, and thereafter, an impurity element is selectively introduced into the semiconductor layer 108 to form an impurity region 166 (see FIG. 19C and FIG. 16). As the impurity element, an impurity element imparting n-type or p-type can be used. As the impurity element imparting n-type, phosphorus (P), arsenic (As), or the like can be used. As the impurity element imparting p-type, boron (B), aluminum (Al), gallium (Ga), or the like can be used. Here, boron (B) is selectively introduced into the semiconductor layer 108 as the impurity element. Further, an impurity element may be selectively introduced into the semiconductor layer 108 to from the impurity region 166 before forming the second insulating layers 116, 118, and 120.

The second insulating layers 116, 118, and 120 can be formed by a method in which plasma treatment is performed to the semiconductor layers 104, 106, and 108. For example, oxidation treatment, nitridation treatment, or oxynitridation treatment is performed to the semiconductor layers 104, 106, and 108 by high density plasma treatment, whereby the second insulating layers 116, 118, and 120 each of which becomes an oxide film, a nitride film, or an oxynitride film are formed over the semiconductor layers 104, 106, and 108. It is to be noted that the second insulating layers 116, 118, and 120 may be formed by a CVD method or a sputtering method. Alternatively, the second insulating layers 116, 118, and 120 may be formed by a method in which high density plasma treatment is performed to a film formed by a CVD method or a sputtering method.

For example, in the case where oxidation treatment or nitridation treatment is performed to a semiconductor layer containing Si as its main component which is used as the semiconductor layers 104, 106, and 108 by high density plasma treatment, a silicon oxide (SiOx) film or a silicon nitride (SiNx) film is formed as the second insulating layers 116, 118, and 120. Alternatively, after oxidation treatment is performed to the semiconductor layers 104, 106, and 108 by high density plasma treatment, nitridation treatment may be performed by another high density plasma treatment. In this case, a silicon oxide film is formed to be in contact with the semiconductor layers 104, 106, and 108, and a nitrogen plasma-treated layer with high nitrogen concentration is provided over a surface of the silicon oxide film or near the surface thereof. Nitridation by plasma treatment is advantageous in that hole conductivity is increased and erasing is easily performed in a nonvolatile memory element.

It is to be noted that, in this embodiment, each of the second insulating layers 116, 118, and 120 is formed with a thickness of 1 to 10 nm, preferably, 1 to 5 nm. For example, oxidation treatment is performed to the semiconductor layers 104, 106, and 108 by high density plasma treatment and a silicon oxide film of approximately 3 nm is formed over a surface of each of the semiconductor layers 104, 106, and 108, and thereafter, nitrogen treatment is performed by high density plasma treatment to form a nitrogen plasma-treated layer over a surface of the silicon oxide film or near the surface thereof.

In the case of performing oxidation treatment of an object to be processed by high density plasma treatment, a mixed gas of oxygen ($O_2$), hydrogen ($H_2$), and argon (Ar) is introduced. As the mixed gas which is used here, 0.1 to 100 sccm of oxygen, 0.1 to 100 sccm of hydrogen, and 100 to 5000 sccm of argon may be introduced. Further, the mixed gas with the ratio of oxygen:hydrogen:argon of. 1:1:100 is preferably introduced. For example, 5 sccm of oxygen, 5 sccm of hydrogen, and 500 sccm of argon may be introduced.

In the case of performing nitridation treatment by high density plasma treatment, a mixed gas of nitrogen ($N_2$) and argon (Ar) is introduced. As the mixed gas which is used here, 20 to 2000 sccm of nitrogen and 100 to 10000 sccm of argon may be introduced. For example, 200 sccm of nitrogen and 1000 sccm of argon may be introduced.

Moreover, the high density plasma treatment is performed in an atmosphere containing the above-described gas with an electron density of greater than or equal to $1 \times 10^{11}$ cm$^{-3}$ and plasma electron temperature of less than or equal to 1.5 eV. More specifically, the high density plasma treatment is performed with the electron density of greater than or equal to $1 \times 10^{11}$ cm$^{-3}$ and less than or equal to $1 \times 10^{13}$ cm$^{-3}$, and the plasma electron temperature of greater than or equal to 0.5 eV and less than or equal to 1.5 eV. Since the plasma electron density is high and the electron temperature near an object to be processed that is formed over the substrate 100 (here, the semiconductor layers 104, 106, 108, and 110) is low, damage due to plasma on the object to be processed can be prevented. Moreover, since the plasma electron density is as high as $1 \times 10^{11}$ cm$^{-3}$ or more, an oxide film or nitride film formed by a method in which the object to be processed is oxidized or nitrided with the use of the plasma treatment is dense and superior in uniformity of its film thickness or the like in comparison with a film formed by a CVD method, a sputtering method, or the like. Furthermore, since the plasma electron temperature is as low as 1.5 eV or less, oxidation treatment or nitridation treatment can be performed at lower temperature than in conventional plasma treatment or thermal oxidation method. For example, oxidation treatment or nitridation treatment can be sufficiently performed even by plasma treatment at a temperature lower than the distortion point of a glass substrate by greater than or equal to 100° C. As a frequency for forming plasma, high frequency such as a microwave (for example, 2.45 GHz) can be used.

Moreover, at this time, it is preferable to continuously perform the oxidation treatment and the nitridation treatment by the high density plasma treatment without being exposed to the air even once. The continuous high density plasma treatment makes it possible to realize prevention of contamination or improvement in production efficiency. At this time, there is a case where a surface of the first insulating layer 120 formed over the semiconductor layer 110 is oxidized or nitrided, and a silicon oxynitride film is formed.

Figure 42:
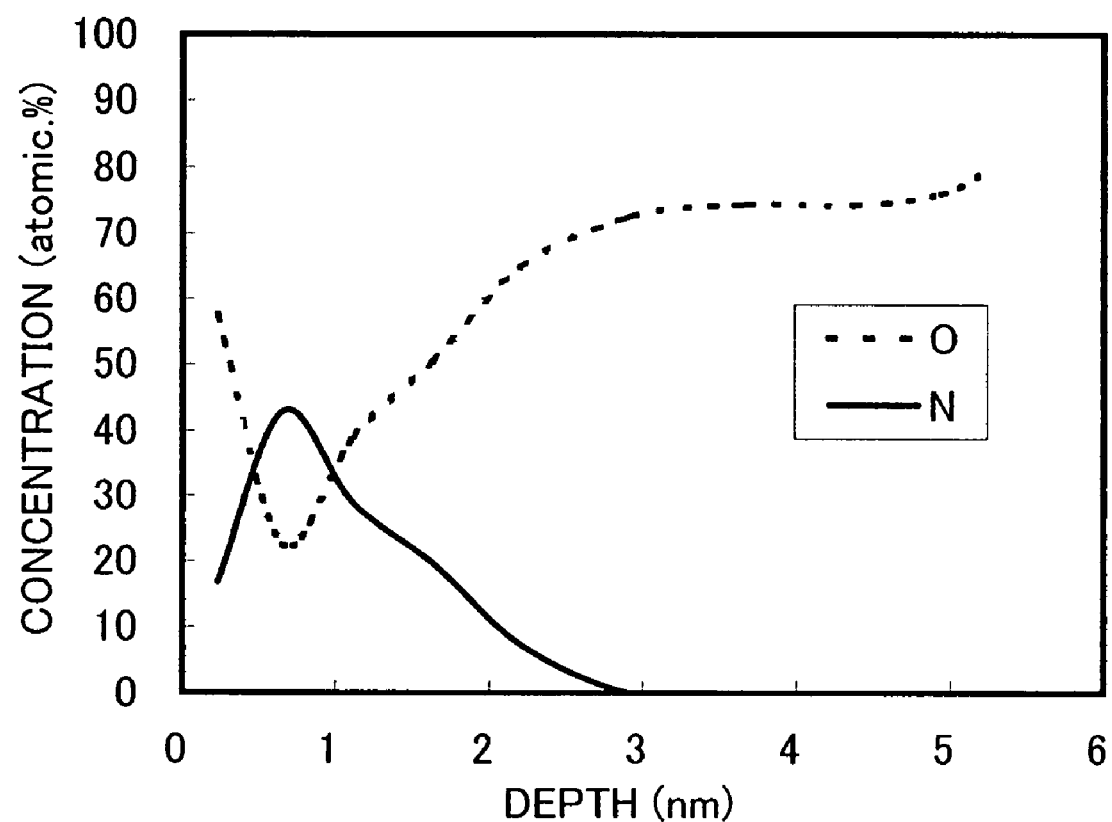
FIG. 42 is a graph showing a composition of a tunnel insulating layer in a nonvolatile semiconductor memory device of the present invention.

Here, FIG. 42 shows concentrations of an oxygen atom and a nitrogen atom contained in an insulating layer which is obtained by high density plasma treatment in a nitrogen atmosphere after a silicon oxide film is formed by a method in which high density plasma treatment is performed to a semiconductor layer containing Si as its main component in an oxygen atmosphere. FIG. 42 shows results of a case where 5 nm of a silicon oxide film is formed over a Si substrate by high density plasma treatment under an oxygen atmosphere (oxygen ($O_2$):hydrogen ($H_2$):argon (Ar)=5 sccm:5 sccm: 500 sccm) under conditions of 3800 W and 133.33 Pa, and thereafter, high density plasma treatment is performed to the silicon oxide film under a nitrogen atmosphere (nitrogen ($N_2$): argon (Ar)=200 sccm:1000 sccm) under conditions of 1200 W and 12 Pa. Further, FIG. 42 shows the results in which oxygen atom determination and nitrogen atom determination in a direction of the depth of the insulating layer are measured by X-ray photoelectron spectroscopy (XPS) (ESCA: Electron Spectroscopy for Chemical Analysis) and are compared with each other.

In FIG. 42, a vertical axis indicates the concentration of the oxygen atom or nitrogen atom contained in silicon oxide, and a horizontal axis indicates a depth from a surface of silicon oxide. According to FIG. 42, a nitridation treatment layer with high nitrogen concentration is formed near the surface of silicon oxide. The nitrogen atom is contained at a concentration of 40 to 45 atomic % in 0.6 to 0.7 nm deep from the surface of silicon oxide. In addition, it is found that the nitrogen atom content is decreased in a portion of greater than or equal to 3 nm deep from the surface of silicon oxide.

As described above, in this embodiment, when high density plasma treatment is performed to the semiconductor layers 104, 106, and 108 under an oxygen atmosphere and a nitrogen atmosphere in this order, a structure can be employed, in which nitrogen is contained at a concentration of 20 to 50 atomic % in a portion of approximately 0.5 nm deep from a surface of a silicon oxide layer with a thickness of approximately 3 nm. Further, silicon containing oxygen and nitrogen (silicon oxynitride) is contained in a nitrogen plasma-treated layer.

In the case of performing high density plasma treatment in an atmosphere containing a rare gas, there is a case where the first insulating layer 112, and the second insulating layers 116, 118, and 120 contain a rare gas used for plasma treatment (containing at least one of He, Ne, Ar, Kr, and Xe). In the case of using Ar, Ar might be contained in the first insulating layer 112 and the second insulating layers 116, 118, and 120.

In this embodiment, the second insulating layer 120 formed over the semiconductor layer 108 provided in the memory portion serves as a tunnel oxide film in a nonvolatile memory element to be completed later. Therefore, when the second insulating layer 120 is thinner, a tunnel current easily flows and high speed operation as a memory is possible. In addition, when the second insulating layer 120 is thinner, charge can be accumulated in a charge accumulating layer to be formed later at low voltage; thus, power consumption of a nonvolatile semiconductor memory device can be reduced. Therefore, it is preferable to form the second insulating layers 116, 118, and 120 to be thin (for example, less than or equal to 10 nm).

In general, a thermal oxidation method is given as a method for forming an insulating layer to be thin over a semiconductor layer; however, it is very difficult to form the second insulating layers 116, 118, and 120 by a thermal oxidation method in the case of using a substrate with a melting point that is not sufficiently high, such as a glass substrate, as the substrate 100. An insulating layer formed by a CVD method or a sputtering method includes a defect inside its film; accordingly, film quality is not sufficient and there is a problem in that a defect such as a pinhole occurs. In addition, in the case of forming an insulating layer by a CVD method or a sputtering method, coverage of an edge of a semiconductor layer is not sufficient, and a conductive layer or the like to be formed over the insulating layer later and the semiconductor layer might be short-circuited. Therefore, as shown in this embodiment, when the second insulating layers 116, 118, and 120 are formed by high density plasma treatment, an insulating layer which is denser than an insulating layer formed by a CVD method, a sputtering method, or the like can be formed, and edges of the semiconductor layers 104, 106, and 108 can be sufficiently covered with the second insulating layers 116, 118, and 120, respectively. Accordingly, reliability of a semiconductor memory element can be improved. It is to be noted that, in the case of forming the second insulating layers 116, 118, and 120 by a CVD method or a sputtering method, it is preferable that high density plasma treatment be performed after the insulating layer is formed and oxidation treatment, nitridation treatment, or oxynitridation treatment be performed to a surface of the insulating layer.

Figure 20A:
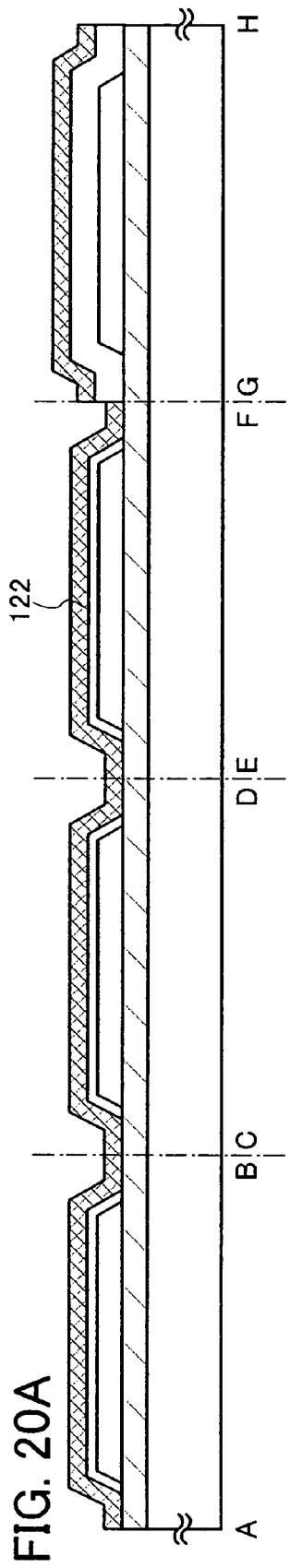
FIGS. 20A to 20C are views each showing an example of a manufacturing method of a nonvolatile semiconductor memory device of the present invention.

Next, a charge accumulating layer 122 is formed so as to cover the first insulating layer 112 and the second insulating layers 116, 118, and 120 (see FIG. 20A). The charge accumulating layer 122 can be formed of an insulating layer with a defect of trapping charge inside its film or an insulating layer containing conductive particles or semiconductor particles such as silicon. For example, the charge accumulating layer 122 is formed of an insulating layer containing a nitrogen element, such as a silicon nitride (SiNx) film, a silicon nitride oxide (SiNxOy) (x>y) film, or a silicon oxynitride (SiOxNy) (x>y) film, or a film in which conductive particles or semiconductor particles are contained in these insulating films. Here, a silicon nitride film is formed with a thickness of 1 to 20 nm, preferably, 1 to 10 nm by a plasma CVD method. It is to be noted that the charge accumulating layer 122 provided in the memory portion serves as a film for trapping charge in the nonvolatile memory element to be completed later.

Figure 20B:
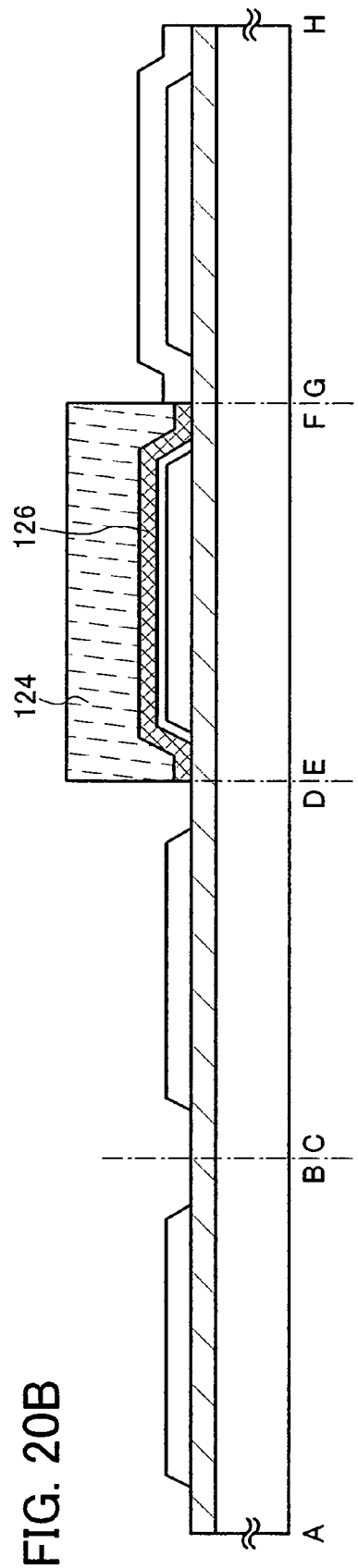

Next, the second insulating layer 116 and 118 and the charge accumulating layer 122 formed over each of the semiconductor layers 104 and 106, and the charge accumulating layer 122 formed over the semiconductor layer 110 are selectively removed, so that the second insulating layer 120 and the charge accumulating layer 122 formed over the semiconductor layer 108 are left. Here, the semiconductor layer 108 provided in the memory portion is selectively covered with a resist 124, and the second insulating layers 116 and 118 and the charge accumulating 122 which are not covered with the resist 124 are selectively removed by etching (see FIG. 20B). It is to be noted that FIG. 20B shows an example in which the charge accumulating layer 122 is etched to be selectively removed, and a charge accumulating layer 126 is formed while part of the charge accumulating layer 122 is left.

Figure 20C:
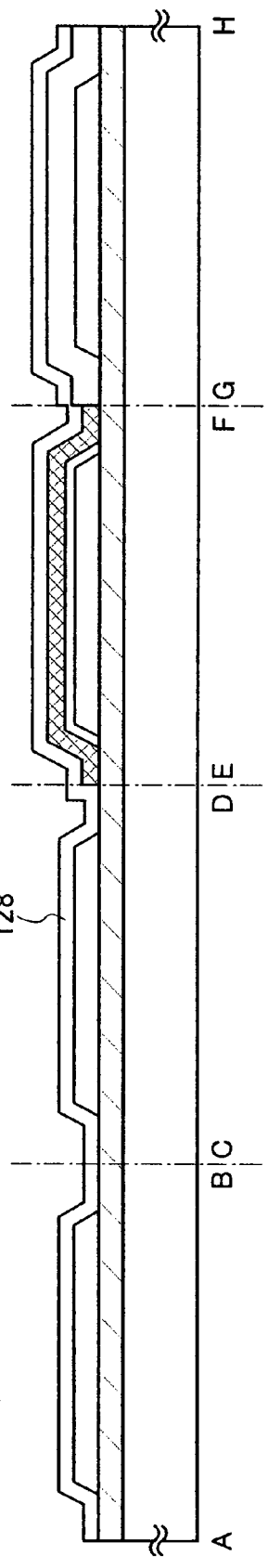

Next, a third insulating layer 128 is formed so as to cover the semiconductor layers 104 and 106, the charge accumulating layer 126 formed over the semiconductor layer 108, and the first insulating layer 120 formed over the semiconductor layer 110 (see FIG. 20C).

The third insulating layer 128 is formed of a single layer or stacked layer using an insulating material such as silicon oxide, silicon nitride, silicon oxynitride (SiOxNy) (x>y), or silicon nitride oxide (SiNxOy) (x>y) by a CVD method, a sputtering method, or the like. For example, in the case of forming the third insulating layer 128 of a single layer, a silicon oxynitride film or a silicon nitride oxide film is formed with a thickness of 5 to 50 nm by a CVD method. In addition, in the case of forming the third insulating layer 128 of three-layered structure, a silicon oxynitride film is formed as a first insulating layer, a silicon nitride film is formed as a second insulating layer, and a silicon oxynitride film is formed as a third insulating layer.

It is to be noted that the third insulating layer 128 formed over the semiconductor layer 108 serves as a control insulating layer in the nonvolatile memory element to be completed later, and the third insulating layer 128 formed over each of the semiconductor layers 104 and 106 serves as a gate insulating layer in a transistor to be completed later.

Next, a conductive layer is formed so as to cover the third insulating layer 128 formed over each of the semiconductor layers 104, 106, 108, and 110 (see FIG. 21A). Here, an example is shown, in which a conductive layer 130 and a conductive layer 132 are sequentially stacked as the conductive layer. It is needless to say that the conductive layer may have a single-layer structure or a stacked-layer structure including three layers or more.

The conductive layers 130 and 132 can be formed of an element selected from tantalum (Ta), tungsten (W), titanium (Ti), molybdenum (Mo), aluminum (Al), copper (Cu), chromium (Cr), niobium (Nb), or the like, or an alloy material or compound material containing these elements as its main component. In addition, the conductive layers 130 and 132 can be formed of a metal nitride film in which these elements are nitrided. Besides, the conductive layers 130 and 132 can be formed of a semiconductor material typified by polycrystalline silicon doped with an impurity element such as phosphorus.

Here, the conductive layer 130 is formed of tantalum nitride and the conductive layer 132 is formed of tungsten over the conductive layer 130 to have a stacked-layer structure. Besides, the conductive layer 130 can be formed of a single-layered or stacked-layer film of tungsten nitride, molybdenum nitride, or titanium nitride and the conductive layer 132 can be formed of a single-layered or stacked-layer film of tantalum, molybdenum, or titanium.

Next, the conductive layers 130 and 132 which are stacked to be provided are selectively etched to be removed, so that the conductive layers 130 and 132 are left over part of each of the semiconductor layers 104, 106, 108, and 110, and conductive layer 134, 136, 138, and 140 each serving as a gate electrode are formed (see FIG. 21B). It is to be noted that the conductive layer 138 formed over the semiconductor layer 108, which is provided in the memory portion, serves as a control gate in the nonvolatile memory element to be completed later. In addition, the conductive layers 134, 136, and 140 each serve as a gate electrode in the transistor to be completed later.

Subsequently, a resist 142 is selectively formed so as to cover the semiconductor layer 104. An impurity element is introduced into each of the semiconductor layers 106, 108, and 110 with the use of the resist 142 and the conductive layers 136, 138, and 140 as masks, whereby an impurity region is formed (see FIG. 21C). It is to be noted that the resist 142 is provided so as to cover an impurity region 166 provided in the semiconductor layer 108 as well. As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. Here, phosphorus is used as the impurity element.

In FIG. 21C, an impurity region 146 for forming a source region or drain region and a channel formation region 144 are formed in the semiconductor layer 106 by introduction of the impurity element. In the semiconductor layer 108, an impurity region 150 for forming a source region or drain region and a channel formation region 148 are formed. In the semiconductor layer 110, an impurity region 154 for forming a source region or drain region and a channel formation region 152 are formed. It is to be noted that, although an example in which the impurity region 154 is n-type is shown here, in the case where the impurity region 154 is p-type, the impurity region 166 is made to be n-type.

Next, a resist 156 is selectively formed so as to cover the semiconductor layers 106, 108, and 110. An impurity element is introduced into the semiconductor layer 104 with the use of the resist 156 and the conductive layer 134 as masks, whereby an impurity region is formed (see FIG. 22A and FIG. 17). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. Here, an impurity element (for example, boron (B)) having a different conductivity type from that of the impurity element introduced into the semiconductor layers 106, 108, and 110 in FIG. 21C is introduced. Accordingly, an impurity region 160 for forming a source region or drain region and a channel formation region 158 are formed in the semiconductor layer 104.

Then, an insulating layer 162 is formed so as to cover the third insulating layer 128 and the conductive layers 134, 136, 138, and 140, and a conductive layer 164 which is electrically connected to the impurity regions 160, 146, 150, and 154 formed in the semiconductor layers 104, 106, 108, and 110, respectively, is formed over the insulating layer 162 (see FIG. 22B and FIG. 18).

The insulating layer 162 can be formed of a single layer or stacked layer of an insulating layer containing oxygen or nitrogen, such as a silicon oxide (SiOx) film, a silicon nitride (SiNx) film, a silicon oxynitride (SiOxNy) (x>y) film, or a silicon nitride oxide (SiNxOy) (0>y) film, a film containing carbon such as DLC (diamond like carbon), an organic material such as epoxy, polyimide, polyamide, polyvinyl phenol, benzocyclobutene, or acrylic, or a siloxane material such as a siloxane resin by a CVD method, a sputtering method, or the like. Further, the siloxane material corresponds to a material including a Si—O—Si bond. Siloxane has a skeleton structure formed by a bond of silicon (Si) and oxygen (O). As a substituent, an organic group containing at least hydrogen (for example, an alkyl group or aromatic hydrocarbon) can be used. As the substituent, a fluoro group may also be used. Alternatively, the organic group containing at least hydrogen and the fluoro group may be used.

The conductive layer 164 is formed of a single layer or stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or compound material containing these elements as its main component by a CVD method, a sputtering method, or the like. For example, an alloy material containing aluminum as its main component corresponds to a material containing aluminum as its main component and nickel, or an alloy material containing aluminum as its main component, nickel, and one or both of carbon and silicon. For example, a conductive layer 174 is formed of a stacked layer including a barrier film, an aluminum silicon (Al—Si) film, and a barrier film or a stacked layer including a barrier film, an aluminum silicon (Al—Si) film, a titanium nitride (TiN) film, and a barrier film. Further, the barrier film corresponds to a thin film formed of titanium, a nitride of titanium, molybdenum, or a nitride of molybdenum. Since aluminum or aluminum silicon has a low resistance value and is inexpensive, aluminum or aluminum silicon is most suitable for the material for forming the conductive layer 174. When the barrier layer is provided for an upper layer and a bottom layer, generation of hillock of aluminum or aluminum silicon can be prevented. In addition, when the barrier film is formed of titanium that has a high reducing property, even when a thin natural oxide film is formed over a crystalline semiconductor layer, the barrier film reduces this natural oxide film, and accordingly, favorable contact with the crystalline semiconductor layer can be obtained.

It is to be noted that, in this embodiment, the example in which the insulating layer serving as the control insulating layer of the nonvolatile memory element formed in the memory portion and the gate insulating layer of the thin film transistor formed in the logic portion are formed at the same time (FIG. 20C) is described; however, the present invention is not limited thereto. For example, formation as shown in FIGS. 23A to 23C may be employed. The formation will be specifically explained below.

First, after a formation step similar to that shown in FIG. 20A, the third insulating layer 128 is formed over the charge accumulating layer 122 (see FIG. 23A). Next, the resist 124 is selectively formed so as to cover the semiconductor layer 108, and thereafter, the charge accumulating layer 122 and the third insulating layer 128 formed over the semiconductor layers 104, 106, and 110 are selectively removed (see FIG. 23B). After that, an insulating layer 168 serving as a gate insulating layer is formed over an exposed surface of the semiconductor layer 104 and an insulating layer 170 serving as a gate insulating layer is formed over an exposed surface of the semiconductor layer 106 (see FIG. 23C). The insulating layers 168 and 170 may be provided by high density plasma treatment as explained in the formation of the second insulating layers 116, 118, and 120. Alternatively, the insulating layers 168 and 170 can be formed by a CVD method or a sputtering method.

As shown in FIGS. 23A to 23C, the gate insulating layer of the thin film transistor formed in the logic portion and the control insulating layer of the nonvolatile memory element formed in the memory portion can be formed with different thicknesses or with the use of different materials.

In the steps shown in this embodiment, an insulating layer 172 (also referred to as a sidewall) may be provided so as to be in contact with a side surface of each of the conductive layers 134, 136, 138, and 140 (see FIGS. 24A and 24B). By introduction of an impurity element to the semiconductor layers 104, 106, 108, and 110 with the use of the insulating layer 172 as a mask, low concentration impurity regions 180, 174, 176, and 178 serving as LDD can be formed in the semiconductor layers 104, 106, 108, and 110, respectively.

Further, the insulating layer 172 may be formed so as to be directly in contact with the semiconductor layer 104 (see FIG. 24A), or a structure may be employed, in which another insulating layer or charge accumulating layer is formed under the insulating layer 172 (see FIG. 24B).

In this embodiment, the structure in which the accumulating layer 126 is formed over an entire surface of the semiconductor layer provided in the memory portion is shown; however, the present invention is not limited thereto. For example, a structure may be employed, in which the charge accumulating layer 126 is selectively provided in a portion where the semiconductor layer 108 and the conductive layer 138 intersect with each other (see FIG. 25). Further, in the nonvolatile memory element, in the case where a channel length of the semiconductor layer 108 is indicated by L and a channel width thereof is indicated by W, the charge accumulating layer 126 may be provided so as to be larger than the channel length L and the channel width W (see FIG. 25), the charge accumulating layer 126 may be provided so as to be larger than one of the channel length L and the channel width W, or the charge accumulating layer 126 may be provided so as to be smaller than the channel length L and the channel width W (a state in which the charge accumulating layer 126 is constantly provided over the semiconductor layer 108).

In this embodiment, although the case where the impurity region 166 is provided at the edge of the semiconductor layer included in the nonvolatile memory element, a structure may be employed in which the impurity region 166 is provided at an edge of the semiconductor layer 110 included in the control transistor provided in the memory portion and edge portions of the semiconductor layers 104 and 106 included in the transistor provided in the logic portion (see FIG. 26). In FIG. 26, since the transistor including the semiconductor layer 106 and the transistor including the semiconductor layer 110 are n-channel, a p-type impurity region 166 is formed at the edge of the semiconductor layer 106 overlapping with the conductive layer 136 and the edge of the semiconductor layer 110 overlapping with the conductive layer 140. In addition, since the transistor including the semiconductor layer 104 is p-channel, an n-channel impurity region 166 is formed at the edge of the semiconductor layer 104 overlapping with the conductive layer 134.

Figure 25:
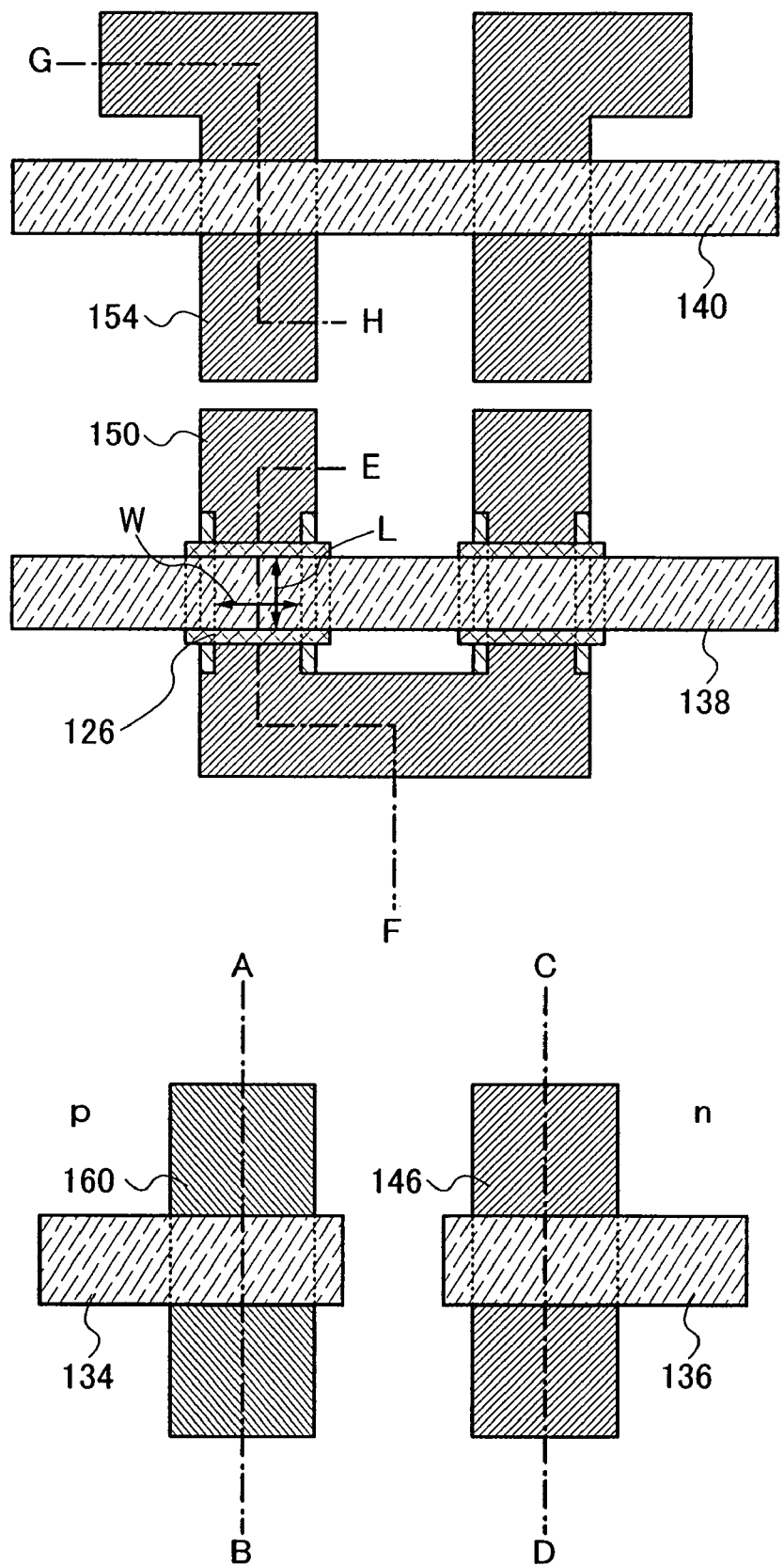
FIG. 25 is a view showing an example of a manufacturing method of a nonvolatile semiconductor memory device of the present invention.
Figure 27:
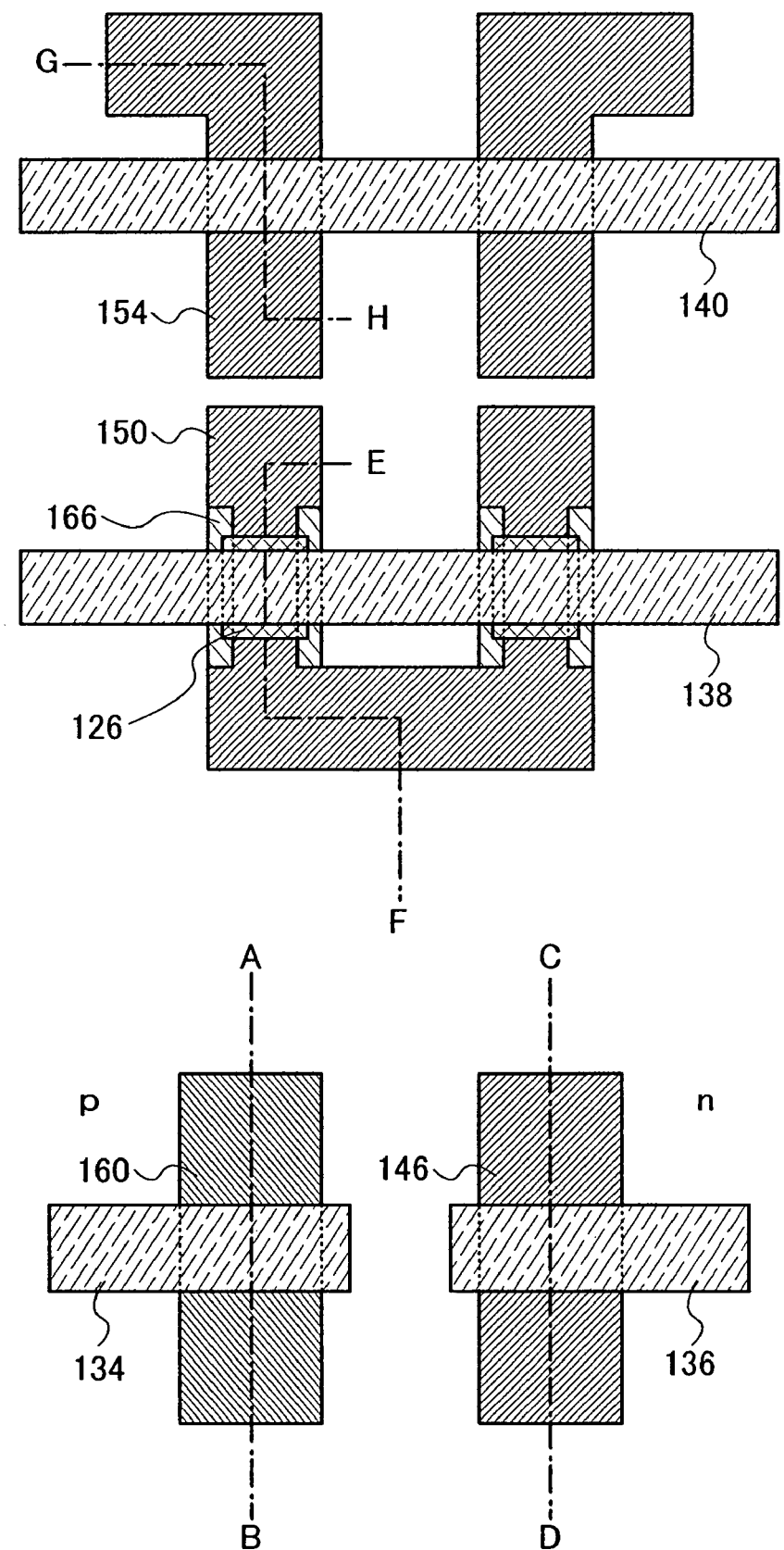
FIG. 27 is a view showing an example of a manufacturing method of a nonvolatile semiconductor memory device of the present invention.

Further, in FIG. 25, although the example in which the charge accumulating layer 126 is provided so as to overlap with the conductive layer 138 and the charge accumulating layer 126 is provided so as to cover edges of the semiconductor layer 108, the present invention is not limited thereto. The charge accumulating layer 126 may be provided in such a manner that the charge accumulating layer 126 does not overlap with the edges of the semiconductor layer 108 and is larger than the channel length L (see FIG. 27). Alternatively, the charge accumulating layer 126 may be provided in such a manner that the charge accumulating layer 126 does not overlap with the edge portions of the semiconductor layer 108, is smaller than the channel length L, and larger than the channel width W (see FIG. 28). Further, in this embodiment, although the case where the impurity region 166 is provided in a region which is the edge portion of the semiconductor layer 108 and overlaps with the conductive layer 138 and an adjacent region thereof, a structure may be employed, in which the impurity region 166 is not provided in the region overlapping with the conductive layer 138 but provided only in the adjacent region thereof (see FIGS. 3A to 3D).

As described above, by the provision of the impurity region 166, a portion where the impurity region 150 and the impurity region 166 are adjacent to each other has high resistance by a pn junction; therefore, influence on characteristics of the nonvolatile memory element due to a coverage defect of the second insulating layer 120 at the edge portion of the semiconductor layer 108, accumulation of charges from a manufacturing process at the edge portion of the semiconductor layer 108, or the like can be suppressed.

This embodiment can be implemented in combination with Embodiment Mode 1 or other embodiments described in this specification.

Embodiment 2

In this embodiment, a manufacturing method of a nonvolatile semiconductor memory device that is different from the one explained in the above embodiment will be explained with reference to the drawings. It is to be noted that the same portions as those in the above embodiment are denoted by the same reference numerals and the explanation thereof is omitted. It is to be noted that, in FIGS. 29A to 29C, FIGS. 30A to 30C, and FIGS. 31A to 31C, portions taken along lines A-B and C-D show thin film transistors provided in logic portions, a portion taken along a line E-F shows a nonvolatile memory element provided in a memory portion, and a portion taken along a line G-H shows a thin film transistor provided in a memory portion.

First, as shown in the above embodiment, after a formation step similar to that shown in FIG. 19A, a resist 114 is selectively formed so as to cover an edge of each of semiconductor layers 104, 106, and 108, and a semiconductor layer 110, and then a first insulating layer 112 which is not covered with the resist 114 is selectively removed (see FIG. 29A). That is, a structure is obtained here, in which the semiconductor layer 110 and the edge of each of the semiconductor layers 104, 106, and 108 are covered with the first insulating layer 112.

This structure is provided in order to prevent a concave portion from being formed in a portion where the edge of each of the semiconductor layers 104, 106, and 108 are in contact with the insulating layer 102, in the case where all of the first insulating layer 112 formed over the semiconductor layers 104, 106, and 108 is removed by etching. In the case where a concave portion is formed in the insulating layer 102, a problem such as a coverage defect occurs in the case of forming the insulating layer or the like for covering the semiconductor layers 104, 106, and 108 later; therefore, it is effective to cover the edge of each of the semiconductor layers 104, 106, and 108 with the insulating layer 112.

Next, second insulating layers 116, 118, and 120 are formed over the semiconductor layers 104, 106, and 108, respectively (see FIG. 29B). The second insulating layers 116, 118, and 120 can be formed by any of the methods explained in the above embodiment. Here, as the second insulating layers 116, 118, and 120, an insulating layer including a silicon oxide film and a silicon oxynitride film is formed by continuous oxidation treatment and nitridation treatment by high density plasma treatment. Further, before or after the second insulating layers 116, 118, and 120 are formed, an impurity element is selectively introduced into the semiconductor layer 108 to form an impurity region 166, as shown in the above embodiment.

Subsequently, a charge accumulating layer 122 is formed so as to cover the first insulating layer 112 formed over the semiconductor layer 110 and the second insulating layers 116, 118, and 120 (see FIG. 29C). The charge accumulating layer 122 can be formed using any of the materials explained in the above embodiment. Here, the charge accumulating layer 122 is provided by a film formed by a method in which conductive particles or semiconductor particles are contained in a silicon nitride film, a silicon nitride oxide film, or a silicon oxynitride film.

Next, the second insulating layer 116 and the charge accumulating layer 122 formed over the semiconductor layer 104 and the second insulating layer 118 and the charge accumulating layer 122 formed over the semiconductor layer 106 are selectively removed, so that the second insulating layer 120 and the charge accumulating layer 122 formed over the semiconductor layer 108 and the charge accumulating layer 122 formed over the semiconductor layer 110 are left. Here, the semiconductor layer 108 and the semiconductor layer 110 provided in the memory portion are selectively covered with a resist 124, and the second insulating layers 116 and 118 and the charge accumulating layer 122 which are not covered with the resist 124 are selectively removed by etching (see FIG. 30A). Further, in FIG. 30A, an example is shown in which part of the charge accumulating layer 122 is left by a method in which the charge accumulating layer 122 is selectively removed by etching, and a charge accumulating layer 126 is formed. Further, as shown in the above embodiment, the charge accumulating layer 122 formed over the semiconductor layer 110 may be removed.

Subsequently, a third insulating layer 128 is formed so as to cover the semiconductor layers 104 and 106 and the charge accumulating layer 126 formed over the semiconductor layers 108 and 110 (see FIG. 30B).

The third insulating layer 128 is formed using any of the materials explained in the above embodiment. For example, the third insulating layer 128 is formed by a method in which a silicon oxynitride film or a silicon nitride oxide film is formed with a thickness of 5 to 50 nm by a CVD method.

It is to be noted that the third insulating layer 128 formed over the semiconductor layer 108 serves as a control insulating layer in a nonvolatile memory element to be completed later and the third insulating layer 128 formed over the semiconductor layers 104 and 106 serves as a gate insulating layer in a transistor to be completed later.

Next, conductive layers 134, 136, 138, and 140 serving as gate electrodes are formed over the semiconductor layers 104, 106, 108, and 110, respectively (see FIG. 30C). It is to be noted that the conductive layer 138 formed over the semiconductor layer 108 provided in the memory portion serves as a control gate in the nonvolatile memory element to be completed later. In addition, each of the conductive layers 134, 136, and 140 serves as a gate electrode in the transistor to be completed later.

Figure 31A:
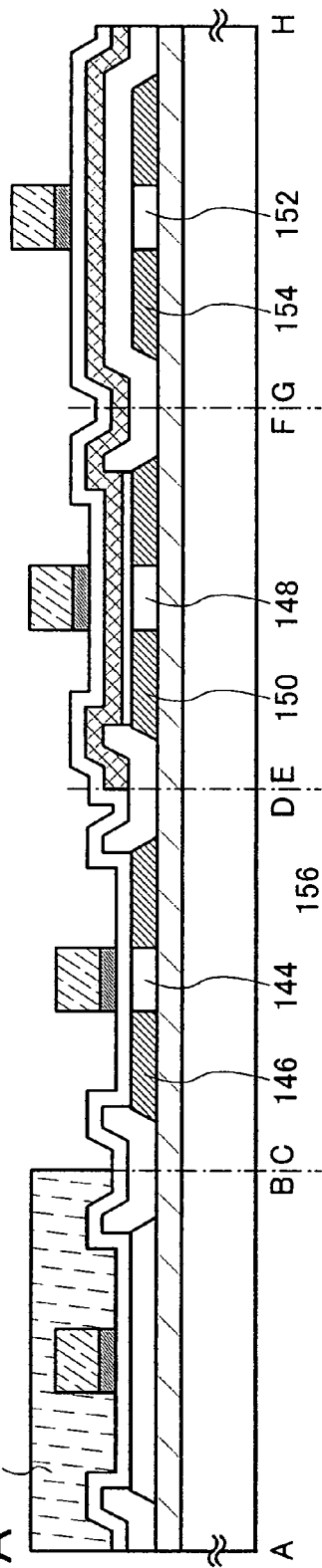
FIGS. 31A to 31C are views each showing an example of a manufacturing method of a nonvolatile semiconductor memory device of the present invention.

Then, a resist 142 is selectively formed so as to cover the semiconductor layer 104, and an impurity element is introduced into the semiconductor layers 106, 108, and 110 with the use of the resist 142 and the conductive layers 136, 138, and 140 as masks, whereby an impurity region is formed (see FIG. 31A). Further, the resist 142 is provided so as to cover the impurity region 166 provided in the semiconductor layer 108 as well. As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. Here, phosphorus (P) is used as the impurity element.

In FIG. 31A, by introduction of the impurity element, an impurity region 146 for forming a source region or drain region and a channel formation region 144 are formed in the semiconductor layer 106. In the semiconductor layer 108, an impurity region 150 for forming a source region or drain region and a channel formation region 148 are formed. In the semiconductor layer 110, an impurity region 154 for forming a source region or drain region and a channel formation region 152 are formed.

Figure 31B:
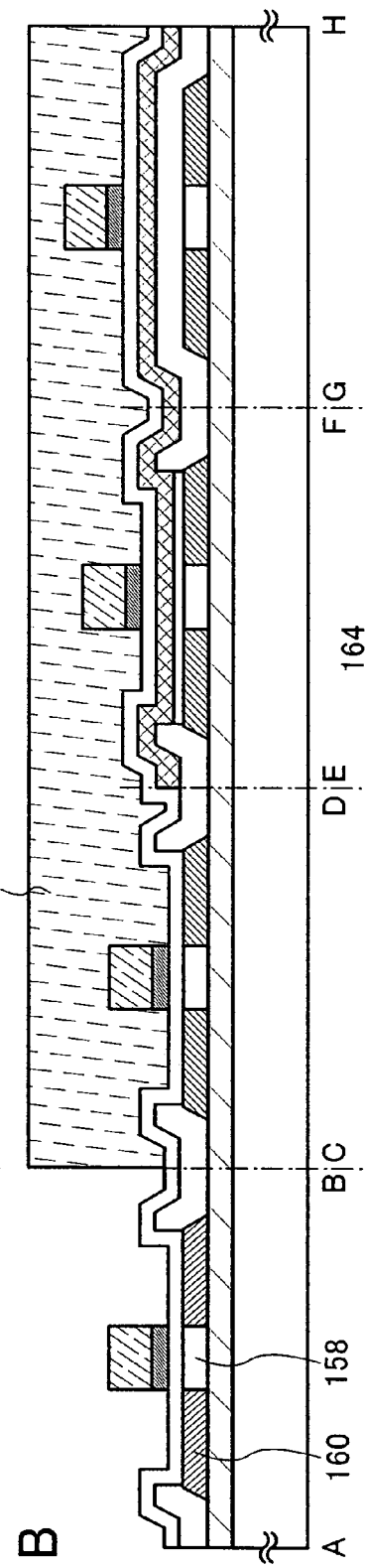

Next, a resist 156 is selectively formed so as to cover the semiconductor layers 106, 108, and 110, and an impurity element is introduced into the semiconductor layer 104 with the use of the resist 156 and the conductive layer 134 as masks, whereby an impurity region is formed (see FIG. 31B). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. Here, an impurity element having a different conductivity type from that of the impurity element (for example, boron (B)) introduced into the semiconductor layers 106, 108, and 110 in FIG. 31A is introduced. As a result, in the semiconductor layer 104, an impurity region 160 for forming a source region or drain region and a channel formation region 158 are formed.

Figure 31C:
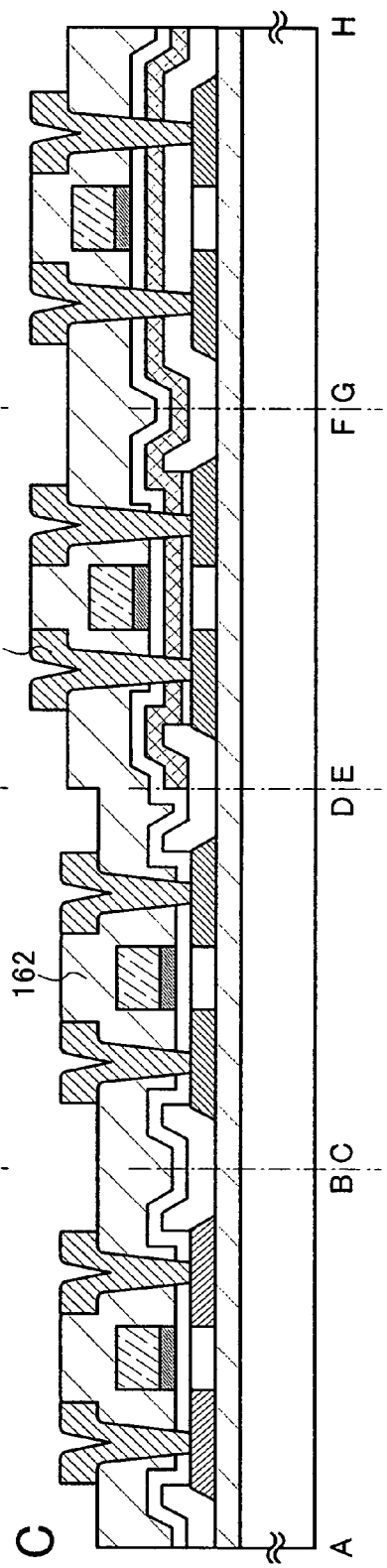

Subsequently, an insulating layer 162 is formed so as to cover the third insulating layer 128 and the conductive layers 134, 136, 138, and 140, and conductive layers 164 electrically connected to the impurity regions 160, 146, 150, and 154 formed in the semiconductor layers 104, 106, 108, and 110, respectively, are formed over the insulating layer 162 (see FIG. 31C).

The insulating layer 162 and the conductive layer 164 can be formed using any of the materials explained in the above embodiment.

It is to be noted that this embodiment can be implemented in combination with Embodiment Mode 1 or other embodiments described in this specification.

Embodiment 3

In this embodiment, a manufacturing method of a nonvolatile semiconductor memory device that is different from the one explained in the above embodiment will be explained with reference to the drawings. It is to be noted that the same portions as those in the above embodiment are denoted by the same reference numerals and the explanation thereof is omitted. It is to be noted that, in FIGS. 32A to 32C, FIGS. 33A to 33C, and FIGS. 34A to 34C, portions taken along lines A-B and C-D show thin film transistors provided in logic portions, a portion taken along a line E-F shows a nonvolatile memory element provided in a memory portion, and a portion taken along a line G-H shows a thin film transistor provided in a memory portion.

First, a semiconductor layer 103 is formed over a substrate 100 with an insulating layer 102 interposed therebetween, and a first insulating layer 112 is formed over the semiconductor layer 103 (see FIG. 32A).

The semiconductor layer 103 can be formed by a method in which an amorphous semiconductor layer is formed over the insulating layer 102 which is formed over the substrate 100 in advance with the use of a material containing silicon (Si) as its main component, or the like by a sputtering method, an LPCVD method, a plasma CVD method, or the like and the amorphous semiconductor layer is crystallized. It is to be noted that the amorphous semiconductor layer can be crystallized by a laser crystallization method, a thermal crystallization method using RTA or an annealing furnace, a thermal crystallization method using a metal element promoting crystallization, a method in which these methods are combined, or the like.

Next, a resist 114 is selectively provided over the first insulating layer 112 and the first insulating layer 112 is left by etching with the use of the resist 114 as a mask, so that a first insulating layer 113 is formed (see FIG. 32B).

Next, a second insulating layer 115 is formed over the exposed semiconductor layer 103 (see FIG. 32C).

The second insulating layer 115 can be formed by a method in which thermal treatment, plasma treatment, or the like is performed to the exposed semiconductor layer 103. For example, oxidation treatment, nitridation treatment, or oxynitridation treatment is performed to the semiconductor layer 103 by high density plasma treatment, whereby the second insulating layer 115 which becomes an oxide film, a nitride film, or an oxynitride film is formed. Further, the second insulating layer 115 may be formed by a CVD method or a sputtering method. Alternatively, the second insulating layer 115 may be formed by a method in which high density plasma treatment is performed to a film formed by a CVD method or a sputtering method.

For example, in the case where oxidation treatment or nitridation treatment is performed by high density plasma treatment with the use of a semiconductor layer containing Si as its main component as the semiconductor layer 103, a silicon oxide (SiOx) film or a silicon nitride (SiNx) film is formed as the second insulating layer 115. Alternatively, oxidation treatment is performed to the semiconductor layer 103 by high density plasma treatment, and then, nitridation treatment may be performed by another high density plasma treatment. In this case, a silicon oxide film is formed to be in contact with the semiconductor layer 103 and a film containing oxygen and nitrogen (hereinafter, referred to as a silicon oxynitride film) is formed over the silicon oxide film, whereby the second insulating film 115 is a film in which the silicon oxide film and the silicon oxynitride film are stacked.

Here, the second insulating layer 115 is formed with a thickness of 1 to 10 nm, preferably, 1 to 5 nm. For example, oxidation treatment is performed to the semiconductor layer 103 by high density plasma treatment to form a silicon oxide film over a surface of the semiconductor layer 103, and then, nitridation treatment is performed by high density plasma treatment to form a silicon oxynitride film over a surface of the silicon oxide film. It is preferable that, at this time, the oxidation treatment and nitridation treatment by the high density plasma treatment be continuously performed without being exposed to the air even once. The continuous high density plasma treatment makes it possible to realize prevention of contamination or improvement in production efficiency. At this time, there is a case where the surface of the first insulating layer 113 is also oxidized or nitrided and a silicon oxunitride film is formed.

Figure 33A:
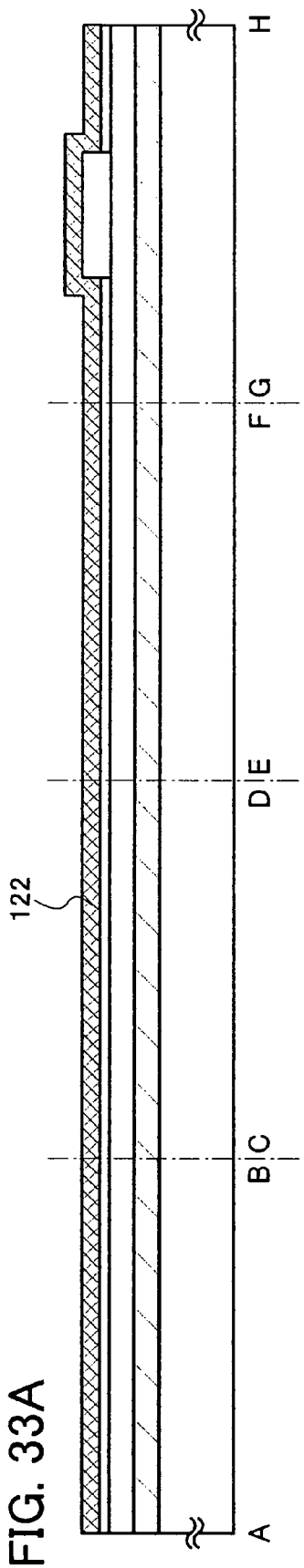
FIGS. 33A to 33C are views each showing an example of a manufacturing method of a nonvolatile semiconductor memory device of the present invention.
Figure 33B:
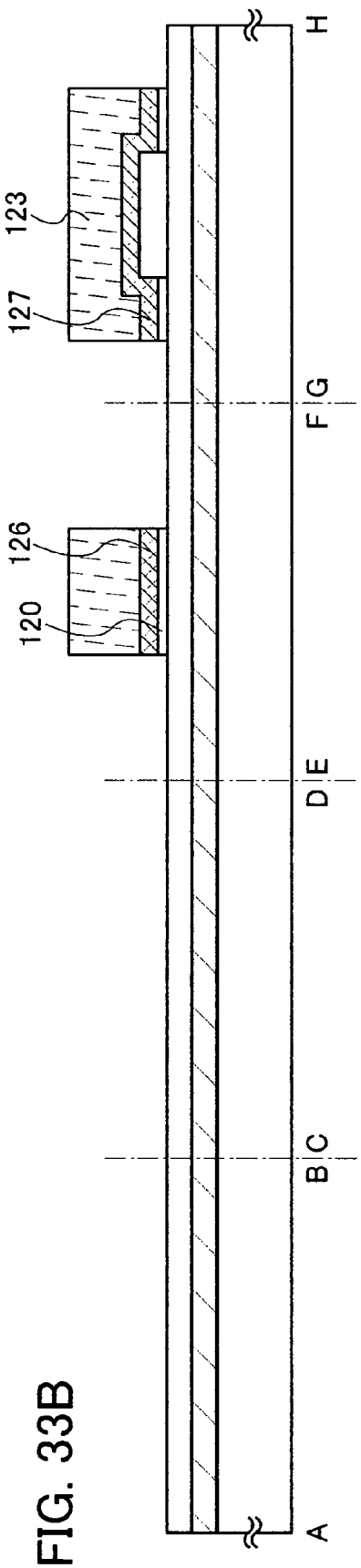

Next, a charge accumulating layer 122 is formed over the second insulating layer 115 and the first insulating layer 113 (see FIG. 33A). The charge accumulating layer 122 can be formed of any of the materials explained in the above embodiment. Here, the charge accumulating layer 122 is formed of a silicon nitride film, silicon nitride oxide film, or a silicon oxynitride film.

Subsequently, a resist 123 is selectively formed over the first insulating layer 113 and the second insulating layer 115. A stacked-layer structure including the second insulating layer 115 and the charge accumulating layer 122 is left by a method in which the second insulating layer 115 and the charge accumulating layer 122 are selectively removed with the use of the resist 123 as a mask, and then, a second insulating layer 120 and a charge accumulating layer 126 are formed. In addition, the charge accumulating layer 122 formed over the first insulating layer 113 is left to form a charge accumulating layer 127. Further, the charge accumulating layer 127 may be removed (see FIG. 33B). The second insulating layer 120 formed in the memory portion serves as a tunnel insulating layer in a nonvolatile memory element to be completed later.

Figure 33C:
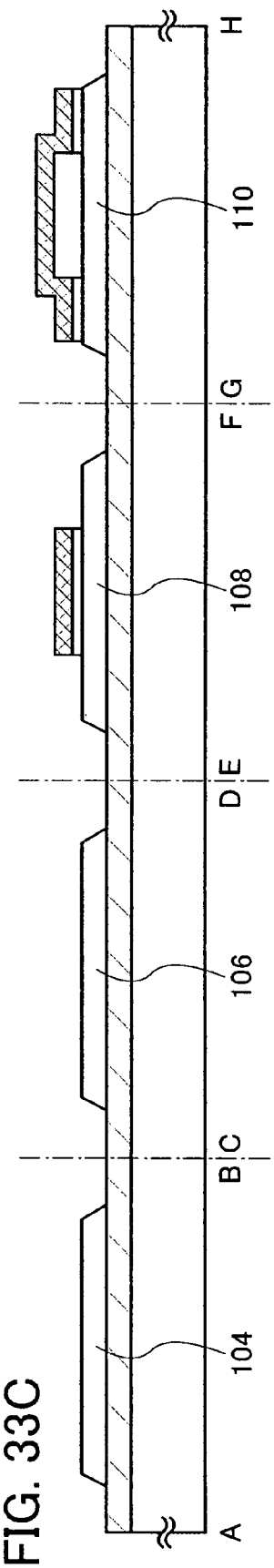

Next, the semiconductor layer 103 is selectively etched to form island-shaped semiconductor layers 104, 106, 108, and 110 (see FIG. 33C). The charge accumulating layers 126 and 127 may cover edges of the island-shaped semiconductor layers 108 and 110, or may be provided to have an island-shape over the semiconductor layer 108 and 110, respectively.

Figure 34A:
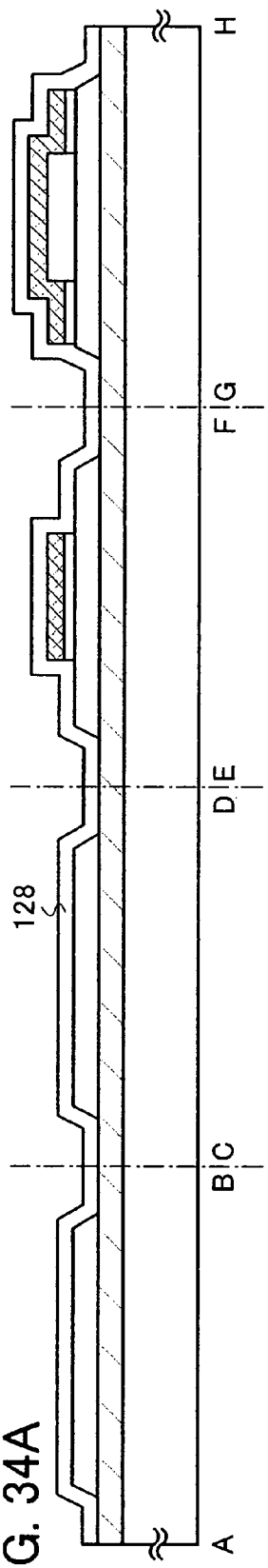
FIGS. 34A to 34C are views each showing an example of a manufacturing method of a nonvolatile semiconductor memory device of the present invention.

Then, a third insulating layer 128 is formed so as to cover the semiconductor layers 104 and 106, the charge accumulating layer 126 formed over the semiconductor layer 108, and the charge accumulating layer 127 formed over the semiconductor layer 110 (see FIG. 34A). Before or after the third insulating layer 128 is formed, an impurity element is selectively introduced into the semiconductor layer 108 to form an impurity region 166, as shown in the above embodiment.

Figure 34B:
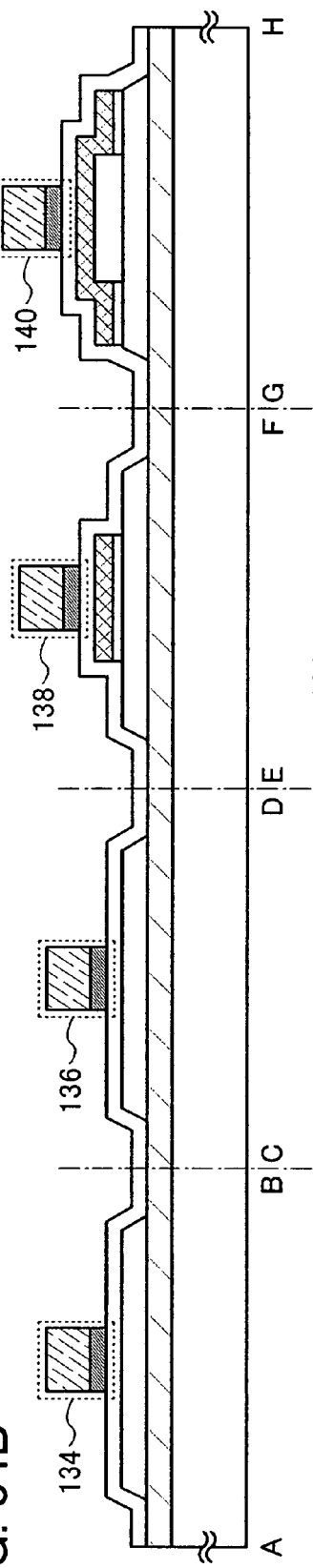

Next, conductive layers 134, 136, 138, and 140 each of which serves as a gate electrode are formed over the semiconductor layers 104, 106, 108, and 110, respectively (see FIG. 34B). It is to be noted that the conductive layer 138 formed over the semiconductor layer 108 provided in the memory portion serves as a control gate in the nonvolatile memory element to be completed later. In addition, each of the conductive layers 134, 136, and 140 serves as a gate electrode in a transistor to be completed later.

Figure 34C:
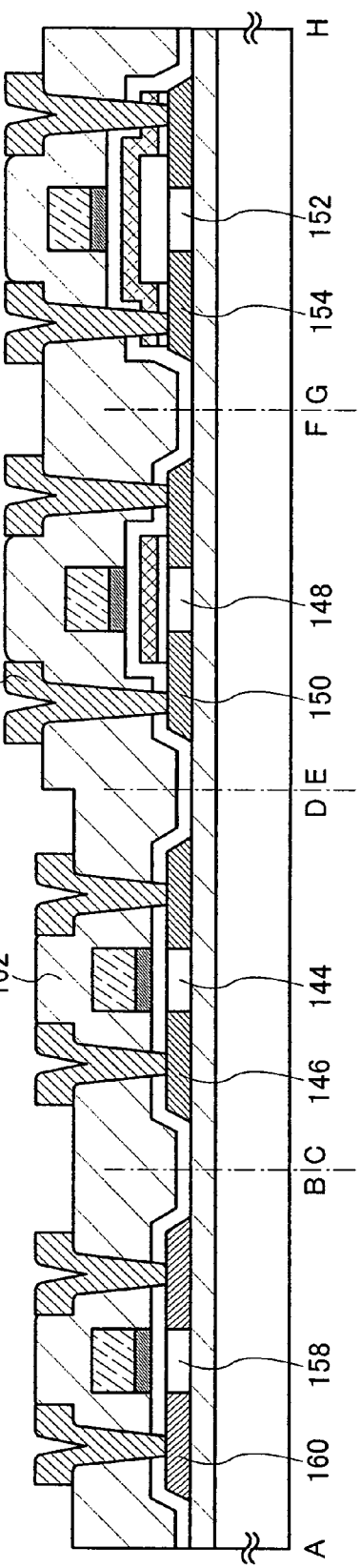

Next, as described in the above embodiment, after a channel formation region and an impurity region are formed in each of the semiconductor layers 104, 106, 108, and 110, an insulating layer 162 is formed so as to cover the third insulating layer 128 and the conductive layers 134, 136, 138, and 140, and conductive layers 164 electrically connected to the impurity regions 160, 146, 150, and 154 formed in the semiconductor layers 104, 106, 108, and 110, respectively, are formed over the insulating layer 162 (see FIG. 34C).

It is to be noted that this embodiment can be implemented in combination with Embodiment Mode 1 or other embodiments described in this specification.

Embodiment 4

In this embodiment, a nonvolatile memory element is manufactured over a substrate and the result of study of characteristics of the nonvolatile memory element will be explained with reference to the drawings.

Figure 41A:
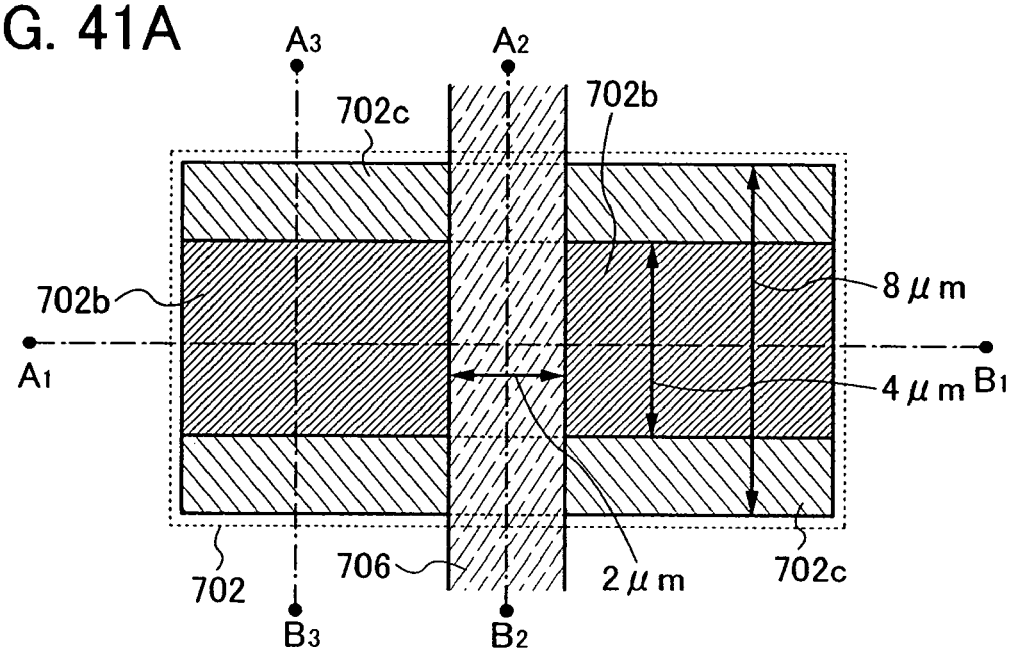
FIGS. 41A and 41B are views each showing an example of a nonvolatile semiconductor memory device of the present invention.
Figure 41B:
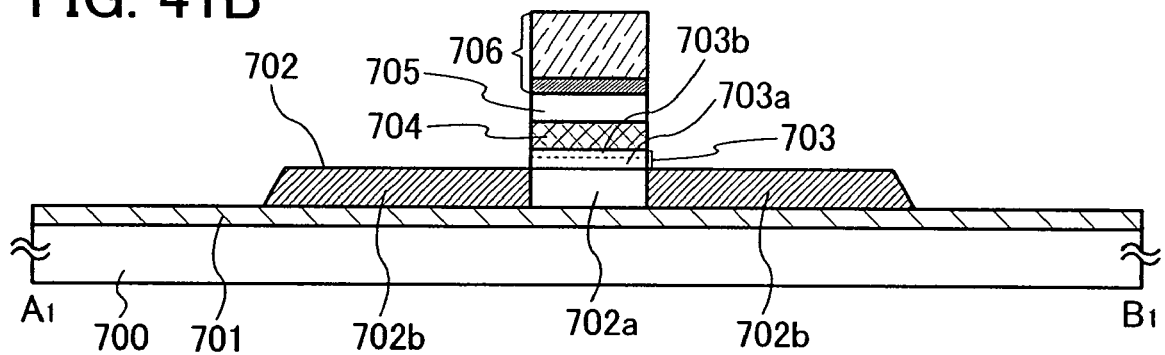

First, as shown in FIGS. 41A and 41B, a nonvolatile memory element was manufactured.

Specifically, a semiconductor layer 702 was formed over a glass substrate 700 with a base insulating layer 701 interposed therebetween, and a first insulating layer 703, a charge accumulating layer 704, a second insulating layer 705, and a control gate electrode 706 were stacked in this order over the semiconductor layer 702. As the base insulating layer 701, a silicon nitride oxide film (thickness of 50 nm) and a silicon oxynitride film (thickness of 100 nm) were stacked in this order by a plasma CVD method. The semiconductor layer 702 was formed of a crystalline semiconductor layer containing Si as its main component, in which a channel formation region 702a, a source region or drain region 702b, and an impurity region 702c were provided. The first insulating layer 703 was formed by a method in which after oxidation treatment was performed to the semiconductor layer 702 by high density plasma to form a silicon oxide film 703a with a thickness of approximately 3 nm, a nitridation treatment layer 703b was formed over a surface of the silicon oxide film or near the surface thereof by nitridation treatment. The charge accumulating layer 704 was formed of silicon nitride so as to have a thickness of approximately 10 nm by a plasma CVD method. The second insulating layer 705 was formed of silicon oxynitride so as to have a thickness of approximately 10 nm by a plasma CVD method. The control gate electrode 706 was formed by a method in which tantalum nitride (thickness of 30 nm) and tungsten (thickness of 370 nm) were stacked in this order. The source region or drain region 702b was provided so as to have n-type conductivity, and the impurity region 702c which was an edge of the semiconductor layer and was in contact with the source or drain region and the channel formation region were provided so as to have p-type conductivity. In addition, the channel formation region 702a was also provided so as to have p-type conductivity with the same concentration as that of the impurity region 702c, and the width of the semiconductor layer 702 was 8 μm, the width of the source region or drain region was 4 μm, and the channel length was 2 μm.

Figure 37:
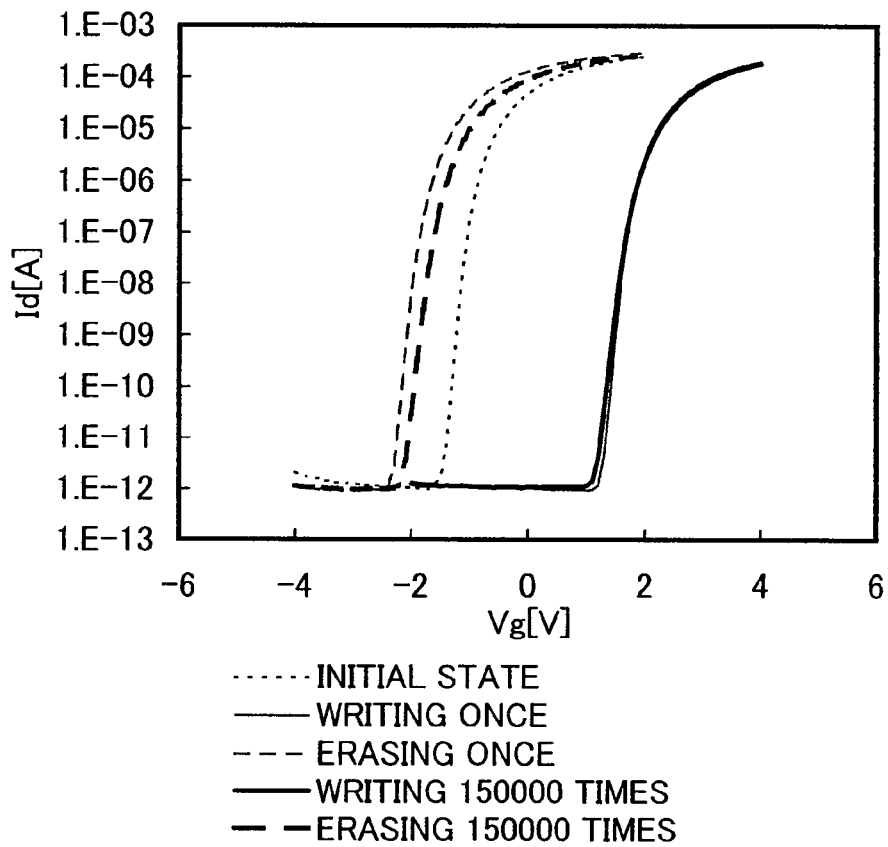
FIG. 37 is a graph showing characteristics of a nonvolatile semiconductor memory device of the present invention.

FIG. 37 shows current-voltage characteristics of the nonvolatile memory element. 37 shows the current-voltage characteristics in the case where writing and erasing were performed once and the current-voltage characteristics in the case where the writing and erasing were performed 150000 times. According to FIG. 37, it was found that the nonvolatile memory element to which the present invention was applied had small changes in the current-voltage characteristics and had reproducibility even in the case where the writing and the erasing were continuously performed.

Figure 38:
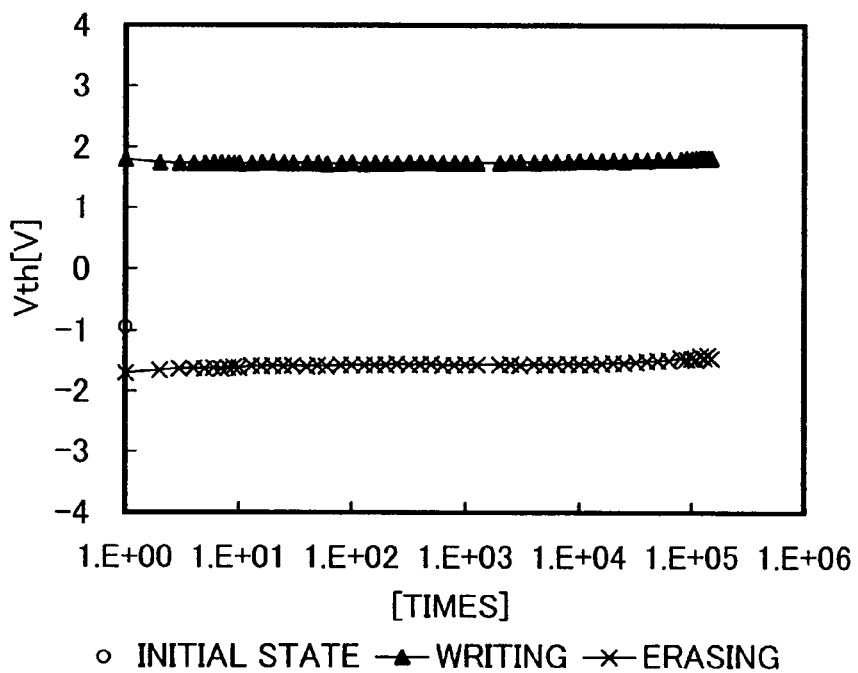
FIG. 38 is a graph showing characteristics of a nonvolatile semiconductor memory device of the present invention.

FIG. 38 shows threshold voltages (Vth) in the case where writing and erasing were continuously performed to the nonvolatile memory element. Further, in FIG. 38, a vertical axis indicates threshold voltage and a horizontal axis indicates the number of wiring and erasing. According to FIG. 38, the nonvolatile memory element to which the present invention was applied had few changes in the threshold voltage even in the case where the writing was continuously performed. In addition, it was found that the nonvolatile memory element had few changes in the threshold voltage even in the case where the erasing was continuously performed and had high reliability as a memory.

Figure 39:
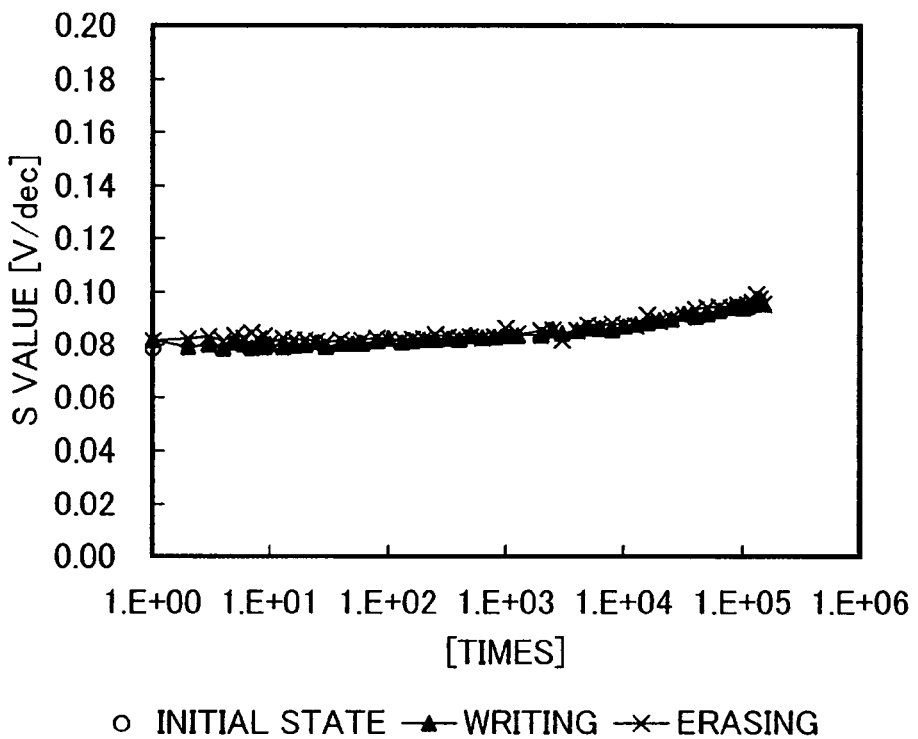
FIG. 39 is a graph showing characteristics of a nonvolatile semiconductor memory device of the present invention.

FIG. 39 shows sub-threshold characteristics (S-value) in the case where writing and erasing were continuously performed to the nonvolatile memory element. Further, in FIG. 39, a vertical axis indicates the S-value and a horizontal axis indicates the number of writing and erasing. According to FIG. 39, the result in which there were small changes in the S-value even in the case where the wiring and erasing were continuously performed was obtained. Therefore, the characteristics of the nonvolatile memory element are not changed even in the case where the wiring and the erasing are continuously performed and the nonvolatile memory element can be used as a memory with high reliability.

Figure 40:
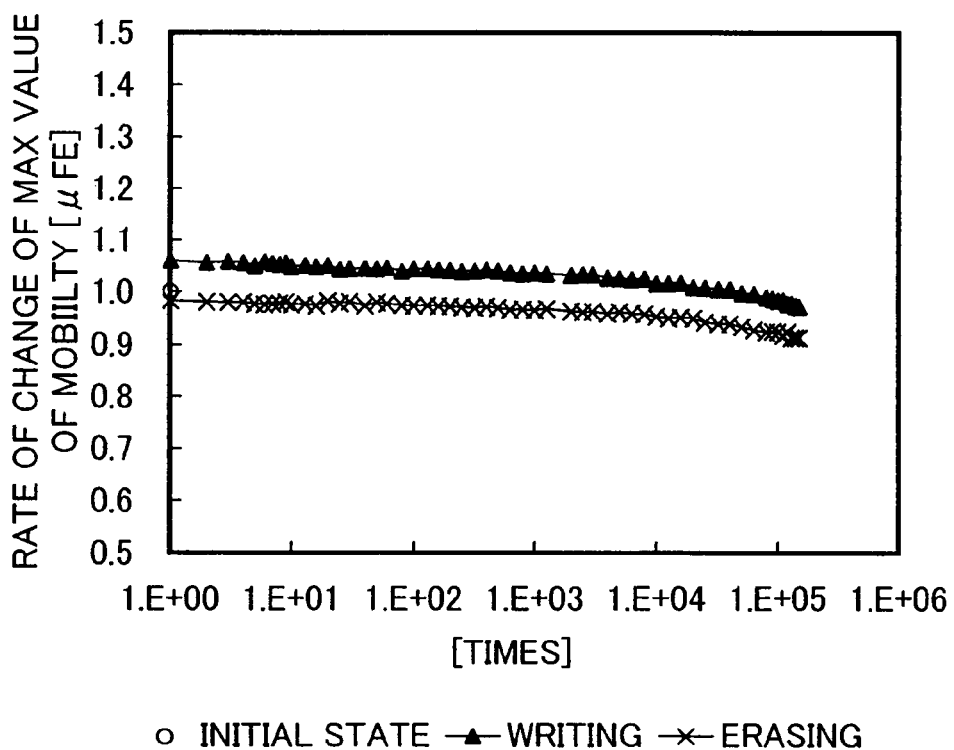
FIG. 40 is a graph showing characteristics of a nonvolatile semiconductor memory device of the present invention.

FIG. 40 shows mobility characteristics in the case where writing and erasing were continuously performed to the nonvolatile memory element. Further, in FIG. 40, a vertical axis indicates the rate of change of maximum value of mobility and a horizontal axis indicates the number of writing and erasing. According to FIG. 40, the result in which the nonvolatile memory element to which the present invention was applied had small changes in the mobility even in the case where the writing and the erasing were continuously performed was obtained. Therefore, the characteristics of the nonvolatile memory element are not changed even in the case where the writing and the erasing are continuously performed and the nonvolatile memory element can be used as a memory with high reliability.

Embodiment 5

In this embodiment, an application example of a semiconductor device capable of inputting and outputting data without contact, which is provided with the above-described nonvolatile semiconductor memory device of the present invention will be explained below with reference to the drawings. The semiconductor device capable of inputting and outputting data without contact is referred to as an RFID tag, an ID tag, an IC tag, an IC chip, an RF tag, a wireless tag, an electronic tag, or a wireless chip depending on the usage pattern.

Figure 35A:
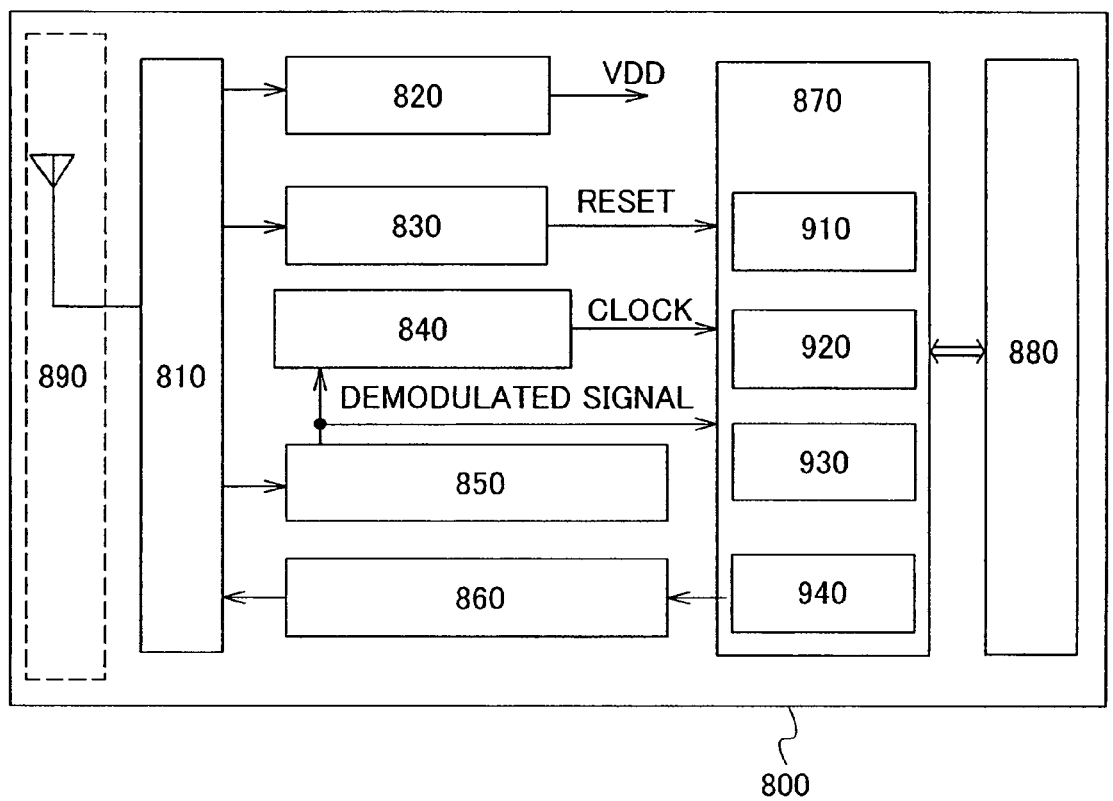
FIGS. 35A to 35C are views each showing an example of an usage pattern of a nonvolatile semiconductor memory device of the present invention.

The semiconductor device 800 has a function of exchanging data without contact, and includes a high-frequency circuit 810, a power supply circuit 820, a reset circuit 830, a clock generating circuit 840, a data demodulating circuit 850, a data modulating circuit 860, a control circuit 870 for controlling other circuits, a memory circuit 880, and an antenna 890 (FIG. 35A). The high-frequency circuit 810 receives a signal from the antenna 890 and outputs a signal, which is received from the data modulating circuit 860, from the antenna 890. The power supply circuit 820 generates power supply potential from a received signal. The reset circuit 830 generates a reset signal. The clock generating circuit 840 generates various clock signals based on a received signal input from the antenna 890. The data demodulating circuit 850 demodulates the received signal and outputs the demodulated signal to the control circuit 870. The data modulating circuit 860 modulates a signal received from the control circuit 870. As the control circuit 870, for example, a code extracting circuit 910, a code judging circuit 920, a CRC judging circuit 930, and an output unit circuit 940 are provided. It is to be noted that the code extracting circuit 910 extracts each of plural codes included in an instruction sent to the control circuit 870. The code judging circuit 920 judges the content of the instruction by comparing the extracted code with a code corresponding to a reference. The CRC judging circuit 930 detects whether or not there is a transmission error or the like based on the judged code.

Subsequently, an example of an operation of the aforementioned semiconductor device is explained. First, a wireless signal is received by the antenna 890 and then sent to the power supply circuit 820 through the high-frequency circuit 810, whereby high power supply potential (hereinafter referred to as VDD) is generated. The VDD is supplied to each circuit in the semiconductor device 800. A signal sent to the data demodulating circuit 850 through the high-frequency circuit 810 is demodulated (hereinafter this signal is referred to as a demodulated signal). Moreover, signals and the demodulated signals passed through the reset circuit 830 and the clock generating circuit 840 via the high-frequency circuit 810 are sent to the control circuit 870. The signals sent to the control circuit 870 are analyzed by the code extracting circuit 910, the code judging circuit 920, the CRC judging circuit 930, and the like. Then, based on the analyzed signals, information of the semiconductor device stored in the memory circuit 880 is output. The information of the semiconductor device which has been output is encoded through the output unit circuit 940. Furthermore, the encoded information of the semiconductor device 800 passes through the data modulating circuit 860 and then is sent by the antenna 890. It is to be noted that low power supply potential (hereinafter referred to as VSS) is common in the plural circuits included in the semiconductor device 800 and VSS can be GND. In addition, the nonvolatile semiconductor memory device of the present invention can be applied to the memory circuit 880. The nonvolatile semiconductor memory device of the present invention can lower driving voltage; therefore, a distance which data can be communicated without contact can be extended.

In this manner, when a signal is sent from a reader/writer to the semiconductor device 800 and the signal sent from the semiconductor device 800 is received by the reader/writer, the data in the semiconductor device can be read.

Moreover, in the semiconductor device 800, power supply voltage may be supplied to each circuit by electromagnetic waves without mounting a power supply (battery), or a power supply (battery) may be mounted so that power supply voltage is supplied to each circuit by a power supply, or both electromagnetic waves and the power supply.

Next, an example of usage of a semiconductor device in which data can be input/output without contact is explained.

Figure 35B:
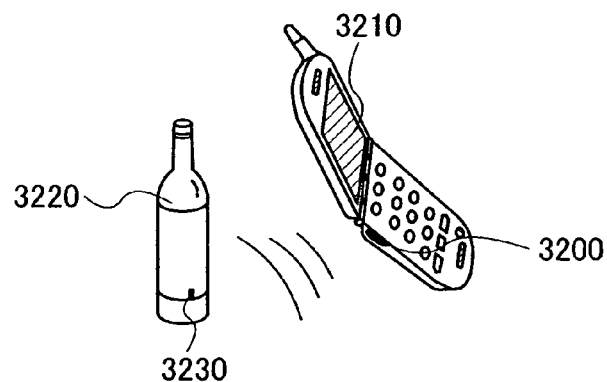
Figure 35C:
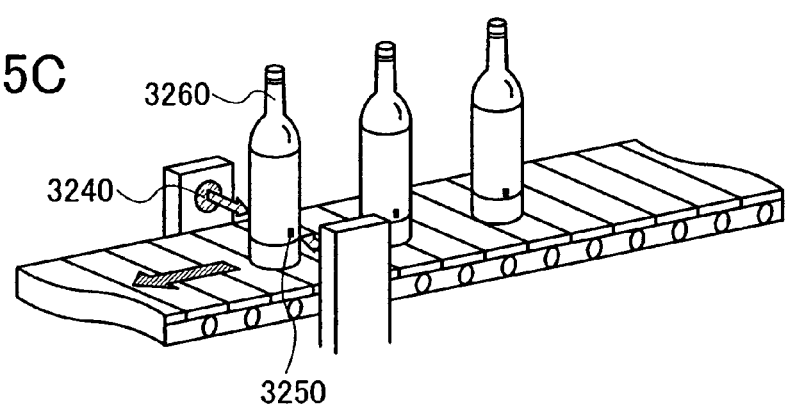

A side surface of a mobile terminal including a display portion 3210 is provided with a reader/writer 3200. A side surface of a product 3220 is provided with a semiconductor device 3230 (FIG. 35B). When the reader/writer 3200 is held over the semiconductor device 3230 included in the product 3220, the display portion 3210 displays information on the product, such as a material, a place of origin, an inspection result for each production step, a history of the distribution process, and a description of the product. In addition, when a product 3260 is transferred by a conveyer belt, the product 3260 can be inspected with the use of a semiconductor device 3250 provided to the product 3260 and a reader/writer 3240 (FIG. 35C). In this manner, with the use of the semiconductor device in the system, information can be obtained easily and higher performance and higher added value are achieved.

The nonvolatile semiconductor memory device of the present invention can be used for electronic appliances equipped with a memory of all fields. For example, as electronic appliances to which the nonvolatile semiconductor memory device of the present invention is applied, the following can be given: a camera such as a video camera or a digital camera, a goggle type display (a head mounted display), a navigation system, an audio reproducing device (car audio set, audio component set, or the like), a computer, a game machine, a portable information terminal (mobile computer, mobile phone, portable game machine, electronic book, or the like), and an image reproducing device provided with a recording medium (specifically, a device provided with a display device that can reproduce a recording medium such as a digital versatile disc (DVD) and display the image), and the like. Specific examples of these electronic appliances are shown in FIGS. 36A to 36E.

Figure 36A:
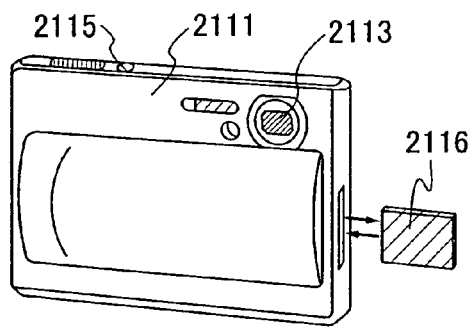
FIGS. 36A to 36E are views each showing an example of an usage pattern of a nonvolatile semiconductor memory device of the present invention.
Figure 36B:
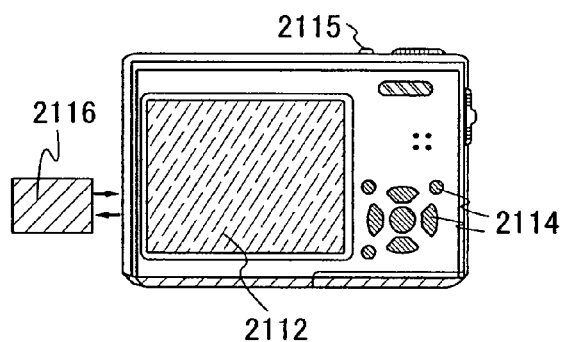

FIGS. 36A and 36B each show a digital camera. FIG. 36B is a view showing the back of the digital camera shown in FIG. 36A. This digital camera includes a chassis 2111, a display portion 2112, a lens 2113, operation keys 2114, a shutter 2115, and the like. The digital camera is provided with a removable nonvolatile memory 2116, in which data taken by the digital camera is stored. The nonvolatile semiconductor memory device formed by the present invention can be applied to the memory 2116.

Figure 36C:
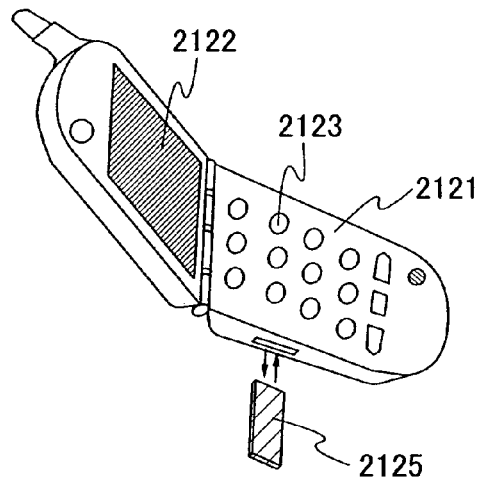

FIG. 36C shows a mobile phone, which is a typical example of a mobile terminal. This mobile phone includes a chassis 2121, a display portion 2122, operation keys 2123, and the like. The mobile phone is provided with a removable nonvolatile memory 2125. Data such as phone numbers, image data, music data, or the like included in the mobile phone can be stored in the memory 2125 and can be reproduced. The nonvolatile semiconductor memory device formed by the present invention can be applied to the memory 2125.

Figure 36D:
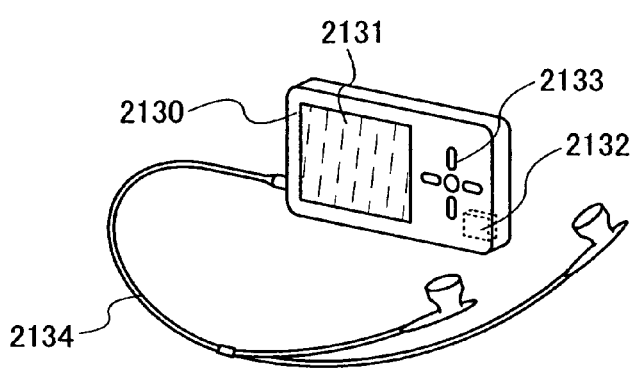

FIG. 36D shows a digital player, which is a typical example of an audio device. The digital player shown in FIG. 36D includes a main body 2130, a display portion 2131, a memory portion 2132, an operation portion 2133, earphones 2134, and the like. Further, headphones or wireless earphones can be used instead of the earphone 2134. The nonvolatile semiconductor memory device formed by the present invention can be used for the memory portion 2132. For example, a NAND type nonvolatile memory with a memory capacity of 20 to 200 gigabytes (GB) can be used. In addition, when the operation portion 2133 is operated, an image or sound (music) can be recorded and reproduced. It is to be noted that power consumption of the display portion 2131 can be suppressed when white characters are displayed on a black background. This is effective especially in a mobile audio device. The nonvolatile semiconductor memory device provided in the memory portion 2132 may be removable.

Figure 36E:
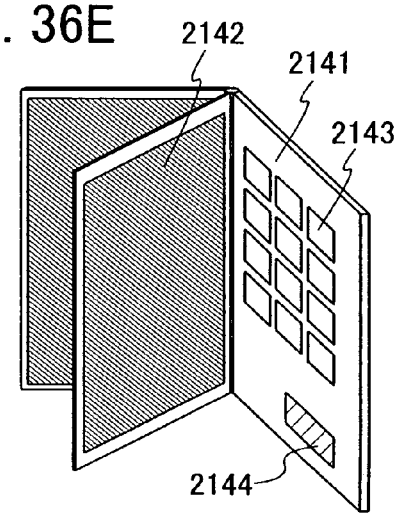

FIG. 36E shows an electronic book (also referred to as electronic paper). This electronic book includes a main body 2141, a display portion 2142, operation keys 2143, and a memory portion 2144. A modem may be built in the main body 2141, or a structure in which information can be sent and received wirelessly may be employed. The nonvolatile semiconductor memory device formed by the present invention can be used for the memory portion 2144. For example, a NAND type nonvolatile memory with a memory capacity of 20 to 200 gigabytes (GB) can be used. In addition, when operation keys 2143 are operated, an image or sound (music) can be recorded and reproduced. The nonvolatile semiconductor memory device provided in the memory portion 2144 may be removable.

As described above, an application range of the nonvolatile semiconductor memory device of the present invention is extremely wide, and the nonvolatile semiconductor memory device can be applied to electronic appliances of all fields as long as the electronic appliances have a memory.

This application is based on Japanese Patent Application serial no. 2006-101076 filed in Japan Patent Office on Mar. 31, in 2006, the entire contents of which are hereby incorporated by reference.

What is claimed is:

1. A nonvolatile semiconductor memory device comprising:
   a substrate;
   a semiconductor layer over the substrate, the semiconductor layer comprising a channel formation region, a source region, a drain region, and an impurity region;
   a first insulating layer over the semiconductor layer;
   a charge accumulating layer over the first insulating layer;
   a second insulating layer over the charge accumulating layer; and
   a gate electrode over the second insulating layer,
   wherein the source region and the drain region are in contact with the channel formation region,
   wherein the impurity region is provided to be adjacent to the channel formation region, the source region, and the drain region, and
   wherein a conductivity type of the impurity region is different from a conductivity type of the source region and the drain region.

2. A nonvolatile semiconductor memory device according to claim 1, wherein an edge of the charge accumulating layer is disposed in a region in which the semiconductor layer and the gate electrode overlap with each other and which is over the impurity region.

3. A nonvolatile semiconductor memory device according to claim 1, wherein the charge accumulating layer is an insulating layer containing nitrogen.

4. A nonvolatile semiconductor memory device according to claim 1, wherein the gate electrode is a conductive layer containing nitrogen.

5. A nonvolatile semiconductor memory device according to claim 1, wherein the source and drain regions have n-type conductivity and the impurity region has p-type conductivity.

6. A nonvolatile semiconductor memory device comprising:
   a substrate;
   a semiconductor layer over the substrate, the semiconductor layer comprising a channel formation region, a source region, a drain region, and an impurity region;
   a first insulating layer over the semiconductor layer;

a charge accumulating layer over the first insulating layer;

a second insulating layer over the charge accumulating layer; and a gate electrode provided over the second insulating layer, wherein the impurity region is provided to be adjacent to the channel formation region, the source region, and the drain region, wherein the impurity region is provided in a region which is at least an edge of the semiconductor layer and overlaps with the gate electrode, and wherein a conductivity type of the impurity region is different from a conductivity type of the source region and the drain region.

7. A nonvolatile semiconductor memory device according to claim 6, wherein an edge of the charge accumulating layer is disposed in a region in which the semiconductor layer and the gate electrode overlap with each other and which is over the impurity region.

8. A nonvolatile semiconductor memory device according to claim 6, wherein the charge accumulating layer is an insulating layer containing nitrogen.

9. A nonvolatile semiconductor memory device according to claim 6, wherein the gate electrode is a conductive layer containing nitrogen.

10. A nonvolatile semiconductor memory device according to claim 6, wherein the source and drain regions have n-type conductivity and the impurity region has p-type conductivity.

11. A nonvolatile semiconductor memory device comprising:

a substrate;

a semiconductor layer over the substrate, the semiconductor layer comprising a channel formation region, a source region, a drain region, and an impurity region;

a first insulating layer over the semiconductor layer;

a charge accumulating layer over the first insulating layer;

a second insulating layer over the charge accumulating layer; and a gate electrode provided over the second insulating layer, the gate electrode extending beyond at least an edge of the semiconductor layer, wherein the impurity region is provided in a portion of the semiconductor layer, wherein the portion of the semiconductor layer is in contact with the channel formation region and at least one of the source region and the drain region, wherein the portion of the semiconductor layer includes the edge of the semiconductor layer, and wherein a conductivity type of the impurity region is different from a conductivity type of the source region and the drain region.

12. A nonvolatile semiconductor memory device according to claim 11, wherein an edge of the charge accumulating layer is disposed in a region in which the semiconductor layer and the gate electrode overlap with each other and which is over the impurity region.

13. A nonvolatile semiconductor memory device according to claim 11, wherein the charge accumulating layer is an insulating layer containing nitrogen.

14. A nonvolatile semiconductor memory device according to claim 11, wherein the gate electrode is a conductive layer containing nitrogen.

15. A nonvolatile semiconductor memory device according to claim 11, wherein the source and drain regions have n-type conductivity and the impurity region has p-type conductivity.

16. A nonvolatile semiconductor memory device according to claim 11, wherein the portion of the semiconductor layer is in contact with the channel formation region, the source region and the drain region.

* * * * *